(12) United States Patent
Baugher

(10) Patent No.: US 9,076,961 B2
(45) Date of Patent: Jul. 7, 2015

(54) ENERGY HARVESTING WITH A MICRO-ELECTRO-MACHANICAL SYSTEM (MEMS)

(75) Inventor: Jeffrey Paul Baugher, Dayton, OH (US)

(73) Assignee: DUALITY REALITY ENERGY, LLC, West Carrollton, OH (US)

( * ) Notice: Subject to any disclaimer, the term of this patent is extended or adjusted under 35 U.S.C. 154(b) by 629 days.

(21) Appl. No.: 13/385,060

(22) Filed: Jan. 31, 2012

(65) Prior Publication Data

US 2013/0193930 A1    Aug. 1, 2013

(51) Int. Cl.
| | | |
|---|---|---|
| H01L 41/00 | (2013.01) | |
| H02J 7/00 | (2006.01) | |
| F03G 7/08 | (2006.01) | |
| H01L 41/113 | (2006.01) | |
| H02N 2/18 | (2006.01) | |
| F03G 7/00 | (2006.01) | |

(52) U.S. Cl.
CPC .............. H01L 41/1138 (2013.01); H02N 2/18 (2013.01); H02N 2/186 (2013.01); F03G 7/00 (2013.01)

(58) Field of Classification Search
CPC ...... H01L 41/1138; H02N 2/18; H02N 2/186; F03G 7/00
USPC ............................ 310/339; 290/1 R; 320/137
See application file for complete search history.

(56) References Cited

U.S. PATENT DOCUMENTS

| | | | | |
|---|---|---|---|---|
| 5,344,117 | A * | 9/1994 | Trah et al. ...................... 251/11 |
| 6,118,250 | A * | 9/2000 | Hutchison et al. ............. 320/110 |
| 6,168,395 | B1 * | 1/2001 | Quenzer et al. ............. 417/413.3 |
| 6,309,077 | B1 * | 10/2001 | Saif et al. ....................... 359/871 |
| 6,828,887 | B2 * | 12/2004 | Kubby et al. .................... 335/78 |
| 7,188,931 | B2 * | 3/2007 | Cabal et al. ...................... 347/54 |
| 7,195,393 | B2 * | 3/2007 | Potter ............................ 366/114 |
| 7,450,797 | B2 * | 11/2008 | German et al. .................. 385/16 |
| 7,667,375 | B2 * | 2/2010 | Berkcan et al. ............... 310/339 |
| 8,614,518 | B2 * | 12/2013 | Li et al. .......................... 290/1 R |
| 2005/0134149 | A1 * | 6/2005 | Deng et al. ..................... 310/339 |
| 2006/0006484 | A1 * | 1/2006 | Seneviratne et al. .......... 257/415 |
| 2007/0188136 | A1 * | 8/2007 | Oh ................................. 320/115 |
| 2008/0202845 | A1 * | 8/2008 | Klein et al. .................... 181/157 |
| 2010/0301699 | A1 * | 12/2010 | Zhang ............................ 310/300 |
| 2012/0017978 | A1 * | 1/2012 | Doraiswami et al. .......... 136/256 |
| 2012/0169064 | A1 * | 7/2012 | Hoffman et al. ............... 290/1 R |

* cited by examiner

Primary Examiner — M'Baye Diao
(74) Attorney, Agent, or Firm — Peloquin, PLLC; Mark S. Peloquin, Esq.

(57) ABSTRACT

Apparatuses and method are described to create an energy harvesting microstructure, referred to herein as a transduction micro-electro mechanical system (T-MEMS). A T-MEMS includes a substrate, a first buckled membrane, the first buckled membrane has a buckling axis and is connected to the substrate. The first buckled membrane further includes a transduction material, a first conductor, the first conductor is applied to a first area of the transduction material; and a second conductor, the second conductor is applied to a second area of the transduction material, wherein electrical charge is harvested from the transduction material when the first buckled membrane is translated along the buckling axis.

47 Claims, 36 Drawing Sheets

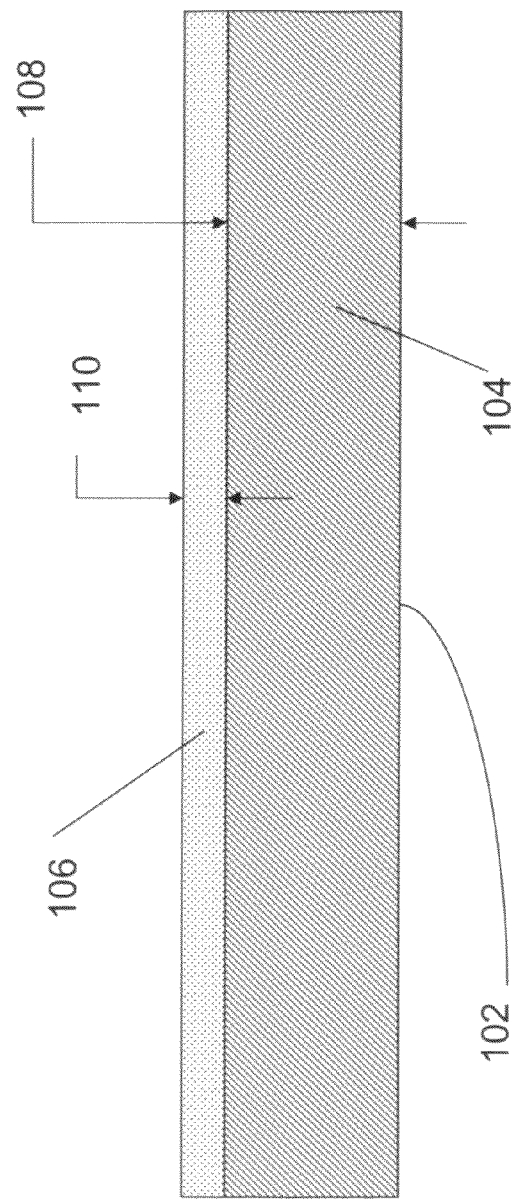

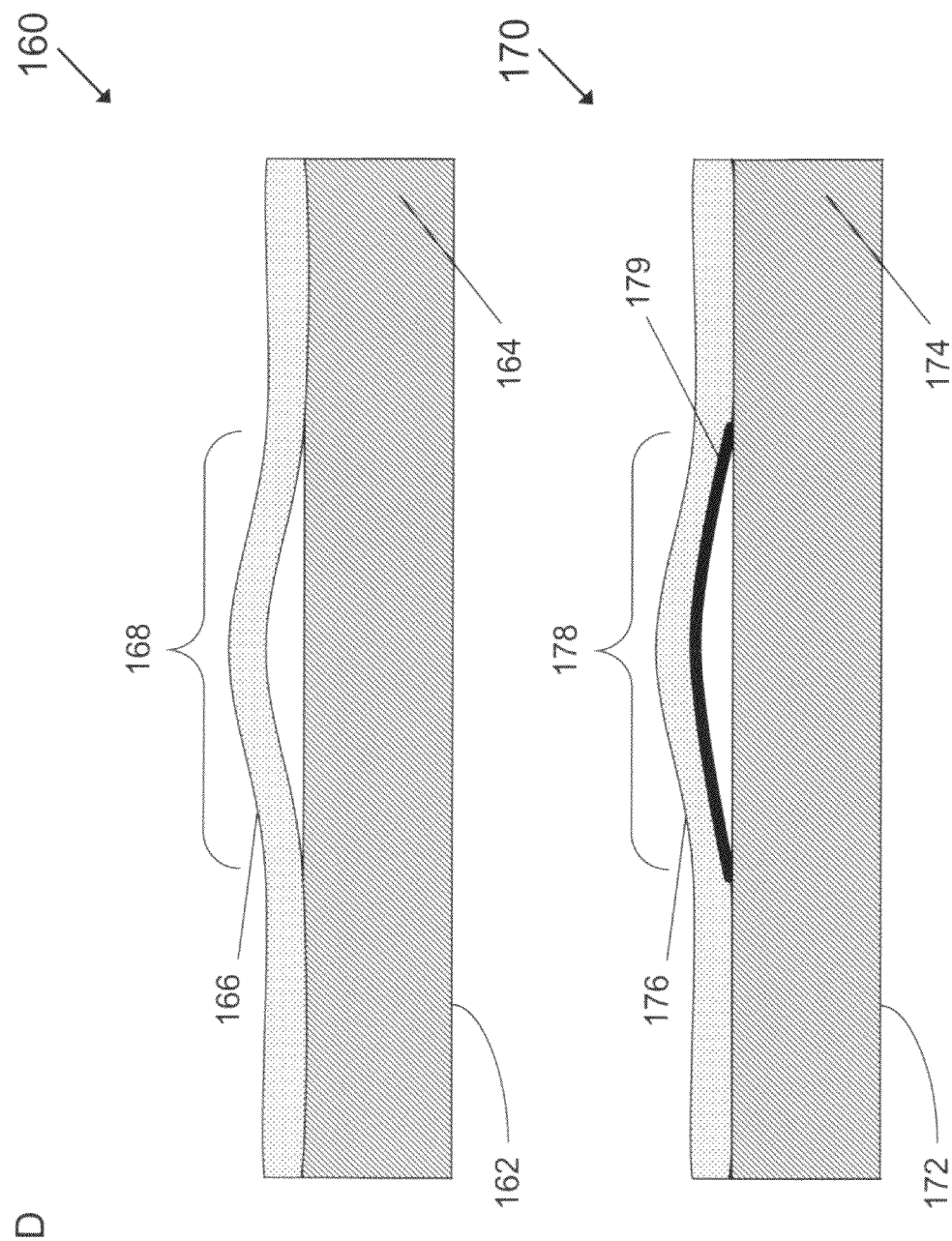

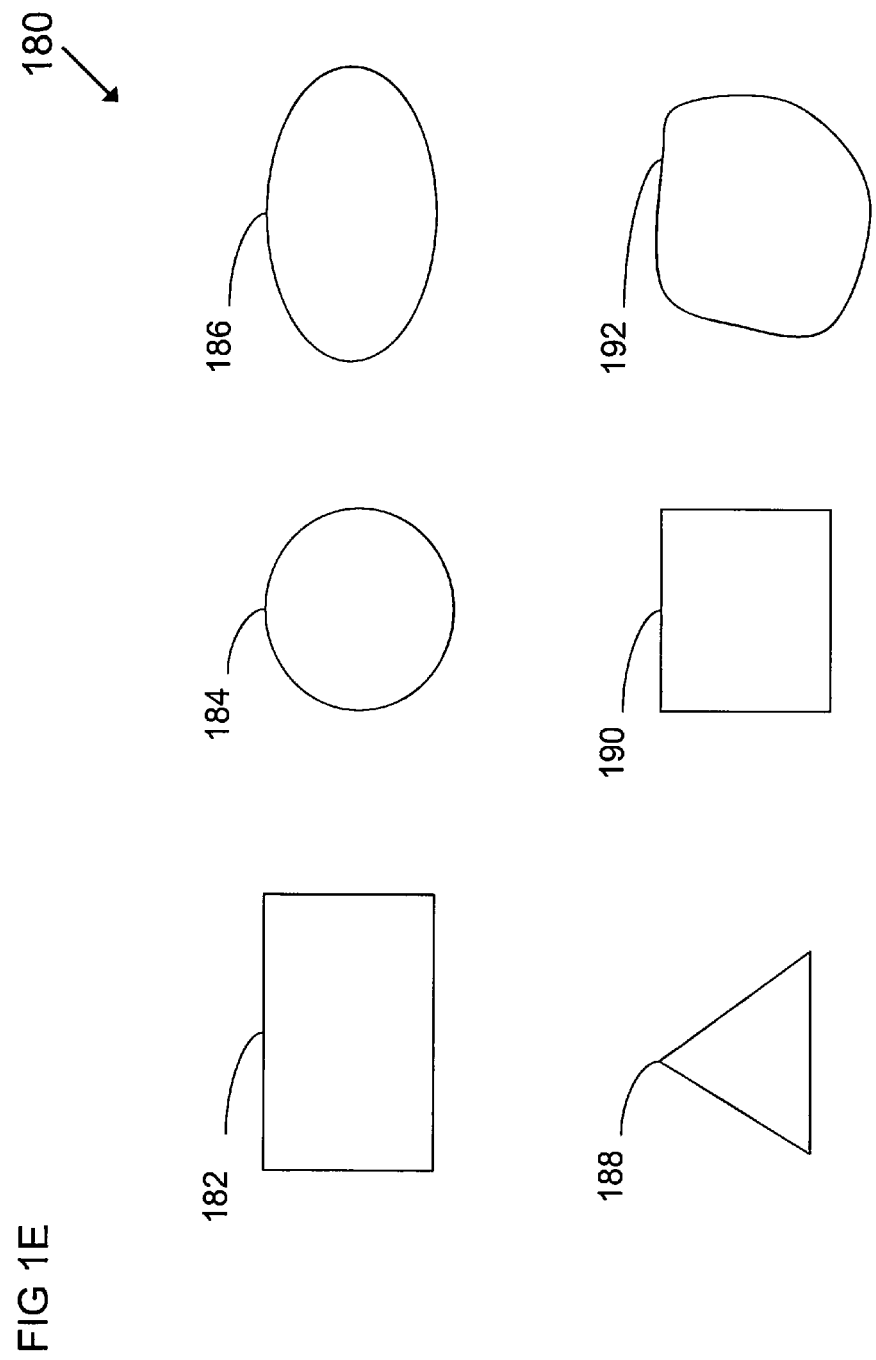

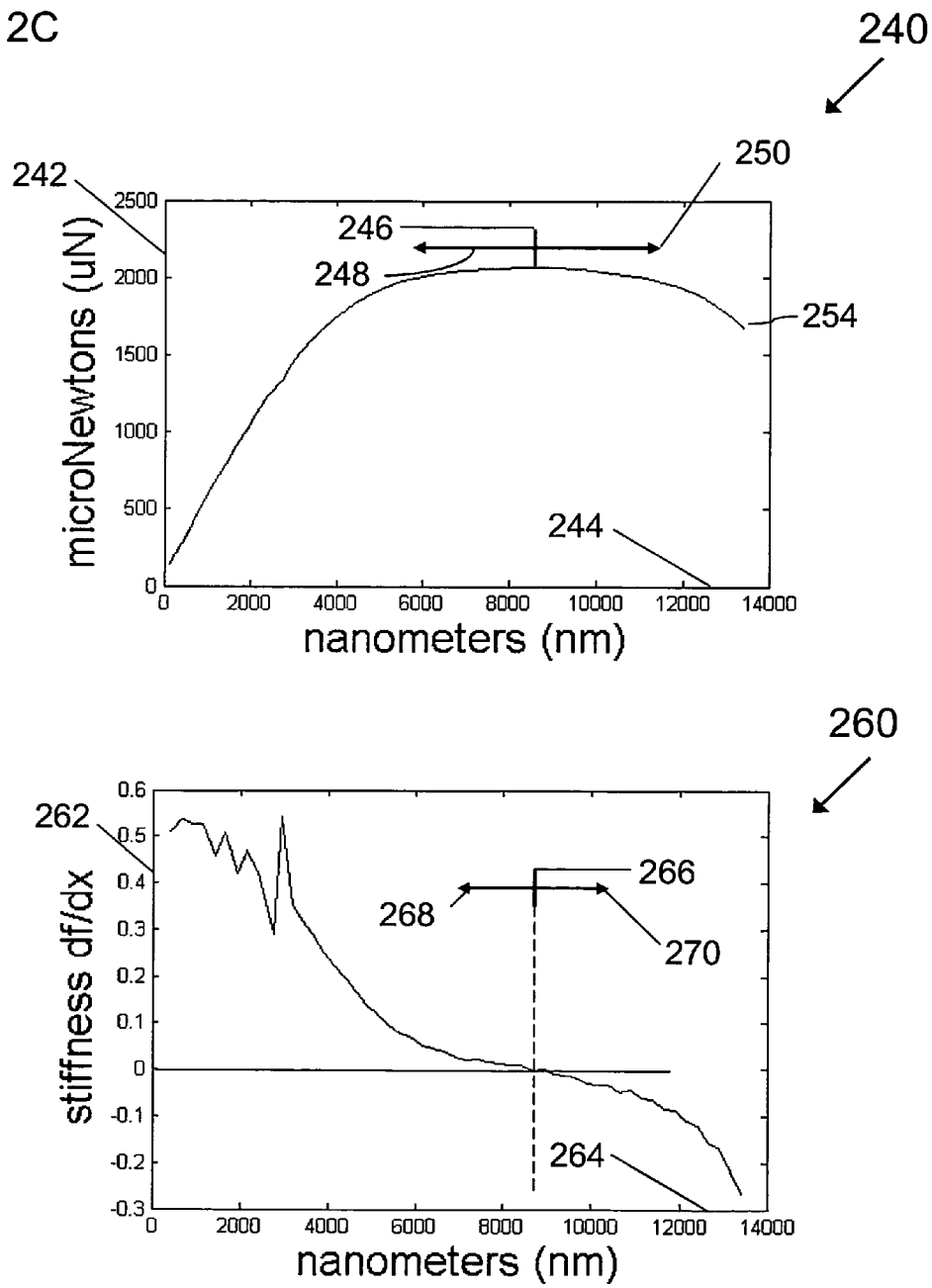

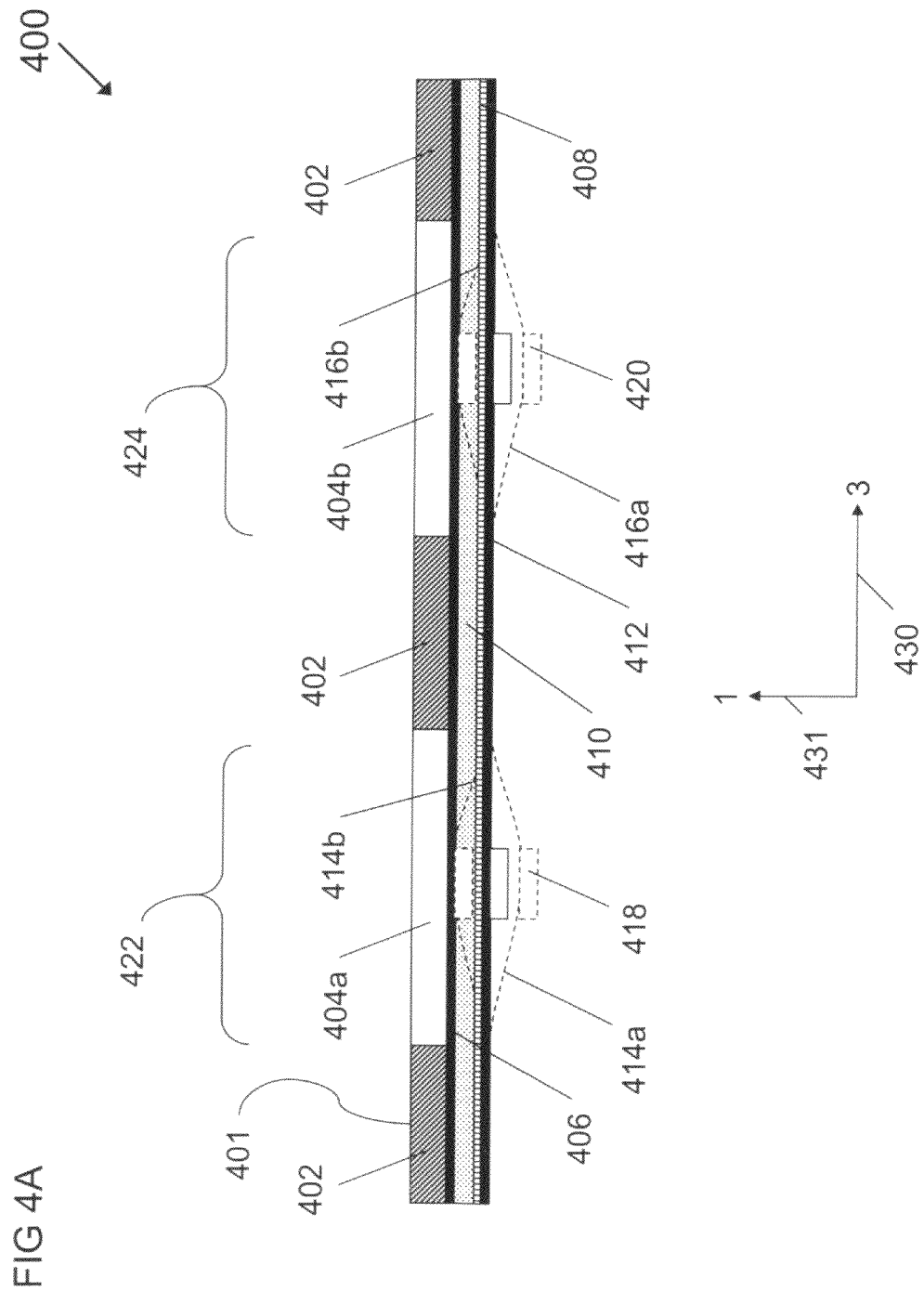

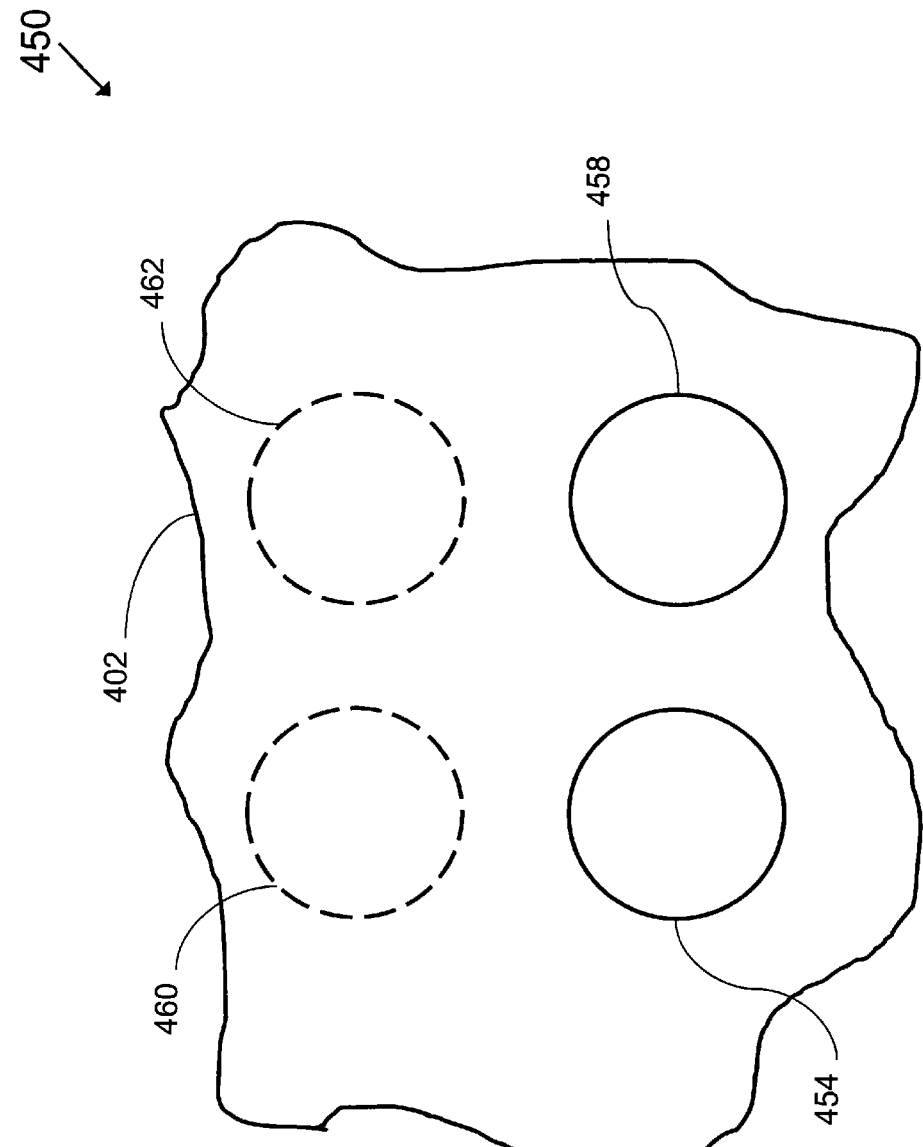

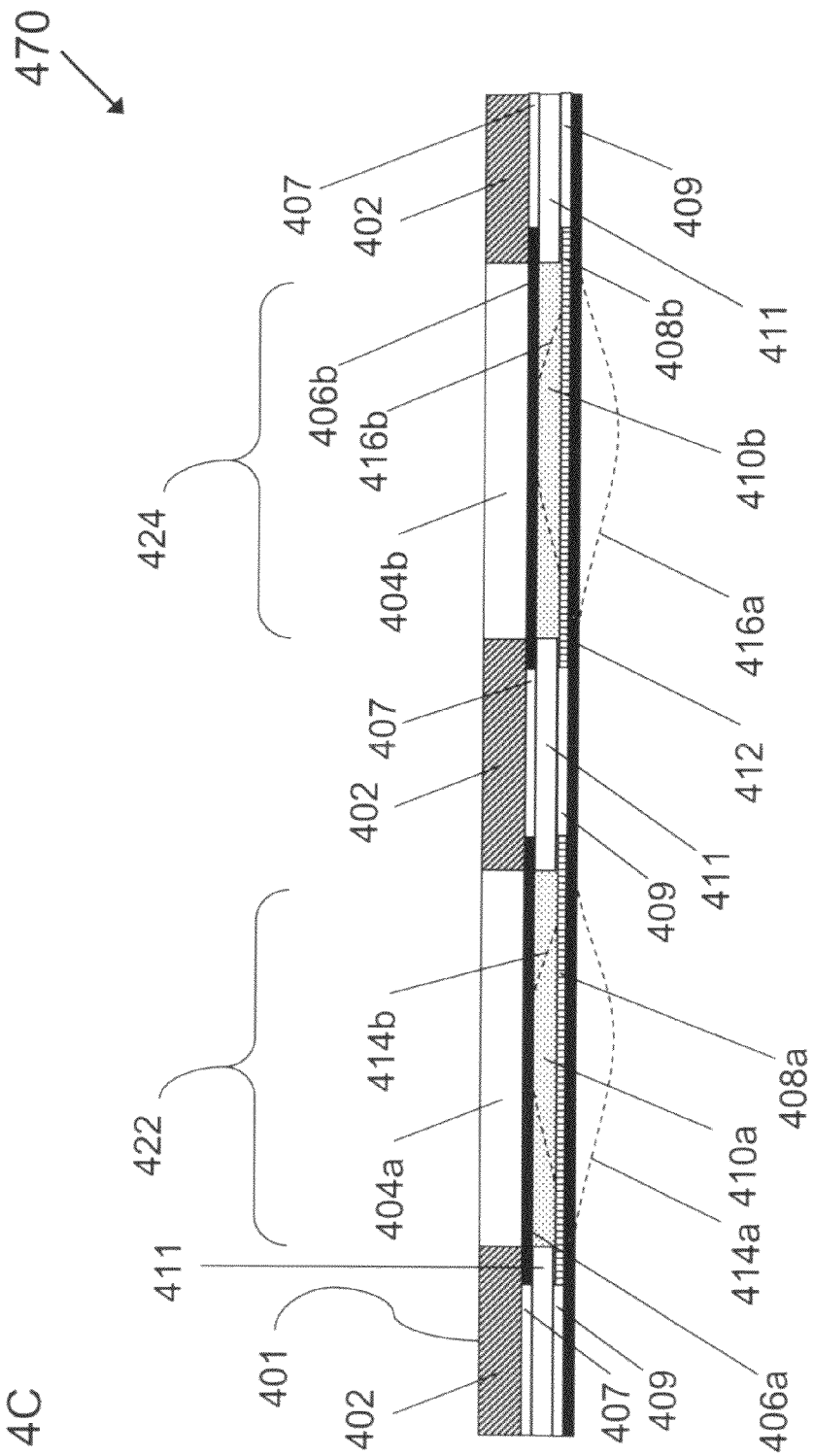

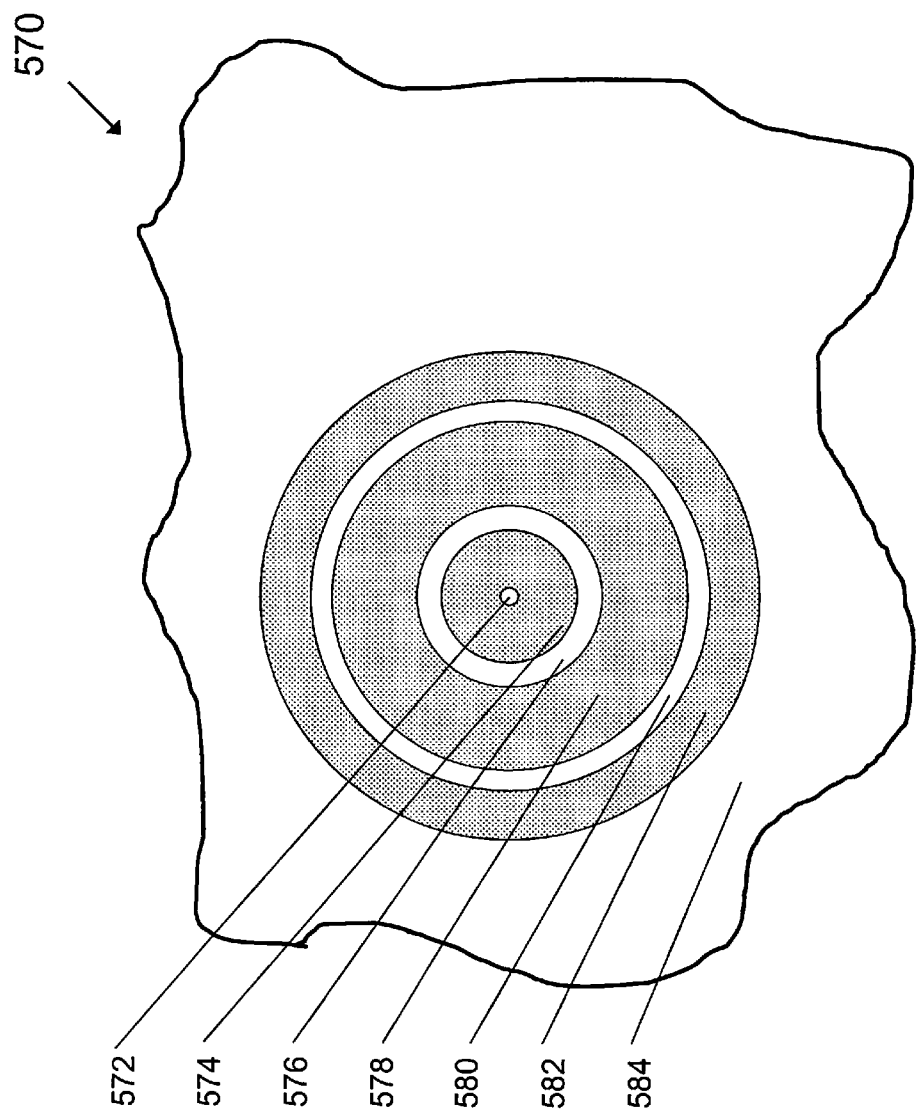

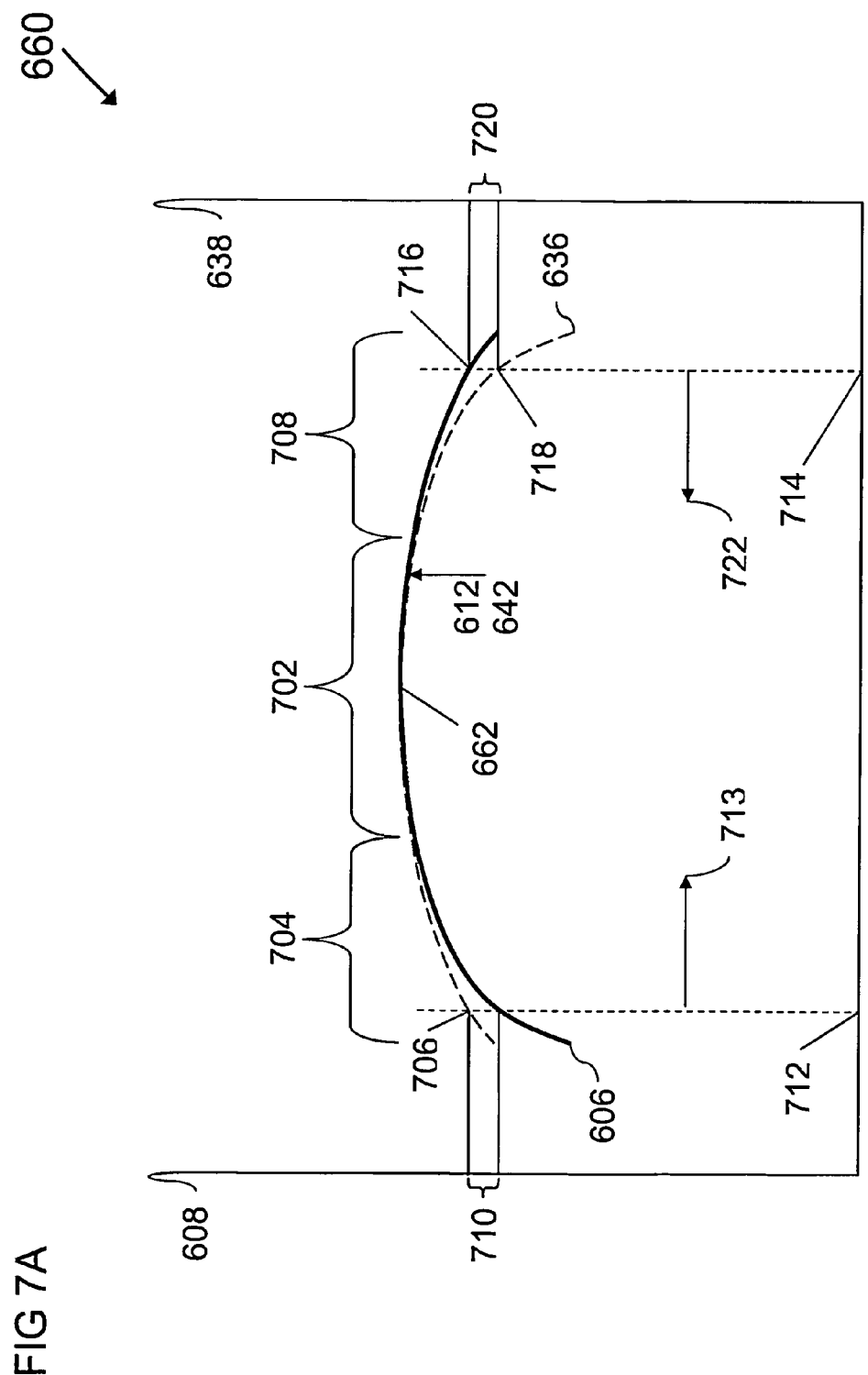

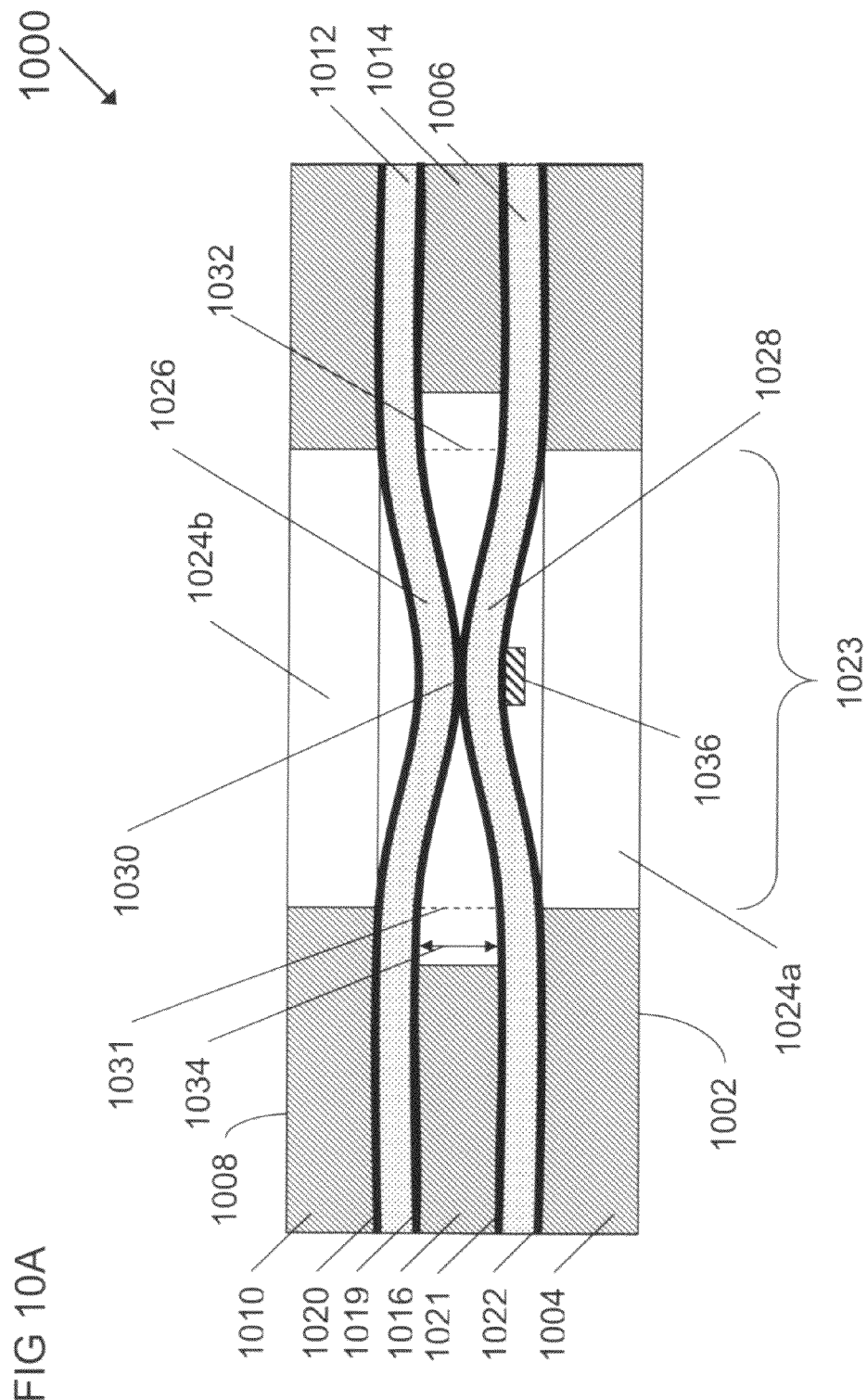

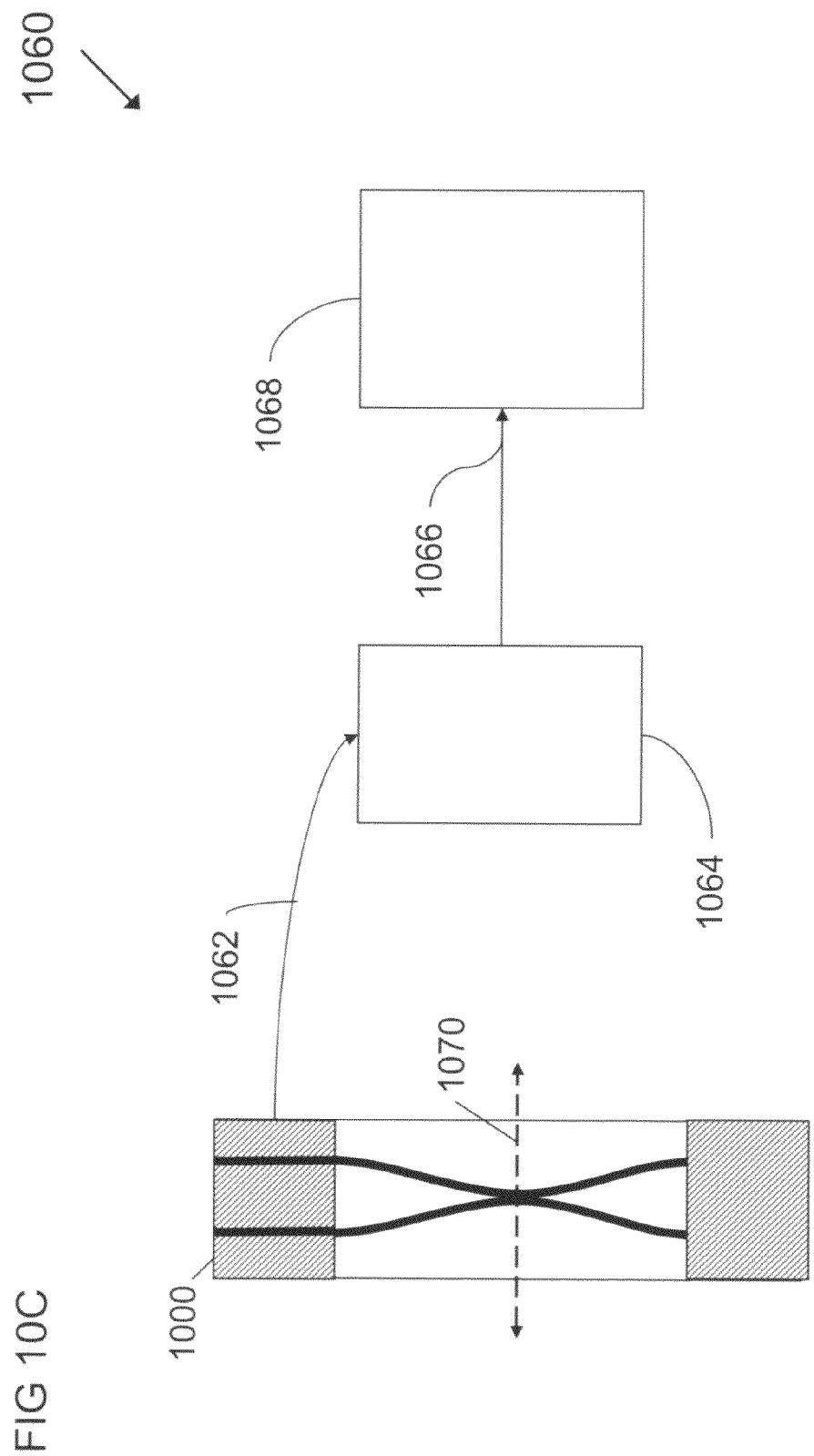

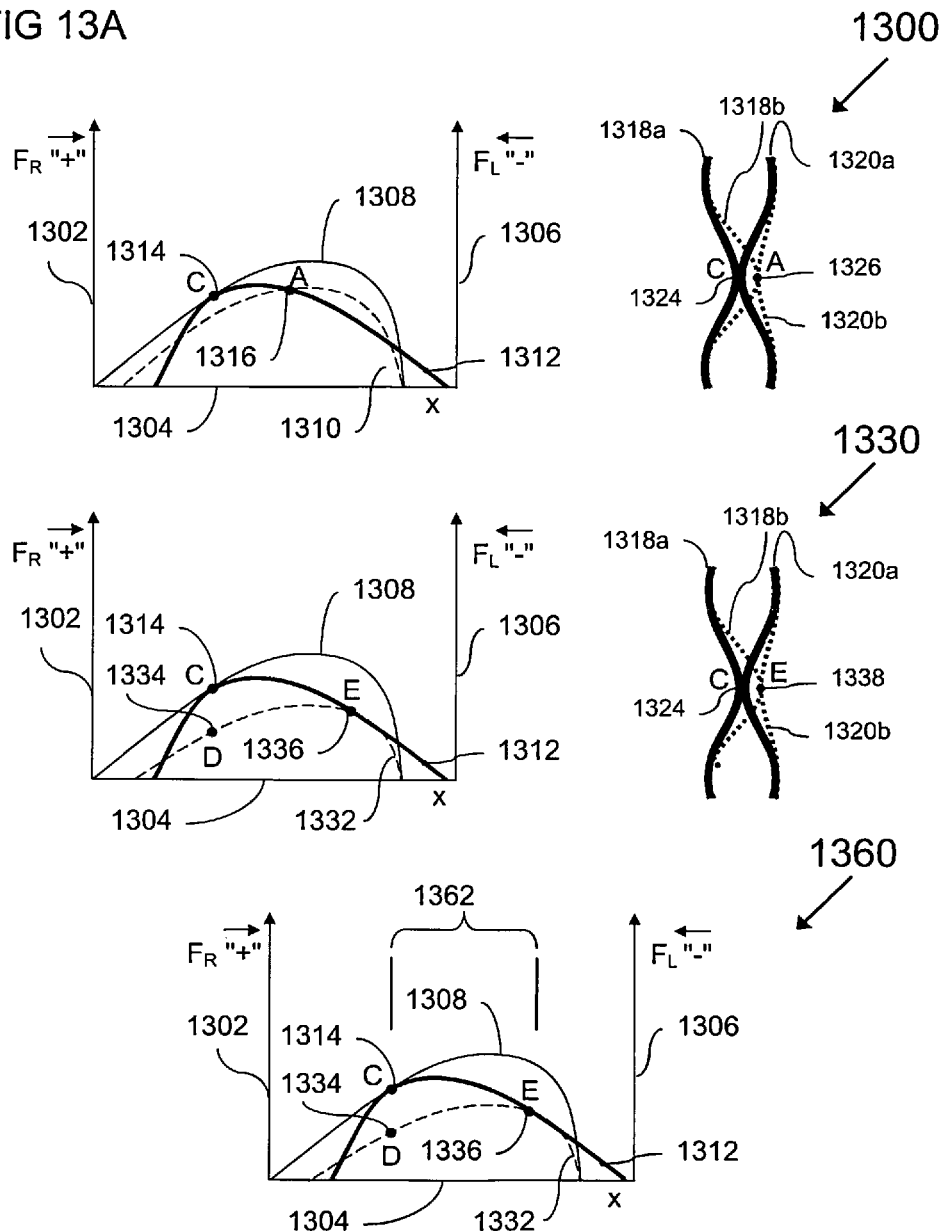

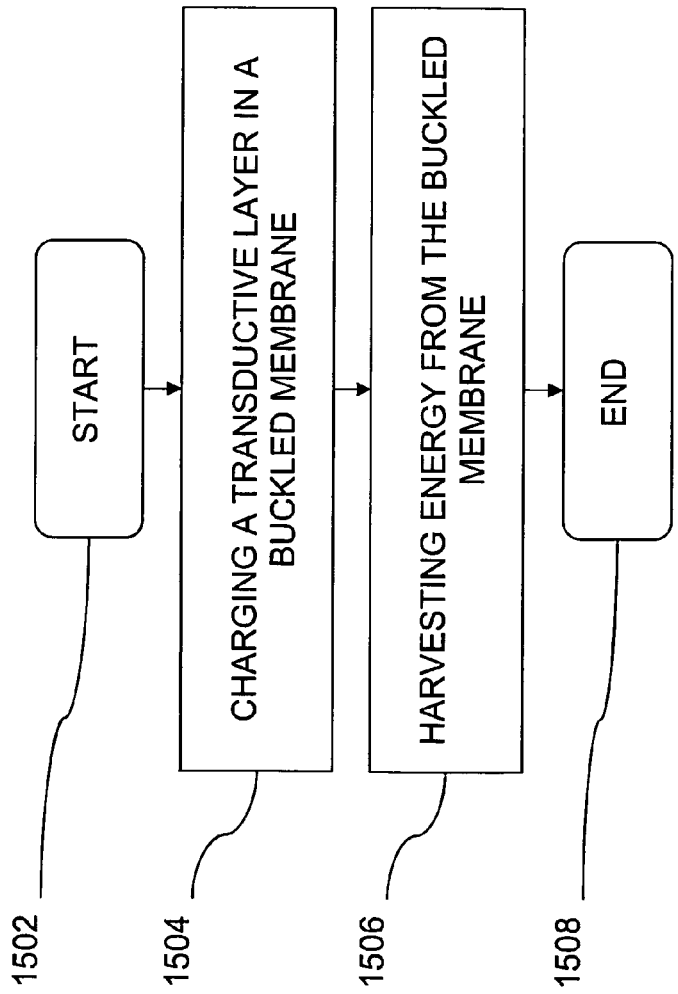

ENERGY HARVESTING WITH A MICRO-ELECTRO-MACHANICAL SYSTEM (MEMS)

BACKGROUND OF THE INVENTION

1. Field of Invention

The invention relates generally to micro-electro-mechanical systems (MEMS) and or micro-opto-electro-mechanical systems (MOEMS), and more specifically to apparatuses and methods used to harvest energy with a MEMS or MOEMS device.

2. Art Background

Modern society demonstrates an insatiable appetite for energy. This appetite for energy spans a wide spectrum of devices and uses such as implantable devices, e.g., pace makers, hearing aids, etc.; handheld devices, e.g., telephones, smart phones, tablets, laptop computers, global positioning system (GPS); and large devices that heat and cool buildings and power automobiles, trucks, busses, building, etc. The list is endless and the need continues to grow with no end in sight. While the need for energy exists across this wide spectrum of devices, often energy is wasted. Wasted energy, if collected, can be used as the primary source of energy for a device. Thus, a simultaneous need to collect wasted energy exists. Collection of wasted energy is also referred to as energy harvesting.

A class of materials called ferroelectrics, which includes piezoelectric materials, can be used to harvest energy. Ferroelectric materials can be combined with micro-electro-mechanical systems (MEMS) or micro-optical-electro-mechanical systems (MOEMS) to harvest energy, thereby turning wasted vibrational energy into electrical energy. As used herein such a device will be referred to as a T-MEMS energy harvester, where "T" refers to the "transduction" nature of the device, whereby electrical energy is generated by an induced strain in a transduction material that produces electrical energy in response to the strain. The resulting T-MEMS or T-MOEMS energy harvester can be coupled to a rechargeable battery to provide a source of electrical power which can power a multitude of devices. The efficiency of existing T-MEMS based harvesters has been low. This presents a problem.

Bending beam based resonance devices have been made which include a piezoelectric material such as lead zirconate titanate ceramic (PZT) or polyvinylidene fluoride (PVDF) combined with a mechanical structure that is designed to subject the piezoelectric material to strain through vibration. However, due to the finite non-zero stiffness of the support structure and the ferroelectric material, a significant amount of energy goes into overcoming the bending stiffness of the combined support structure/ferroelectric material to the detriment of the systems ability to harvest energy. This presents a problem.

BRIEF DESCRIPTION OF THE DRAWINGS

The invention may best be understood by referring to the following description and accompanying drawings that are used to illustrate embodiments of the invention. The invention is illustrated by way of example in the embodiments and is not limited in the figures of the accompanying drawings, in which like references indicate similar elements.

FIG. 1A illustrates a cross-sectional view of a multilayer microstructure, according to embodiments of the invention.

FIG. 1D illustrates a cross-sectional view of a buckled layer within a microstructure, according to additional embodiments of the invention.

FIG. 1E illustrates various projected areas of buckling layers within a microstructure, according to embodiments of the invention.

FIG. 2C illustrates a force displacement curve for a multi-zone microstructure spring, according to embodiments of the invention.

FIG. 4A illustrates a cross-sectional view of an energy harvesting microstructure, according to embodiments of the invention.

FIG. 4B illustrates a top view of the energy harvesting microstructure of FIG. 4A, according to additional embodiments of the invention.

FIG. 4C illustrates a cross-sectional view of an energy harvesting microstructure with isolated transduction regions, according to additional embodiments of the invention.

FIG. 5C illustrates a plurality of transduction regions, according to additional embodiments of the invention.

FIG. 7A illustrates an operating zone of a reduced stiffness elastic micro-mechanical structure, according to embodiments of the invention.

FIG. 10A illustrates a pair of coupled buckled membranes, according to embodiments of the invention.

FIG. 10C illustrates charging a battery with energy harvested from buckled membranes according to one embodiment of the invention.

FIG. 13A illustrates energy harvesting from a pair of coupled buckled membranes, according to embodiments of the invention.

FIG. 15 illustrates a method for harvesting energy with buckled membranes.

DETAILED DESCRIPTION

Figure 1B:
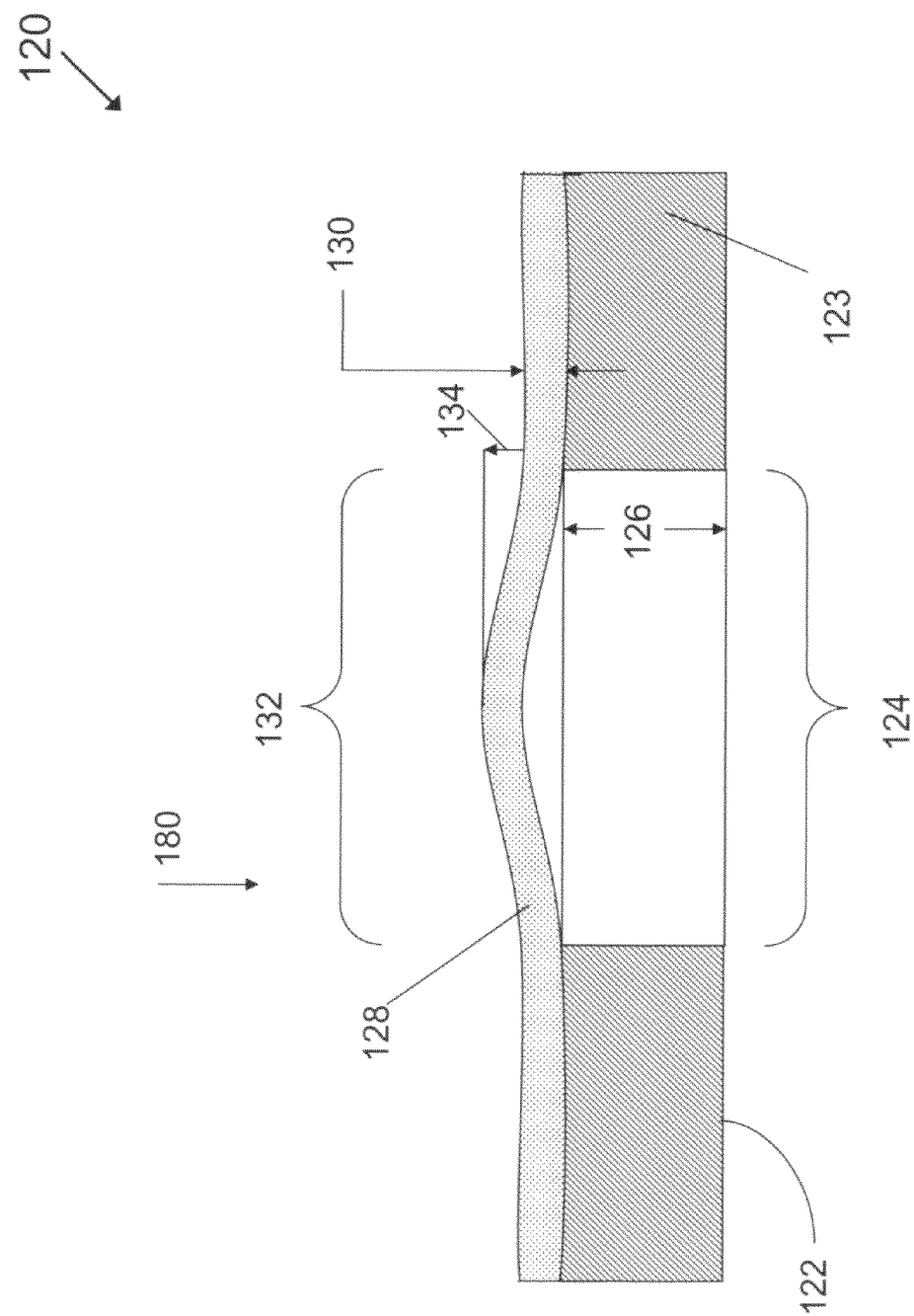
FIG. 1B illustrates a cross-sectional view of a buckled layer within a microstructure, according to embodiments of the invention.

In the following detailed description of embodiments of the invention, reference is made to the accompanying drawings in which like references indicate similar elements, and in which is shown by way of illustration, specific embodiments in which the invention may be practiced. These embodiments are described in sufficient detail to enable those of skill in the art to practice the invention. In other instances, well-known circuits, structures, and techniques have not been shown in detail in order not to obscure the understanding of this description. The following detailed description is, therefore, not to be taken in a limiting sense, and the scope of the invention is defined only by the appended claims.

Apparatuses and methods are described for harvesting energy with a micro-electro-mechanical system which incorporates a transduction material, referred to herein as a T-MEMS. In one or more embodiments a T-MEMS is made with a buckled membrane. In one or more embodiments, a structure with zero stiffness or near zero stiffness is created from a pair of buckled membranes on a microstructure to form the T-MEMS. In other embodiments a T-MEMS is made with a reduced stiffness micro-mechanical structure (RSM) created from a pair of buckled membranes where the stiffness of the composite structure is a fraction of the stiffness of either individual buckled membrane. Eliminating or lowering the mechanical stiffness of the T-MEMS energy harvester overcomes one of the existing problems with current vibrational energy harvesters.

In various embodiments, a RSM is created from a pair of multi-zoned microstructure springs as described in this description of embodiments. As used in this description of embodiments, both zero-stiffness micro-mechanical structures and reduced stiffness micro-mechanical structures are included in the term RSM. The RSM can be used with a transduction micro-electro-mechanical system (T-MEMS) device and/or a transduction micro-opto-electro-mechanical system (T-MOEMS) device, or a user defined device that can incorporate aspects of both MEMS and MOEMS devices. Embodiments of the invention are not limited by the application of the T-MEMS energy harvester, and those of skill in the art will recognize that a T-MEMS energy harvester can be used in embodiments of the invention with devices that do not yet exist.

In all of the figures contained in this description of embodiments, geometrical elements are presented to illustrate concepts and parts of various microstructures. In so doing, geometrical elements such as: thickness, lengths, displacements, and shapes are shown which are not to scale. These geometrical elements have been chosen to facilitate understanding within the confines of the paper on which the illustrations are presented; therefore, relative proportions and absolute dimensions should not be inferred therefrom. Additionally, in the figures that follow, a finite horizontal extent of substrates and layers is shown such that only one or two buckled membranes or two pair of opposing buckled membranes are illustrated in any given figure. Those of skill in the art will recognize that the substrates can extend to encompass many buckled membranes on a single substrate. No limitation is intended, and the finite extent of the substrate and buckled membranes shown is intended to preserve clarity in the illustrations.

FIG. 1A illustrates, generally at 100, a cross-sectional view of a multilayered microstructure, according to embodiments of the invention. With reference to FIG. 1A, the multi-layered microstructure 102 has a substrate 104, with a thickness indicated at 108. The substrate 104 can be made from a semiconductor material such as silicon. A buckling layer is illustrated at 106, with a thickness indicated at 110. In the view shown in 100, the buckling layer 106 has not released from the substrate 104. The buckling layer 106 can be made of a variety of materials such as silicon dioxide, silicon nitride, etc. selected such that buckling is promoted in the final structure after processing.

In one or more embodiments, the buckling layer 106 can be made from a plurality of layers (sub-layers), as described below in the figures that follow, or the buckling layer can be a monolayer. An important property of the materials selected for the buckling layer and the substrate is that a compressive stress should be developed in the buckling layer relative to the substrate. This is accomplished by different methods in various embodiments, and in some embodiments it is accomplished by arranging for the coefficient of thermal expansion of the buckling layer to be less than the coefficient of thermal expansion of the substrate. Or in the case of a multilayered buckling layer, at least one layer of the sub-layers has a coefficient of thermal expansion that is less than the coefficient of thermal expansion of the substrate.

The buckling layer and its sub-layers can be prepared from an inorganic material such as silicon, silicon dioxide in any of its forms (monocrystalline, polycrystalline, microcrystalline or amorphous) silicon germanium, silicon nitride, silicon carbide, diamond, carbon, titanium nitride, a metallic material such as for example, titanium, gold, copper, aluminum, or alloys thereof, an organic material such as for example, a photosensitive resin such as benzocyclobutene (BCB), parylene, polydimethylsiloxane (PDMS), polyethylene terephthalate (PET), poly-para-xylylene, etc. The buckling layer can be made by any known means or by yet unknown means, the exact way in which the buckling layer is made does not limit embodiments of the invention.

Some non-limiting examples of how a buckling layer can be formed by means known to those of skill in the art are, but are not limited to; thin film deposition, film lamination, spin definition, spraying organic materials, ion implantation, etc. Thin film deposition can be performed by chemical vapor deposition (CVD), low pressure chemical vapor deposition (LPCVD), plasma enhanced chemical vapor deposition (PECVD), physical vapor deposition (PVD), electrolysis, epitaxy, thermal oxidation, and vacuum deposition.

FIG. 1B illustrates, generally at 120, a cross-sectional view of a buckled layer within a microstructure, according to embodiments of the invention. With reference to FIG. 1B, a microstructure 122 has a substrate 123 and a buckling layer 128. A region having a width indicated by 124 is patterned and etched to a depth shown as 126. Removal of substrate 123, from the region 124, causes buckling layer 128 to release from a flat planar orientation as illustrated by 106 (FIG. 1A) to the curved shape as illustrated by 128 (FIG. 1B). The buckling layer 128 develops a maximum displaced height indicated by 134. The buckling layer 128 has a horizontal extent indicated by 132. Note that the horizontal extent 132 can be less than the extent of the region 124. The relationship between the horizontal extent 132 and the region 124 depends on the thickness of the buckling layer, the material properties, the magnitude of the compressive stress, and the dimensions and geometry of the projected shape of a buckling layer. In one non-limiting example, a horizontal extent 132 (850 μm) was 85% of the length of the region 124 (1000 μm). A top view 180 of the buckling layer 128 is illustrated in 180 (FIG. 1E) for a variety of projected shapes.

Figure 1C:
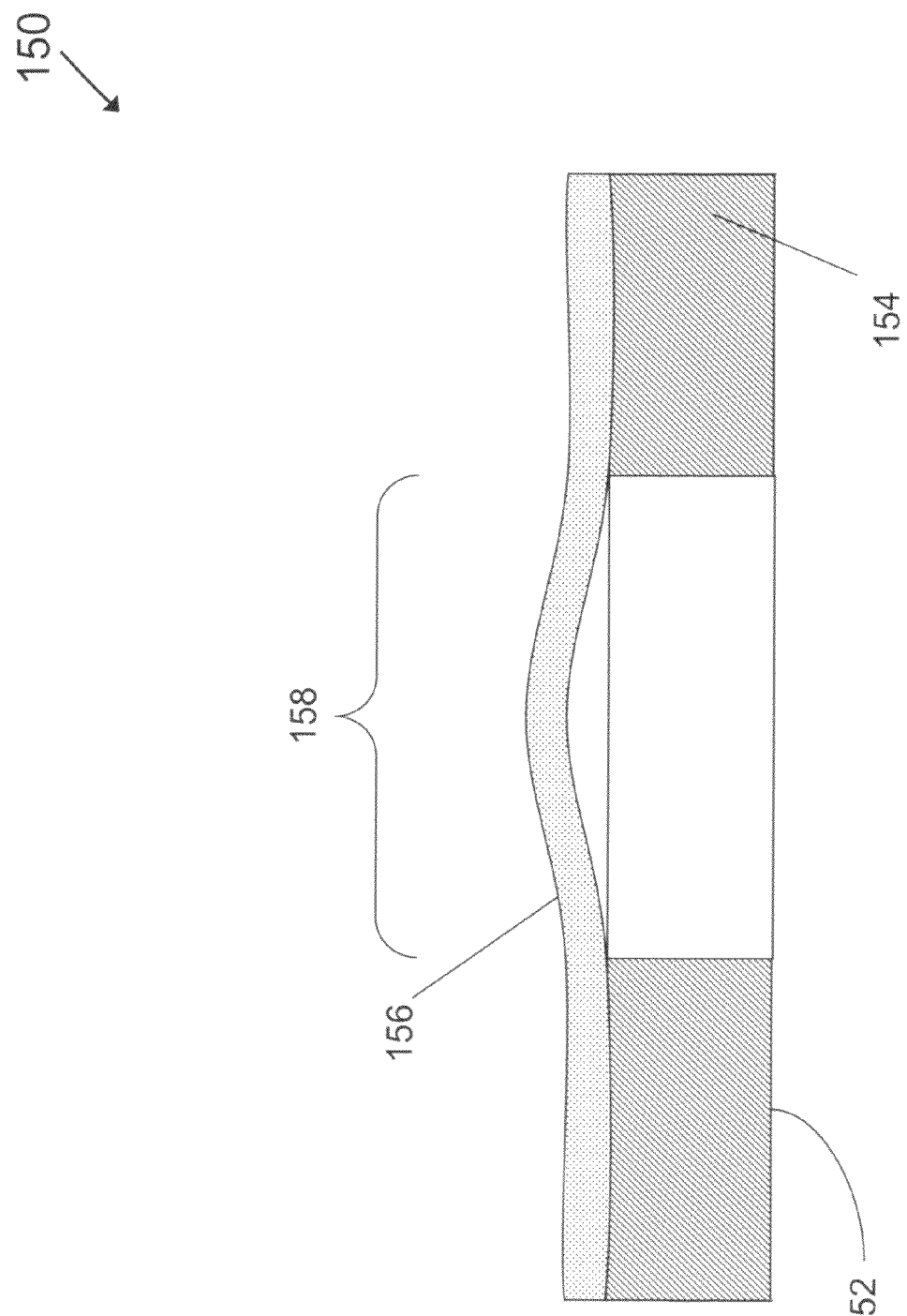
FIG. 1C illustrates a cross-sectional view of a buckled layer within a microstructure, according to additional embodiments of the invention.

FIG. 1C illustrates, generally at 150, a cross-sectional view of a buckled layer (buckled membrane) within a microstructure, according to additional embodiments of the invention. With reference to FIG. 1C, buckling of a layer can be obtained by localized ion implantation into the layer. The substrate 154 is removed in a region 158 from behind the buckling layer 156. Ions implanted during ion implantation induce a compressive stress in the buckling layer 156. The compressive stress induces buckling, which results in a release of a buckling layer 156 into a curved shape that functions as a multi-zoned microstructure spring. The magnitude of the compressive stress induced in the layer depends on the dose selected and the types of ions used. Heat treatment can be applied at approximately 200 degrees C. to trigger release of the buckling layer. 156 shows the buckling layer after release into a curved shape. Note that the buckling layer 156 and the substrate 154 can be the same material; different coefficients of thermal expansion within layers is not required in order to release a buckling layer via ion implantation. Thus, in the example of FIG. 1C both the substrate and the buckling layer can be made from silicon.

Ion implantation can also be used to release a buckling layer when the buckling layer has a coefficient of thermal expansion that is larger than the coefficient of thermal expansion of the substrate. Formation of a layer with a coefficient of thermal expansion which was larger than the coefficient of thermal expansion of the substrate would not result in release of the buckling layer since the buckling layer would be in a state of tension. Ion implantation is used to overcome the state of tension and to create a state of compression, which will result in release of the buckling layer.

Note that the state of tension or compression within a buckling layer of a microstructure depends on, in general: the coefficients of thermal expansion of the materials (e.g., individual; layers of the microstructure), the formation temperature of the microstructure, and the operating temperature of the microstructure. For example, a buckling layer that is in a state of tension at 20 degrees Centigrade will buckle at a temperature above 20 degrees Centigrade (e.g., 200 degrees Centigrade) since the buckling layer will expand more than the substrate (assuming a coefficient of thermal expansion of the buckling layer is larger than a coefficient of thermal expansion of the substrate). Therefore, materials, coefficients of thermal expansion, operating temperatures, and process steps, e.g., ion implantation are considered when buckling is desired within a microstructure.

Many variations in microstructures can exist and many different materials can be used for the substrate and buckling layers. Therefore, depending on the material used for the substrate and the material used for the desired buckling layer, the species to be implanted via ion implantation will be selected to achieve appropriate compressive stress within the material's lattice structure.

An example of a buckling layer having a coefficient of thermal expansion that is greater than the coefficient of thermal expansion of a substrate is a buckling layer made from silicon nitride $Si_3N_4$, having a coefficient of thermal expansion of $3.4 \times 10$-6 mm/K which can be released from a substrate of silicon having a coefficient of thermal expansion of $2.6 \times 10$-6 mm/K via ion implantation. Similarly, a buckling layer can be made from alumina $Al_2O_3$ and can be released from a silicon substrate.

FIG. 1D illustrates, generally at 160, a cross-sectional view of a buckled layer within a microstructure 162, according to additional embodiments of the invention. Referring to FIG. 1D, a buckling layer 166 is illustrated that has reduced adhesion to a substrate 164 over a region 168. Outside of the region 168, the buckling layer 166 has adhesion sufficient to overcome any differential compressive stress residing within the buckling layer. Adhesion between the buckling layer 166 and 164 over the area 168 is too low to prevent buckling.

Referring to 170 in FIG. 1D, release of a buckling layer can be accomplished by application of a first layer that has limited adhesion with the substrate 174, such as a layer 179. In various embodiments, the layer 179 is made from an organic material which provides less adhesion than the adhesion obtained between the buckling layer 176 and the substrate 174. In various embodiments, the layer 179 can be made from polyethylene terephthalate, parylene, benzocyclobutene, etc. For example, a sub-layer of parylene can be deposited by gas spraying on the substrate, patterned by a photolithography step to limit application to the area where release is desired, i.e., 178. Subsequent application of the buckling layer 176 results in limited adhesion under the area 178. Release of the buckling layer can be accomplished by any of the methods previously described, resulting in the buckled membrane 176.

Adhesion between a buckling layer 166 and the substrate 164 can be decreased by a process step(s) in the manufacture of the microstructure for example by an application or a deposition of an intermediate layer (not shown in FIG. 1D at 160), such as by application of liquids e.g., a photosensitive resin such as Unity 2203P from Promerus, LLC.

Depending on the substrate and intended use of the microstructure, buckling can be induced during deposition of a second sub-layer on top of a first sub-layer where the second sub-layer has a higher coefficient of thermal expansion than the coefficient of thermal expansion of the first sub-layer. A vacuum heat treatment at 300 degrees C. for several minutes can facilitate release of the buckling layer.

Alternatively, for a liquid sub-layer of propylene carbonate or water, degradation of adhesion can occur from evaporation at temperatures around 100 degrees C., resulting in release of the buckling layer.

FIG. 1E illustrates, generally at 180, various projected areas of buckling layers within a microstructure, according to embodiments of the invention. With reference to FIG. 1E, a released buckled shape can have any type of projected area. The shape of the projected area depends on the patterning that was employed in order to release a buckling layer over an area. A rectangular shape is indicated at 182, a round shape is indicated at 184, and an oval shape is indicated at 186. A triangular shape is indicated at 188, a square shape is indicated at 190, and a general user defined shape is indicated at 192.

Figure 2A:
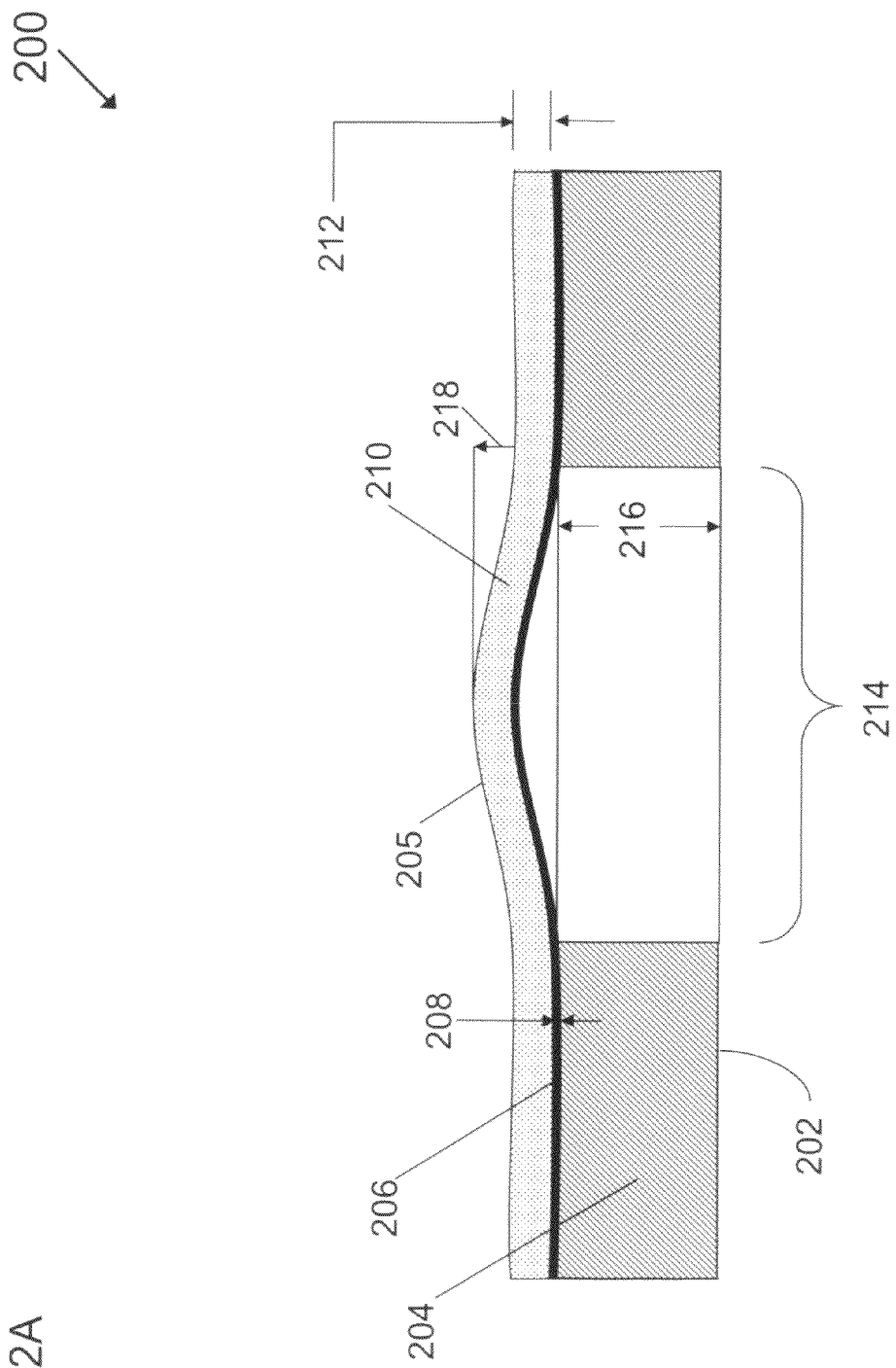
FIG. 2A illustrates a cross-sectional view of a multilayer buckling layer within a microstructure, according to embodiments of the invention

FIG. 2A illustrates, generally at 200, a cross-sectional view of a multilayer buckling layer within a microstructure, according to embodiments of the invention. In one embodiment, a silicon-on-insulator (SOI) wafer 202 was patterned to create a matrix of buckled membranes (only one is shown in the figure for clarity). In this example, an N-type silicon substrate 204 has a thickness of 400 micrometer (μm) indicated at 216. A silicon dioxide layer 206, having a thickness 208 of 2 μm was thermally grown on a top layer 210 also referred to as a device layer having a thickness 212 of 5 μm and made from the same material as the substrate 204 and then sandwiched between the substrate 204 and device layer 210. The bottom of the substrate was patterned over an area 214 and etched to a depth of 400 μm, thereby removing the substrate from beneath the silicon dioxide layer 206.

Various methods can be used to etch the substrate 204. For example, in one embodiment, a layer of silicon dioxide (not shown for clarity) was deposited on the bottom of the wafer 202 followed by a layer of photo resist (also not shown for clarity). The photo resist was then lithographically patterned and developed using standard micromachining techniques. A Buffered Oxide Etch was then used to etch through the silicon dioxide layer and then Deep Reactive Ion Etching (DRIE) was used to remove silicon selectively from beneath the silicon dioxide layer 206. Other techniques can be used such as an anisotropic wet etch using Tetramethylammonium Hydroxide (TMAH). Other micromachining techniques can be used; embodiments of the invention are not limited by the choice of micromachining techniques.

After removal of the substrate 204, over the area 214, the silicon dioxide/device layer 206/210 releases to form a buckling layer 205 with two sub-layers. This is the first of two stable states for the buckling layer. The other or second stable state is referred to as a "popped through" position and is as illustrated below in FIG. 2D. In this example, the resulting buckled membrane 205 had a projected area which was square in shape with dimensions of 1 millimeter (mm) on edge. A resulting maximum deflected height 218 is approximately 15 μm.

Figure 2B:
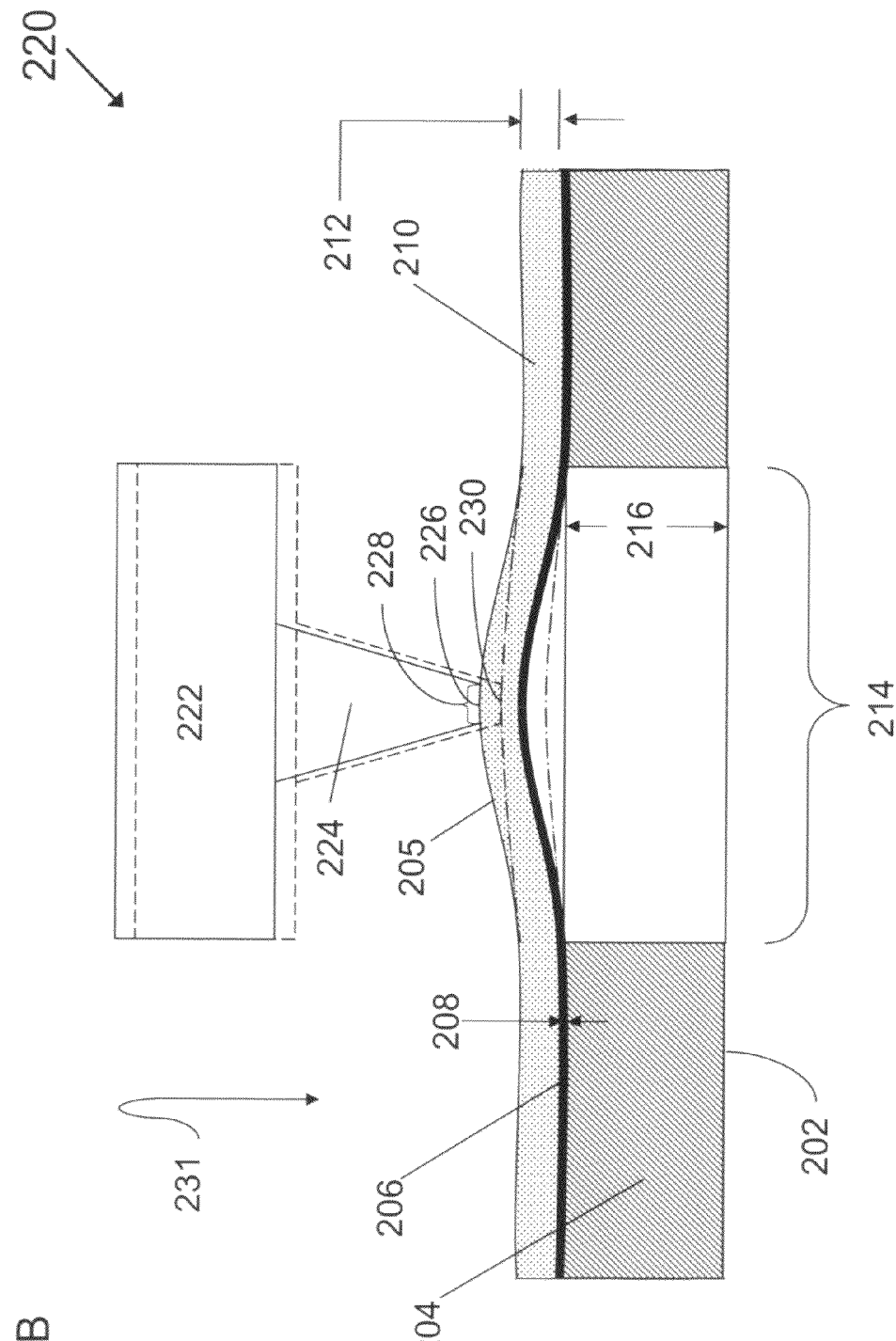
FIG. 2B illustrates contacting a buckled microstructure membrane with a pseudo point load, according to embodiments of the invention.

FIG. 2B illustrates, generally at 220, contacting a buckled microstructure membrane with a pseudo point load, according to embodiments of the invention. Referring to FIG. 2B, a calibrated micro Newton (μN) force sensor 222 is used to apply a pseudo point load to the buckled membrane 205 over a contact area 226. In the experiment resulting in the measurement shown below in FIG. 2C, a force sensor from FemtoTools model FT-S270 was used. This force sensor, mounted to a piezoelectric actuator with a translation range of 20 μm, is capable of applying loads in the micro Newton range (μN). Force sensor 222 has an actuator 224. The actuator 224 has a contact pad 228 which applies the load to the buckled membrane 205 over the contact area 226. The contact area 226 is the portion of the buckled membrane 205 that is directly under the contact pad 228. The contact area 226 is much smaller than the surface area of the buckled membrane 205. The dimensions of the contact pad are 50 μm by 50 μm. It is important to note that the force sensor 222 and the actuator 224 are used to apply a controlled displacement (along with a corresponding application of force) to the buckled membrane 205. The controlled displacement is used to determine a load the buckled membrane applies in response to the controlled displacement.

During the measurement procedure that resulted in the measurement presented in FIG. 2C, the force sensor actuator 224 (FIG. 2B) applies a load to the buckled membrane 205, which causes the buckled membrane 205 to translate in the direction indicated by an arrow 231. One such subsequent position associated with the translation of the actuator 224 and the buckled membrane 205 is illustrated by the dashed lines indicating the displaced position of the actuator and membrane and a point 230. The point 230 shows the location of the actuator tip-buckled membrane interface at one point during the measurement procedure. Following the procedure of applying an increasing displacement to the buckled membrane 205 the measured force verses displacement curve reveals a multi-zoned spring as illustrated in FIG. 2C. This multi-zoned spring has a force-displacement characteristic which corresponds to a stiffness profile which is initially positive, transitions through zero and then becomes negative. Further application of force results in a large deflection of the buckled membrane to a second stable state with curvature that is opposite that of the first stable state. The second stable state is illustrated below in conjunction with FIG. 2D.

FIG. 2C illustrates, generally at 240, a force-displacement characteristic for the multi-zone microstructure spring of FIG. 2A and FIG. 2B, and a corresponding stiffness-displacement relationship, generally at 260, according to embodiments of the invention. With reference to FIGS. 2C and 240, force is plotted on the vertical axis 242 in micro Newtons (μN) and displacement is plotted on the horizontal axis 244 in nanometers. A corresponding stiffness-displacement relationship is plotted in 260 with stiffness plotted on the vertical axis 262 with units of kiloNewtons/meter and displacement plotted on the horizontal axis 264 with units of nanometers. The force-displacement characteristic 240 reveals a multi-zone microstructure spring, characterized by three zones.

A first zone, indicated by 248 and 268, the positive stiffness zone, is characterized by increasing force with increasing displacement of the buckled membrane. A second zone, indicated by, 246 and 266, the zero stiffness zone, is characterized by a constant force-displacement condition. A third zone 250 and 270, the negative stiffness zone, is characterized by decreasing force with increasing displacement. As used in this description of embodiments, the term "zone" can imply a point or a region. The extent or lack of extent of a "zone" is determined by the particular physical structure. As such, in some cases, the zero stiffness zone will exist as a point. No limitation is implied by the use of the term "zone" to characterize the physics of the multi-zone microstructure spring.

Figure 2D:
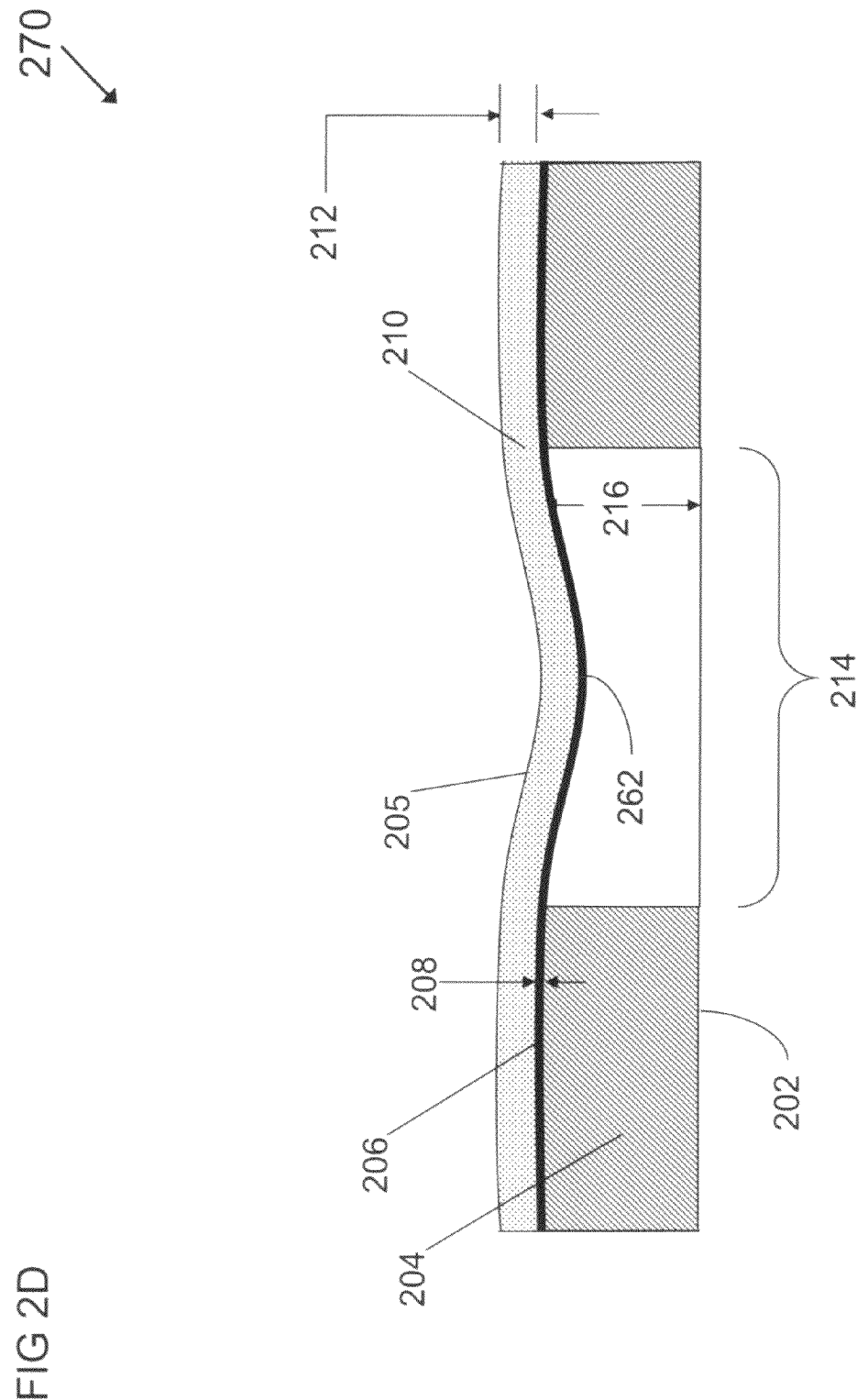
FIG. 2D illustrates a second stable state of a buckled membrane multi-zone microstructure spring, according to embodiments of the invention.

When the buckled membrane passes a displacement illustrated at 254, the buckled membrane quickly translates away from the force sensor actuator 224 to assume its second stable state as shown generally at 270 in FIG. 2D at 262.

The methods described above provide an ability to characterize the physical behavior of a MEMS structure or a MOEMS structure which is superior to exposing the entire surface of such structures to a uniform load through for example pressure exerted by a fluid or a gas. Once characterized, the resulting membrane stiffness together with a known environmental acceleration level are used to determine the size of a sprung mass (attached to the membrane) needed to cause the membrane to transition from the first popped through state to the other in the energy harvester.

In the case of a membrane having a stiffness similar to the one measured in FIG. 2C, in one embodiment, an acceleration level of 9.8 m/sec^2 (typical of levels experienced during walking) and a sprung mass of 0.2 grams are used to cause the buckled membrane to transition between the two stable states.

Note that whenever particular values are given, they are given by way of illustration only and are not meant to limit embodiments of the invention. Those of skill in the art will recognize that the dimensions and composition of the membrane can be changed, resulting in a different size of the sprung mass. Similarly, the environmental acceleration levels can be changed which can result in a different desired sprung mass.

Figure 3A:
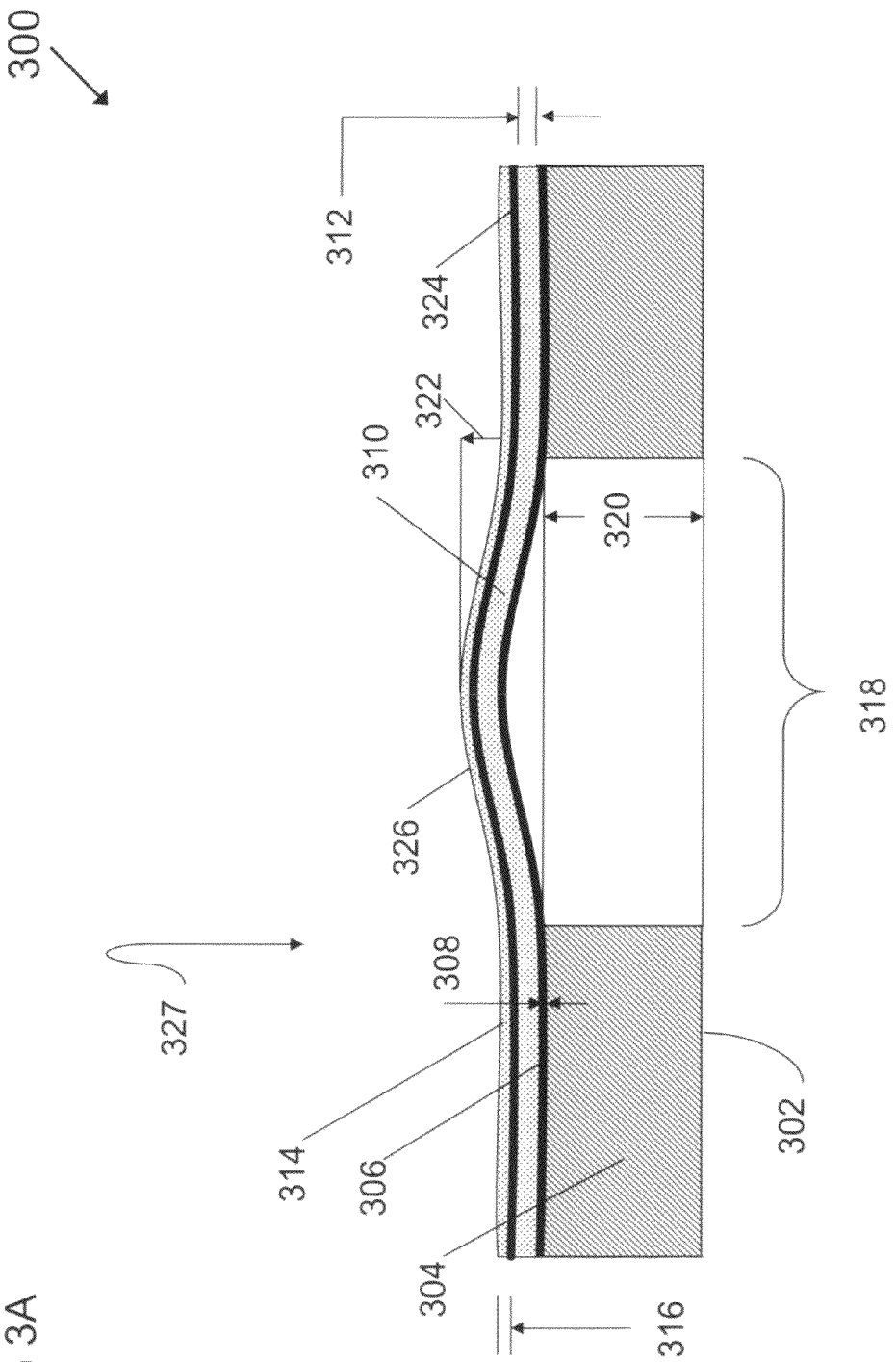
FIG. 3A illustrates a cross-sectional view of a buckled multi-layered membrane within a microstructure, according to embodiments of the invention.

FIG. 3A illustrates, generally at 300, a cross-sectional view of a buckled multi-layered membrane within a microstructure, according to embodiments of the invention. Similar to the microstructure of FIG. 2A, in one embodiment, a silicon-on-insulator (SOI) wafer 302 was patterned to create a matrix of buckled membranes. In this example, an N-type silicon substrate 304 has a thickness of 400 micrometer (μm) indicated at 320. A silicon dioxide layer 306, having a thickness 308 of 2 μm was thermally grown and sandwiched between the substrate 304 and a layer 310. The layer 310 has a thickness 312 of 5 μm and is made from the same material as the substrate 204 (FIGS. 2A, 2B and 2D). Next a 500 angstrom thick titanium layer 324 was evaporated to the silicon layer 310. A 3000 angstrom thick gold layer was evaporated on top of the titanium layer. The bottom of the substrate was patterned over an area 318 and etched to a depth of 400 μm; thereby removing the substrate from beneath the silicon dioxide layer 306.

Similar to the etching applied to the microstructure of FIG. 2A, various methods can be used to etch the substrate 304, prior to release of a buckling layer 326. For example, in one embodiment, a layer of silicon dioxide (not shown for clarity) was deposited on the bottom of the wafer 302 followed by a layer of photo resist (also not shown for clarity). The photo resist was then lithographically patterned and developed using standard micromachining techniques. A Buffered Oxide etch was then used to etch through the silicon dioxide layer and then Deep Reactive Ion Etching (DRIE) was used to remove silicon selectively from beneath the silicon dioxide layer 306. Other techniques can be used such as an anisotropic wet etch using Tetramethylammonium Hydroxide (TMAH). Other micromachining techniques can be used as well; embodiments of the invention are not limited by the choice of micromachining techniques.

After removal of the substrate 304, over the area 318, the buckling layer 326 (which includes layers 306, 310, 324, and 314) releases to form a buckling layer 326 having four sub-layers. In this example, the resulting buckled membrane 326 has a projected area which was square in shape with dimensions of 1 millimeter (mm) on edge, with a predominantly circular curved shape buckling out of the horizontal plane of the substrate. A resulting maximum deflected height 322 is approximately 10 μm.

Figure 3B:
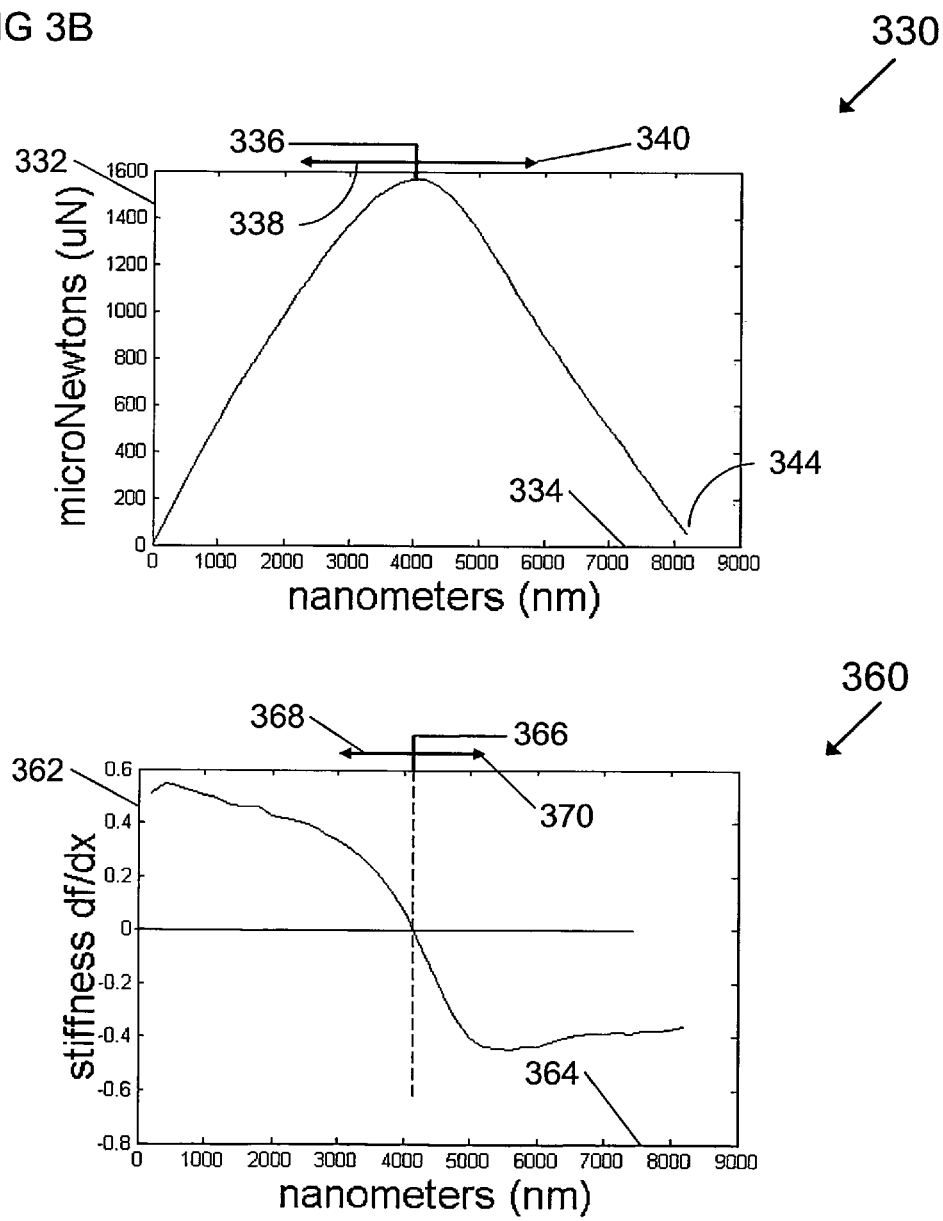
FIG. 3B illustrates a force displacement curve for a multi-zone microstructure spring, according to additional embodiments of the invention.

During the measurement procedure that resulted in FIG. 3B, the force sensor actuator 224 (shown in FIG. 2B but not shown in FIG. 3A for clarity) applies a load to the buckled membrane 326 (FIG. 3A) which causes the membrane to translate in the direction indicated by an arrow 327 (FIG. 3A). As described above in conjunction with FIG. 2B, the procedure results in force and displacement being recorded as the buckled membrane is translated by application of the pseudo point load applied by the force transducer actuator. Subsequent positions associated with the translation of the buckled membrane and the force transducer actuator are not shown for clarity. The procedure applied to the buckled membrane 326 reveals a multi-zoned spring as illustrated in FIG. 3B. This multi-zoned spring has a force-displacement characteristic which corresponds to a stiffness profile which is initially positive, transitions to zero and then becomes negative. Further application of force results in a large deflection of the buckled membrane to a second stable state with curvature that is opposite that of the first stable state.

FIG. 3B illustrates, generally at 330, a force-displacement characteristic for the multi-zone microstructure spring of FIG. 3A, and a corresponding stiffness-displacement relationship, generally at 360, according to embodiments of the invention. With reference to FIG. 3B at 330, force is plotted on the vertical axis 332 with units of micro Newtons (μN) and displacement is plotted on the horizontal axis 334 with units of nanometers. A corresponding stiffness-displacement relationship is plotted in 360 with stiffness plotted on the vertical axis 362 with units of kiloNewtons/meter and displacement plotted on the horizontal axis 364 with units of nanometers. The force-displacement characteristic 330 reveals a multi-zone microstructure spring characterized by three zones.

A first zone indicated by 338 and 368, the positive stiffness zone, is marked by increasing force with increasing displacement of the buckled membrane. A second zone indicated by 336 and 366, the zero stiffness zone, is characterized by a constant force-displacement condition. A third zone 340 and 370, the negative stiffness zone, is characterized by decreasing force with increasing displacement. The zero stiffness zone 336/366 can be a point or a region. No limitation is implied by the use of the term "zone" to characterize the physics of the microstructure spring.

When the displacement of the buckled membrane approaches the end of the negative stiffness zone, as indicated by 344, the buckled membrane quickly translates away from the force sensor actuator 224 to assume its second stable state which is qualitatively shown at 262 in FIG. 2D.

The addition of the metal layers, i.e., 500 angstroms of titanium 324 and 3000 angstroms of gold 314 has increased the linearity of both the positive stiffness zone and the negative stiffness zone as illustrated by the measurements presented in FIG. 3B. In various embodiments, a substantially linearized negative stiffness spring is obtained from a buckled membrane within a microstructure. Such devices have three zones for operation, which are selectable based on an initial displacement from a rest position of the buckled membrane.

In various embodiments, the buckled membranes described in the figures above are configured with one or more transduction layers or regions of material to create an energy harvesting microstructure. FIG. 4A illustrates, generally at 400, a cross-sectional view of an energy harvesting microstructure, according to embodiments of the invention. With reference to FIG. 4A, a multi-layered microstructure is provided for use as a transduction micro electro-mechanical system (T-MEMS) 401. T-MEMS 401 contains a substrate 402 and buckled membranes 414a and 416a. In one or more embodiments, the substrate 402 can be an N-type silicon substrate. Buckled membranes are released from substrate 402 over regions 422 and 424 by means described above in the preceding figures.

A first conductive layer 406 is deposited on the substrate 402 prior to etching substrate from regions 404a and 404b. Alternatively, a layer of silicon dioxide is deposited on substrate 404 before application of the conductive layer 406. In some embodiments a conductive layer is applied from a film of LaNiO3 as described in the figures that follow. The first conductive layer 406 can be made out of doped poly-silicon or a metal layer can be deposited to provide the first conductive layer. A transduction material or layer is shown at 410. The material used for the transduction layer produces a voltage in response to induced strain. The transduction material can be any material that produces a voltage in response to strain.

In various embodiments, the transduction layer 410 can be made from a ferroelectric material. Ferroelectric materials include the class of materials know as piezo-electric materials. Some examples of ferroelectric (and as well piezo-electric) materials are lead zirconate titanate ceramic (PZT), polyvinylidene fluoride (PVDF), polyimide, aluminum nitride (AlN), zinc oxide (ZnO), etc. Embodiments of the invention are not limited by the choice of transduction material and transduction materials that are yet unknown can be used in embodiments of the invention.

A second conductive layer 408 is in contact with the transduction layer 410. The second conductive layer 408 can made from doped poly-silicon, a metal layer, an LiNiO3 film, etc. An optional layer 412 can be added to the second conductive layer 408. The optional layer 412 can be an insulating layer made from silicon dioxide or other material.

After the transduction layer 410 is applied; with the first conductor 406 and the second conductor 408, in the case of ferroelectric materials, the transduction material 410 is poled by application of an electric field using the first conductive layer 406 and the second conductive layer 408 at a temperature above the Curie temperature for the ferroelectric material. Subsequent to poling and cooling the material will exhibit the piezoelectric effect: application of an electric field applied to the material will produce an expansion or contraction of the ferroelectric material and strain of the material will produce an electric potential across the material, current therefrom can be harvested, resulting in the "harvesting of energy."

The constitutive equations for a piezoelectric material are direction dependent; the material will produce different responses depending on the poling axis and the excitation axis. Described herein for the case of a membrane are two axes, the in-plane axis of the membrane and the axis that is perpendicular to the in-plane axis, which is referred to herein as the thickness axis or thickness direction. For the sake of discussion and convention, two modes are important for a membrane, the $d_{33}$ mode and the $d_{31}$ mode. In the $d_{33}$ mode, the material is poled in the 3 direction (430) and the strain is applied in the 3 direction (430), the in-plane axis. In the $d_{31}$ mode, the material is poled in the 1 direction (431) and the material is strained in the 3 direction (430). The 3 direction (430) is the in-plane axis of the membrane and the 1 direction (431) is perpendicular to the plane of the membrane. Thus, the description given for FIG. 4A above describes $d_{31}$ poling. $d_{33}$ poling is described below in FIG. 4D, and FIG. 5A-5C.

In one or more embodiments, lead zirconate titanate ceramic (PZT) is used for the transduction material that is used in a transduction layer or region of the transduction electro-mechanical system (T-MEMS). A PZT layer can be created in various ways as is known to those of skill in the art. One such way, given herein as a non-limiting example starts with a PZT solution created with lead acetate trihydrate, titanium-IV isopropoxide, and zirconium-IV propoxide as precursors and 2-methoxyethanol as a solvent. In order to maximize the efficiency of a T-MEMS device it is desirable to maximize the piezoelectric constants of the transduction region. In the case of a PZT material this occurs when the ratio of Zr to Ti is in the ratio of 52/48.

A sol-gel based 52/48 PZT thin film begins with lead acetate trihydrate and 2-methoxyethanol dehydrated at 120 degrees Centigrade. The zirconium-IV propoxide, titanium-IV propoxide, and 2-methoxyethanol are mixed and stirred at 25 degrees Centigrade and the result is combined with dehydrated lead acetate trihydrate. This mixture is refluxed for three hours at 120 degrees Centigrade and by-products are distilled off at 120 degrees Centigrade. Formamide, 4% by volume, is added as a drying control agent after refluxing. The resulting PZT solution has a concentration of 0.4 M (molar). Other concentrations can be created and used to create the PZT film.

In one embodiment, the starting substrate consists of a silicon dioxide layer deposited on a silicon wafer, known as SOI to those of skill in the art; other wafers can also be used. The thickness of the silicon dioxide layer can vary and in some cases it is desirable for this layer to be between 0.5 μm (micrometers) and 2.0 μm thick. In other cases the silicon dioxide layer can be tens of micrometers in thickness.

The silicon dioxide layer is followed by application of a 200 A (angstrom) thick layer of Ta (Tantalum) or Ti (Titanium) adhesion layer and then an 800 to 2000 A layer of Pt (Platinum). The Pt layer becomes one the electrodes (conductors) needed for the PZT layer. Ta, Ti, and Pt can be applied by sputtering or by other standard micro-machining techniques.

The PZT film is built-up by repetition of processing steps as follows: (1) PZT solution is deposited onto the Pt layer; (2) the substrate is spun for 30 seconds at 2500 RPM; (3) the wafer is placed on a hot plate for pyrolysis at 350 degree Centigrade for 2 minutes; (4) after every four deposition and pyrolysis cycles (steps 1-3 equals one cycle) a crystallization process is performed which is performed in a rapid thermal annealing (RTA) furnace at 700 degrees Centigrade for 30 seconds.

The PZT film is built-up on the substrate by successive application of steps 1-3 at a rate of approximately 0.05 μm/cycle. PZT films can be grown to various desired thicknesses such as 0.25 μm-tens of μm. Embodiments of the invention are not limited by the thickness of the PZT layer.

After the PZT layer has grown to the desired thickness, a second conductor layer is applied on top of the PZT. The second conductor can be a layer of metal such as Pt on the order of 800 to 2000 A thick. Alternatively the second conductor can be made from doped Polysilicon. The second conductor can be deposited over photoresist for later removal to obtain a desired pattern for the second conductor.

Alternatively, a conductive layer can be created by depositing a LaNiO3 thin film on p+ silicon, the LiNiO3 then acts as a conductive layer. A LaNiO3 layer can be derived from a metal organic decomposition technique (MOD). Lanthanum nitrate and nickel acetate are used as starting materials, and acetic acid and water are used as the solvents. Nickel acetate is dissolved in acetic acid at room temperature and lanthanum nitrate is dissolved in water. The two solutions are mixed together and formamide is added to prevent cracking of the film during pyrolysis (water/formamide volumetric ratio of 6:1). Acetic acid is added to achieve a final concentration of approximately 0.3M.

The LaNiO3 film is prepared by spinning the solution onto the silicon substrate at several thousand RPM for 30 seconds. Following spinning, annealing is performed at 300 degrees Centigrade for 60 seconds. The film is then annealed at 700 degrees Centigrade for 60 seconds using rapid thermal annealing (RTA). The deposition and annealing processes are repeated until the desired LaNiO3 film is built-up to the desired thickness. Typical LaNiO3 film thicknesses are in the range tenths of micrometers with 0.3 μm being a typical thickness.

The PZT film can be poled by application of an electric field across the two conductors. Poling field strength is in the kilovolt/cm range, with 20-80 kilovolts/cm being a typical range. Poling temperatures range from room temperature to above the Curie temperature for the transduction material. Poling times are on the order of minutes. When the PZT film is poled at elevated temperature the resulting piezoelectric coefficients are at a higher value. In one embodiment, a PZT film is poled for 15 minutes at 50 kV/cm at room temperature and in another embodiment, the PZT film is poled at 200 degrees Centigrade for 15 minutes resulting in an increase in the value of the piezoelectric constants.

In other embodiments, polyimide is used for the transduction material. Polyimide is a flexible material that can maintain its piezoelectric properties up to 150 degrees centigrade. A process for applying layers or regions of polyimide consists of spin-casting onto a silicon wafer. A polyimide precursor solution is prepared with concentrations of 15% or 20% by weight of polyimide being typical. The surface on which the polyimide film is to be applied must be dry therefore, a short 15 second, 90 degree centigrade pre-bake is used to remove moisture from the wafer. Nominal spin speeds of 4000 revolutions per minute are used and application of the polyimide precursor material at 15% and 20% concentrations results in a film thickness of 1.3 um and 4.0 um respectively. Successive applications of the precursor material can be employed to build up a thicker film if desired. After the polyimide film has been deposited the solvents are driven off with a 24 hour bake at 90 degrees centigrade. A conductive layer can be applied by sputtering a metal layer thereon such as aluminum. The aluminum electrode can be patterned with standard lithography and etching. The polyimide can be etched in an $O_2$ plasma. Alternatively, a directional reactive ion etch can be used on the polyimide. Additional details on using a polyimide layer in a micro-machined structure can be found in *Piezoelectric Polyimide MEMS Process*, National Institute of Aerospace, NASA Langley Research Center Hampton, Va. 23681.

In various embodiments, other materials such as aluminum nitride (AlN) are used for the transduction layer. AlN films can be sputtered onto a silicon substrate and processed with standard micromachining techniques. Alternatively, in other embodiments, Zinc Oxide (ZnO) is used as the conduction material. ZnO is applied to a substrate by various techniques such as sol-gel technique, chemical vapor deposition, (CVD), pulse laser deposition (PLD), spray pyrolysis, magnetron sputtering, etc.

The buckled membrane 414a is shown in a first stable state. A second stable state or popped through state is indicated at 414b. A mass 418 is attached to the buckled membrane 414a. Vibrations from any source of origin (and the resulting accelerations therefrom) will cause the mass 418 to apply a force to the buckled membrane 414a, thereby causing the buckled membrane 414a to travel from one stable state to the other generating energy from the strain imparted to the transduction layer 410 over regions 422 and 424 as the membrane flexes. Optional stops can be provided, as described below in conjunction with FIGS. 12A and 12B to keep the buckled membrane vibrating in a zone of desired stiffness, as described below in conjunction with FIGS. 7A and 7B.

Similarly, buckled membrane 416a is shown in a first stable state. A second stable state for buckled membrane 416a is 416b. A mass 420 is attached to the buckled membrane 416a. Vibrations from any source of origin (and the resulting accelerations therefrom) will cause the mass 420 to apply a force to the buckled membrane 416a, thereby causing the buckled membrane 416a to travel from one stable state to the other generating energy as it does so. The energy generated by the moving membranes is harvested and transferred to an energy storage device such as a capacitor or rechargeable battery using appropriate circuit elements not shown.

An extent of the buckled membrane 414a is shown at 422. Similarly, an extent of the buckled membrane 416a is shown at 424.

FIG. 4B illustrates, generally at 450, a top view of the energy harvesting microstructure 402 of FIG. 4A, according to additional embodiments of the invention. With reference to FIG. 4B, a top view 454 of the first buckled membrane 414a is shown and a top view 458 of the second buckled membrane 416a is shown. Any number of additional buckled membranes can exist on the T-MEMS of FIG. 4A and FIG. 4B. Two optional additional buckled membranes are shown at 460 and 462.

The plurality of buckled membranes shown in FIG. 4A (414a and 416a, etc.) are configured with common first and second conductors which combine, in parallel, the electrical energy outputs of the buckled membranes within the conductors. In some embodiments, it is desirable to be able to access the electrical outputs of buckled membranes individually without combining them in the conductor; such a mechanism is shown in FIG. 4C.

FIG. 4C illustrates a cross-sectional view, generally at 470, of an energy harvesting microstructure with isolated transduction regions, according to additional embodiments of the invention. With reference to FIG. 4C, the transduction layer 410 from FIG. 4A is partitioned into multiple transduction regions, i.e., a transduction region 410a and a transduction region 410b. Insulating material 411 is used in between the transduction region 410a and the transduction region 410b. Insulating material 411 can be made, in one example, from silicon dioxide ($SiO_2$).

Similarly, the first conductor 406 from FIG. 4A is divided into individual conductors 406a and 406b, thereby separating electrically the first conductor into areas specific to the transduction region 410a and the transduction region 410b. Insulating areas 407 within the layer of the first conductor can be made in one embodiment from SiO2. The second conductor 408 FIG. 4A is divided into individual conductors 408a and 408b, thereby separating electrically the second conductor into areas specific to the transduction region 410a and the transduction region 410b. Insulating areas 409 within the layer of the second conductor can be made in one embodiment from SiO2. Appropriate connection to the conductors 406a and 408a allows the energy from transduction region 410a to be channeled separately from the energy from conductors 406b and 408b. Energy from the transduction region 410b is accessed from the conductors 406b and 408b.

Figure 4D:
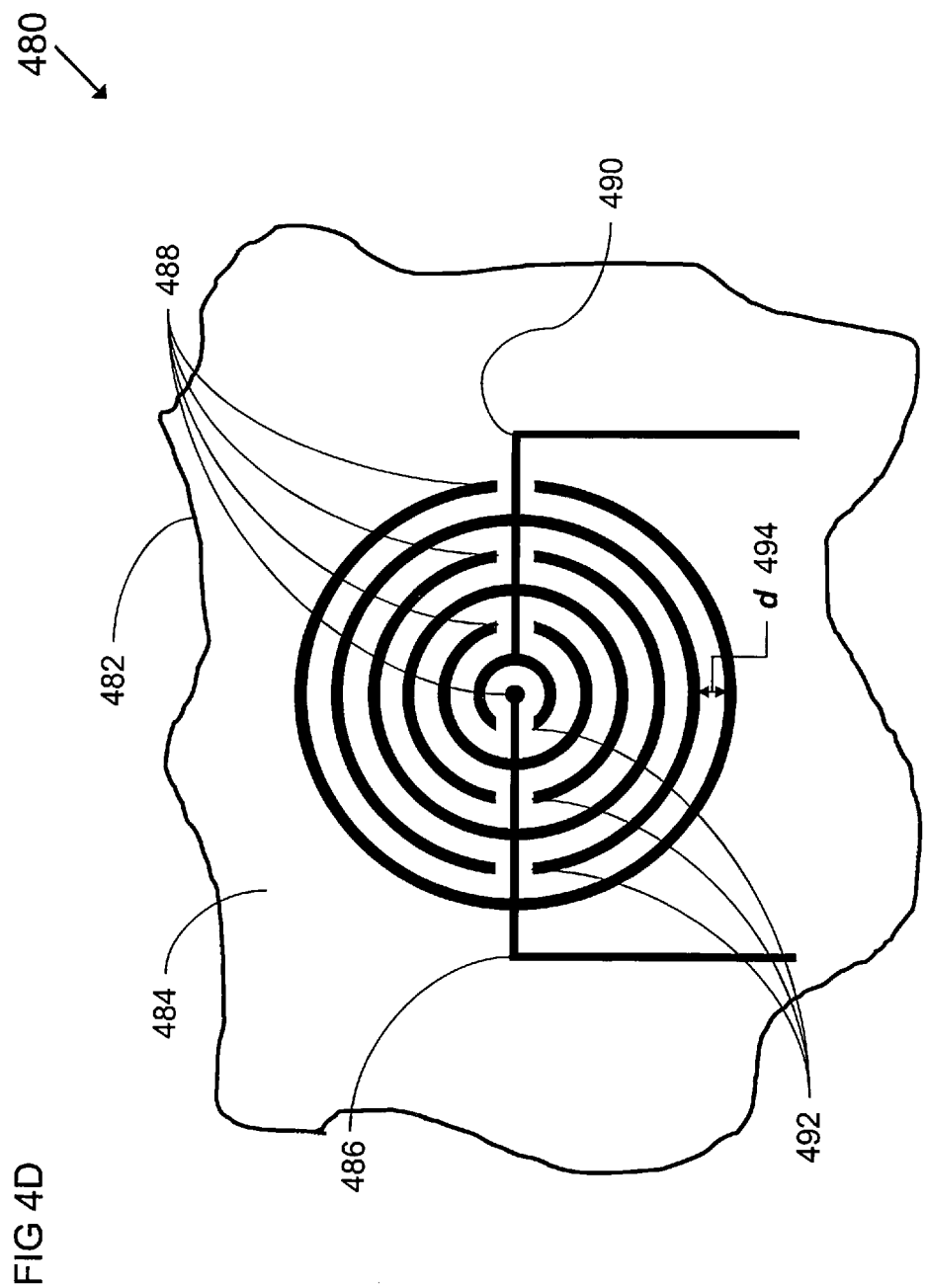
FIG. 4D illustrates interdigitated conductors, according to embodiments of the invention.

FIG. 4D illustrates, generally at 480, interdigitated conductors, according to embodiments of the invention. With reference to FIG. 4D, a microstructure 482 has a surface 484. The surface 484 can be in various embodiments, a layer or region of transduction material.

A first conductor 486 includes a plurality of semicircular portions 488. A second conductor 490 includes a plurality of semicircular portions 492. Semicircular portions 488 and semicircular portions 492 are separated by a distance d (indicated at 494) and are referred to as interdigitated. In various embodiments, interdigitated conductors 490/492 and 486/488 are located on the same surface 484, which puts both conductors on the same side of the transductive layer or region.

Interdigitated conductors can be arranged in a variety of geometries such as circular, oval, square, etc. When an electrical field is applied between the first conductor 486/488 and the second conductor 490/492 the transduction layer or region is poled in the 3 direction (see FIG. 4A at 430), which utilizes the $d_{33}$ direction of the transduction layer or region.

The two interdigitated conductors 486/488 and 490/492 are applied by means described herein and by means know to those of skill in the art.

Figure 5A:
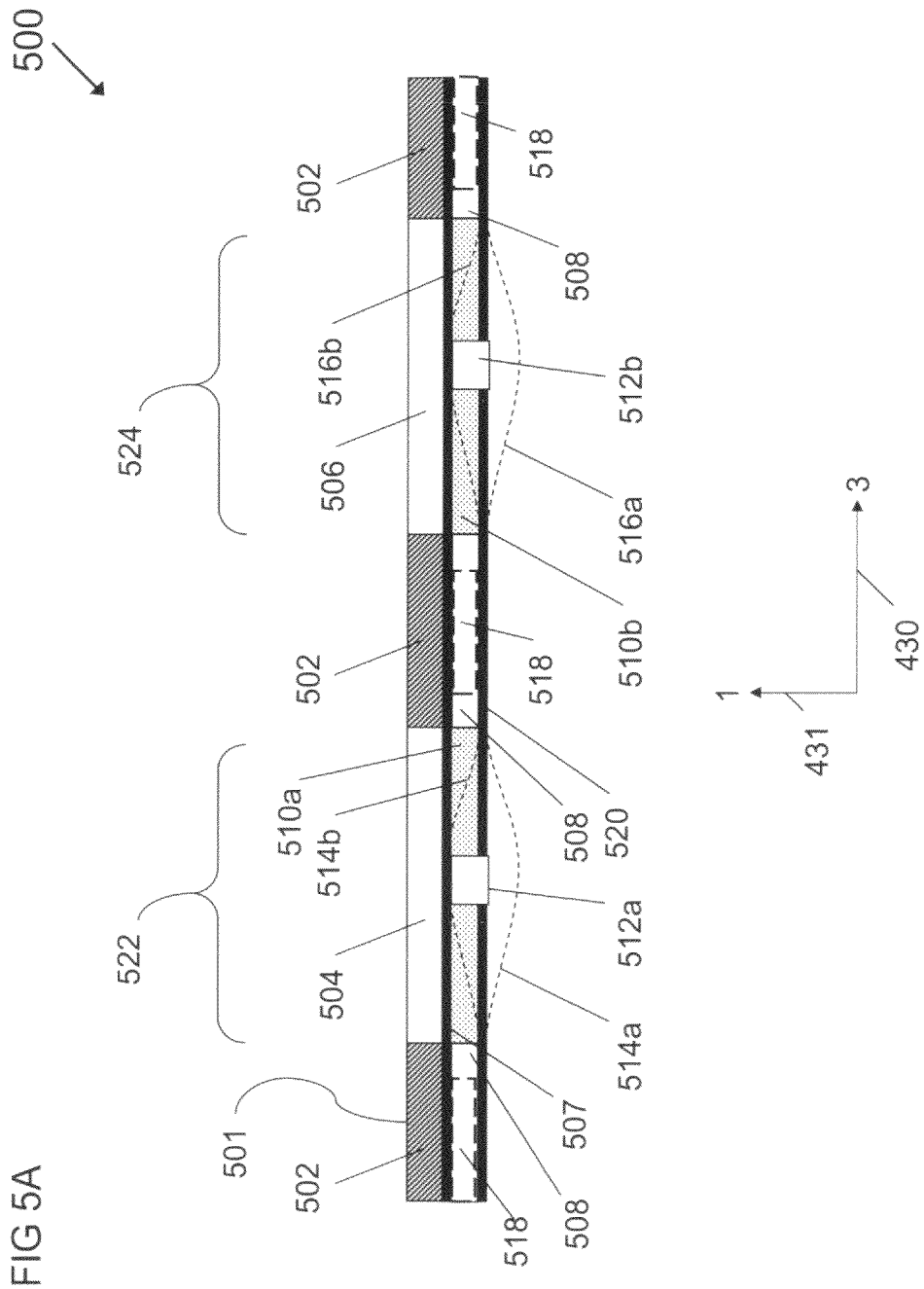
FIG. 5A illustrates an energy harvesting microstructure utilizing $d_{33}$ poling, according to additional embodiments of the invention.

FIG. 5A illustrates an energy harvesting microstructure utilizing $d_{33}$ poling, generally at 500, according to additional embodiments of the invention. With reference to FIG. 5A, a multi-layered microstructure is provided for use as a transduction micro-electro-mechanical system (T-MEMS) 501. T-MEMS 501 contains a substrate 502 and buckled membranes 514a and 516a. In one or more embodiments, the substrate 502 can be an N-type silicon substrate. Two energy producing membranes are shown in 501; however any number of energy producing membranes can be configured into 501. A first transduction region 510a is bounded by a first conductor 512a and a second conductor 508. A second transduction region 510b is bounded by a first conductor 512b and the second conductor 508.

Using standard micromachining techniques, transduction material is applied in a layer, which is then patterned and etched to provide the first transduction region 510a and the second transduction region 510b. In the case of ferroelectric materials, the transduction region 510a is poled in the $d_{33}$ direction 430 by application of an electric field between the first conductor 512a and the second conductor 508 at a temperature above the Curie temperature for the ferroelectric material. Subsequent to poling and cooling the material will exhibit the piezoelectric effect: application of an electric field applied to the material will produce an expansion or contraction of the ferroelectric material and strain of the material will produce an electric potential across the material, electrical charge therefrom can be harvested, resulting in the "harvesting of electrical energy." In like manner, the second transduction region 510b is poled by application of an electric between the first conductor 512b and the second conductor 508. Note that the electric field is applied in the "3" direction as indicated at 430 which indicates the in-plane axis of the membrane. When the membrane buckles and flexes from one stable state to another the strain developed in the membrane is also in the "3" direction.

The T-MEMS 501 can have one or more optional layers as shown in FIG. 5A. In one or more embodiments, an optional insulating layer 507 can be applied to the substrate 502. In one or more embodiments, the substrate 502 can be made from silicon and the insulating layer 507 can be made from silicon dioxide. Also, in one or more embodiments, an optional insulating layer 518 can be applied to the transduction/conductor layer. The optional insulating layer 518 is then patterned and etched to reveal the first conductor 512a and the first conductor 512b. The second conductor can be accessed through appropriate patterning and etching as well.

In various embodiments, the buckled membranes 514a and 516a are released from the substrate 501 by etching or other appropriate technique from the substrate 502 in the area 504 and 506 over the regions 522 and 524 as described above in conjunction with the preceding figures. The first buckled membrane 514a can travel as shown from a first stable state as indicated by the dashed line of 514a to a second stable state, as indicated by a dashed line of 514b. Similarly, the second buckled membrane 516b can travel as shown from a first stable state as indicated by the dashed line of 516b to a second stable state, as indicated by a dashed line of 516b.

The first conductors 512a, 512b, and the second conductor 508 can be made out of doped poly-silicon or a metal such as gold, silver, platinum, etc. or other film such as LaNiO3 can be deposited to provide the conductors. The conductors can be formed by patterning and etching a conductive layer applied either before or after the transduction material is applied.

Just as in the case of $d_{31}$ poling, described above, the material used for the transduction regions produces a voltage in response to induced strain. The transduction material can be any material that produces a voltage in response to strain such as PZT, PVDF, etc. In various embodiments, the transduction regions 510a and 510b can be made from a ferroelectric material. Ferroelectric materials include the class of materials know as piezo-electric materials. Some examples of ferroelectric (and as well piezo-electric) materials are lead zirconate titanate ceramic (PZT) or polyvinylidene fluoride (PVDF). Embodiments of the invention are not limited by the choice of transduction material and transduction materials that are yet unknown can be used in embodiments of the invention.

In some embodiments, it can be desirable to configure each buckled membrane so that they are electrically isolated from each other. In such a case, the second conductor is segregated into separate conductors that only have contact with one transduction region. The second conductor is patterned as is shown by optional insulating material 518. Insulating material 518 can be made from silicon dioxide in one or more embodiments.

Figure 5B:
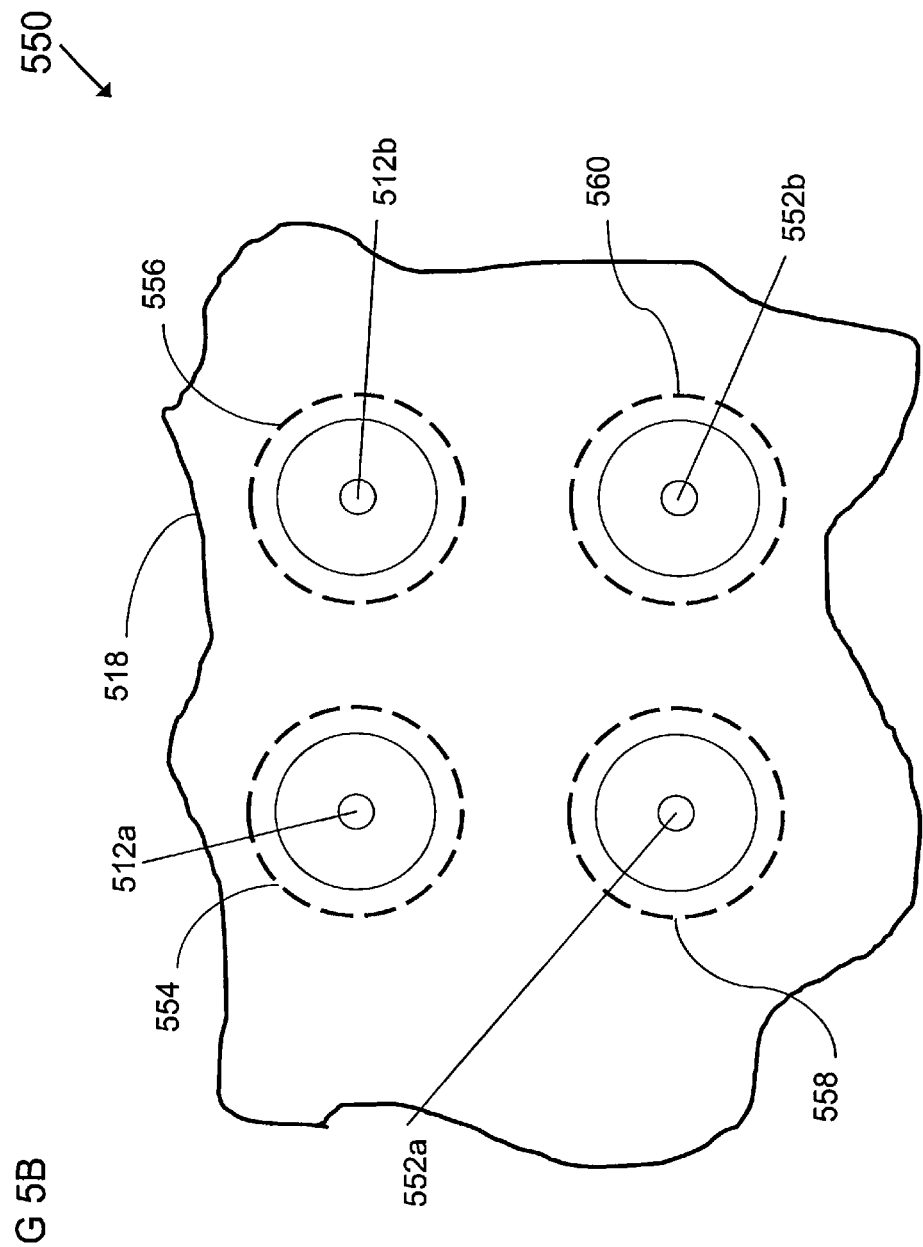
FIG. 5B illustrates the transduction layer of the energy harvesting microstructure of FIG. 5A, according to additional embodiments of the invention.

FIG. 5B illustrates the transduction layer of the energy harvesting microstructure of FIG. 5A, generally at 550, according to additional embodiments of the invention. With reference to FIG. 5B, the second conductor 508 is shown in a top view. The first conductors 512a and 512b are shown as well as first conductors 552a and 552b from optional third and fourth transduction regions.

In the case where separate electrical isolation between transduction regions is desired, the second conductor is partitioned into an annular ring around the transduction region. In such a case, with appropriate patterning and etching 518 is an insulating material such as silicon dioxide and annular rings 554, 556, 558, and 560 become the second conductors. The conductors can be made from doped silicon, metal, LiNaO3, or other conductive film.

FIG. 5C illustrates, generally at 570, a plurality of transduction regions, according to additional embodiments of the invention. With reference to FIG. 5C, a plurality of transduction regions are arranged in series and are configured for $d_{33}$ poling. The series arrangement of transduction regions has a first conductor 572 in electrical contact with a first transduction region 574. The first transduction region 574 is in electrical contact with the first conductor 572 and a second conductor 576. The second conductor 576 is in electrical contact with the first transduction region 574 and a second transduction region 578. The second transduction region 578 is in electrical contact with the second conductor 576 and a third conductor 580. The third conductor 580 is in electrical contact with the second transduction region 578 and a third transduction region 582. The third transduction region 582 is in electrical contact with third conductor 580 and a fourth conductor 584.

In one embodiment, the contribution from each transduction region is dependent on the surface area of each electrode. Contributions from each of the transduction regions 574, 578, and 582 is obtained by poling each successive transduction region so that the harvesting circuit will obtain either a parallel or series circuit. Series addition of transduction regions as shown in FIG. 5C will increase the voltage of the electrical energy generated from the transduction regions, and parallel will increase the current.

FIGS. 1A-5C above and the discussion directed to them describe various methods of creating a transduction microelectro mechanical system (T-MEMS) using a buckled membrane. In various embodiments, a T-MEMS is made with a reduced stiffness microstructure (RSM). The RSM is made from two opposing buckled membranes with tailored properties.

Figure 6A:
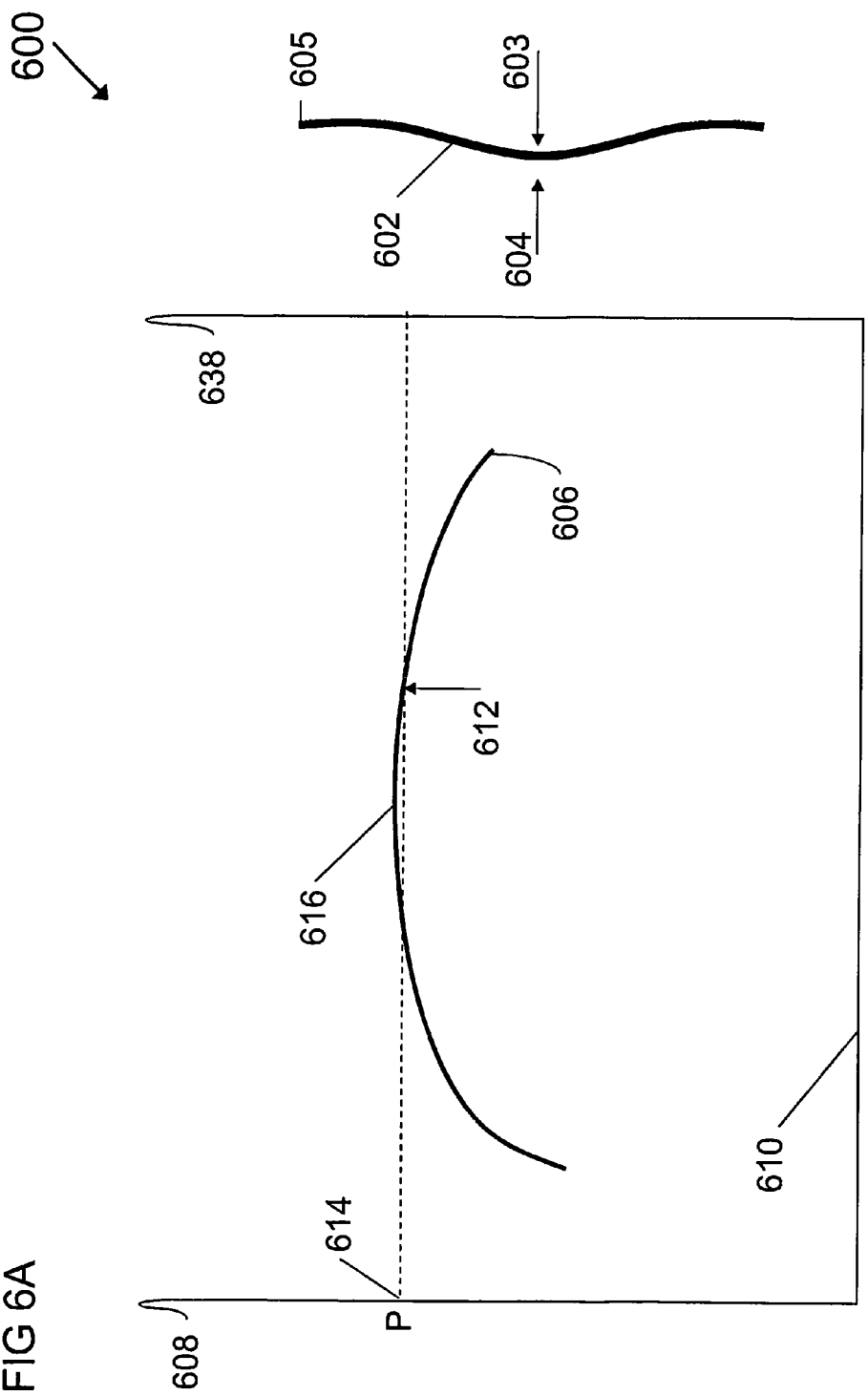
FIG. 6A illustrates a force-displacement characteristic of a first buckled membrane, according to embodiments of the invention.
Figure 6B:
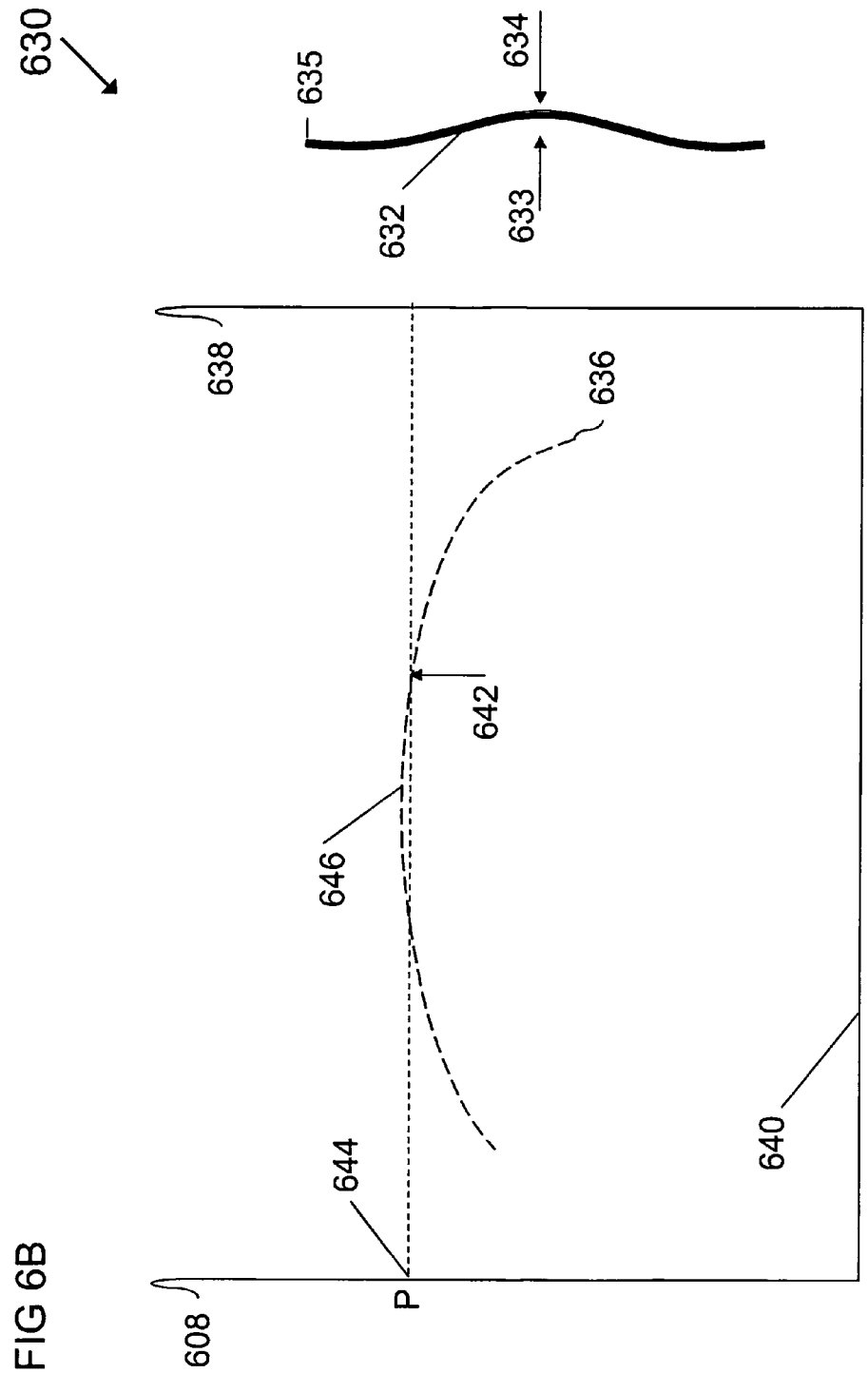
FIG. 6B illustrates a force-displacement characteristic of a second buckled membrane, according to embodiments of the invention.
Figure 6C:
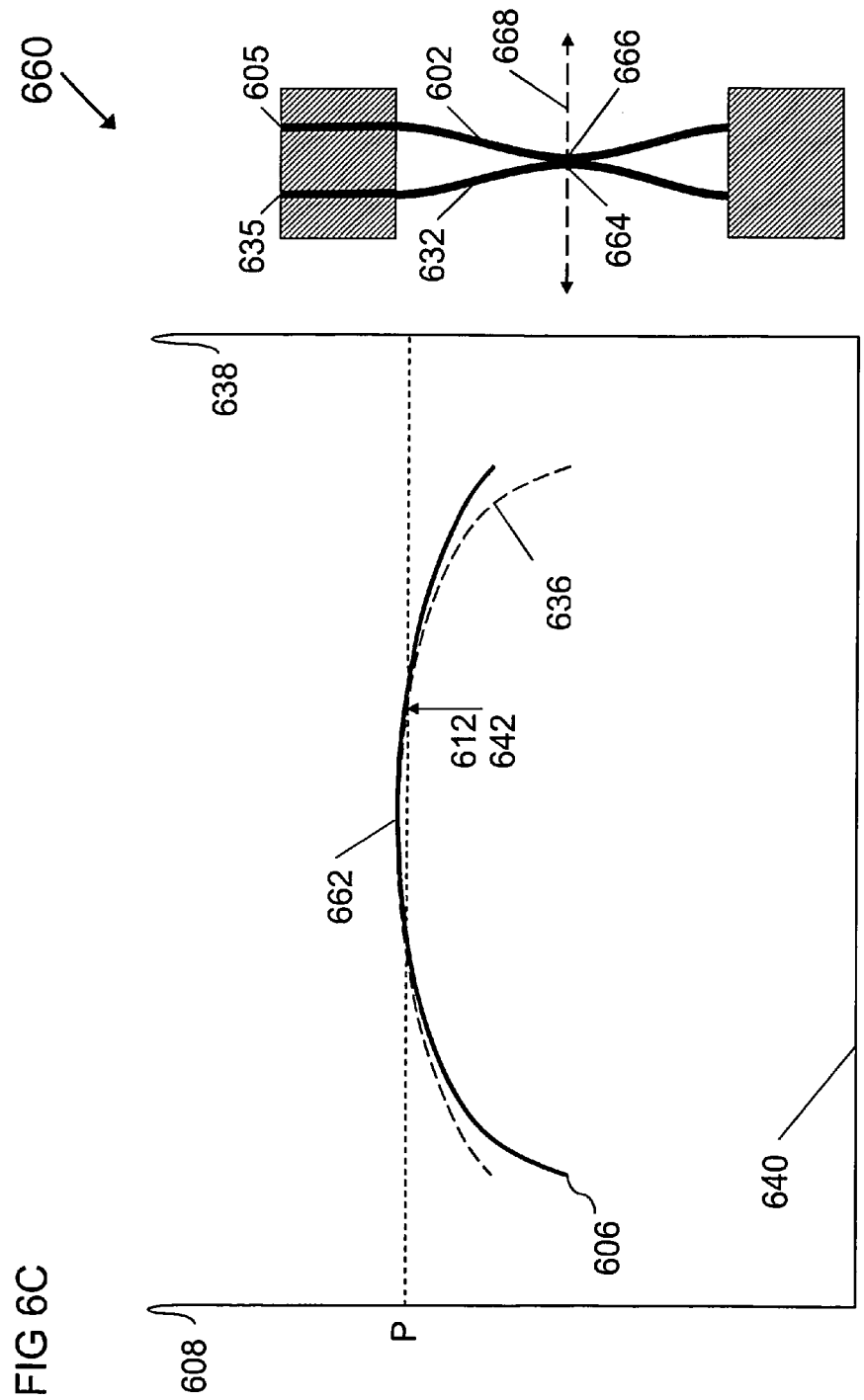
FIG. 6C illustrates aligning load/displacement responses of two coupled buckled membranes to produce a reduced stiffness zone, according to embodiments of the invention.

Referring to FIGS. 6A, 6B, and 6C, FIG. 6A illustrates a force-displacement characteristic of a buckled membrane, according to embodiments of the invention. A first buckled membrane is shown generally at 600 in FIG. 6A. A first buckled membrane 602 has a buckling direction indicated at 603; the first buckled membrane 602 is part of a first buckling layer 605. The first buckled membrane 602 is loaded at 604, which causes the membrane to deflect opposite to the buckling direction 603. A force-displacement plot is shown at 606 with force plotted on the vertical axis at 608 and displacement along a horizontal axis at 610. In one embodiment, the force-displacement plot 606 is the measurement shown earlier in FIG. 2C.

The load 604, applied to the first buckled membrane 602, is plotted at 614, the load 614 produces a displacement 612 as indicated on curve 606. A point 616 indicates the zero slope of the force-displacement plot 606 which is where the stiffness of the first buckled membrane 602 is zero.

Referring now to 630 in FIG. 6B, a second buckled membrane 632 is positioned to oppose the first buckled membrane 602. The second buckled membrane 632 is part of a second buckling layer 635. The second buckled membrane 632 is designed to have a force-displacement characteristic 636 that is identical to the force-displacement characteristic 606 of the first buckled membrane 602. As used in this detailed description of embodiments, the term "opposing" refers to the situation where membranes have buckled in the opposite direction. Such a case is illustrated by buckling direction 633 (arrow to the right) which is opposite to the buckling direction 603 (arrow to the left) of the first buckled membrane 602 (FIG. 6A).

A load 634, imparted by the first buckled membrane 602, displaces the second buckled membrane 632 to the left. A point 646, on the displacement axis, indicates the zero slope of the force-displacement plot 636 which is where the stiffness of the second buckled membrane 632 is zero.

Referring now to 660 in FIG. 6C, the first buckled membrane 602 and the second buckled membrane 632 have been brought together into contact with each other, thereby developing a mutual preload, to the point where the point 616 and the point 646 overlap each other, resulting in point 662. Such a condition is referred to as aligning the force-displacement responses or characteristics of the two opposing membranes. The force 612 and 642 represent equal and opposite forces applied to buckled membrane 602 and 632, respectively. Loads 612 and 642 are indicated in 660 as coincident with each other.

FIG. 7A illustrates an operating zone of a reduced stiffness microstructure (RSM), from 660 in FIG. 6C, according to embodiments of the invention. Referring now to FIGS. 6A, 6B, 6C, and FIG. 7A, the opposing buckled membranes were selected to provide very similar to identical force-displacement responses. In this case, a zero-stiffness operating zone was desired, the aligned opposing buckled membranes provide a zero-stiffness operating zone indicated at 702. In the operating zone, a force applied to a membrane surface at 664 or 666, which is along the buckling directions 668 of the membranes, produces motion of the buckled membrane microstructure.

Asymmetry in the force-displacement characteristics results in a net non-zero force exerted between the membranes along the buckling axis in two zones. These two zones function as potential energy stops which provide restorative forces that help keep the opposing buckled membranes in the operating zone 702. Two such non-zero force conditions are illustrated in FIG. 7A.

A first zone where the net force between the membranes is non-zero is indicated at a zone 704. In the zone 704, the second buckled membrane 632 exerts a force on the first buckled membrane 602 which is larger than the opposing force exerted by the first buckled membrane 602 (e.g. 706 on the curve 636), thereby causing the opposing buckled membranes to move to the right for displacement positions in the zone 704, such as 712. At displacement 712, the net non-zero force exerted on the opposing buckled membranes is the difference between the curve 636 and the curve 606, which is indicated at 710. The force-displacement characteristics 606 and 636 for the buckled membranes 602 and 632 diverge in the zone 704 resulting in a potential energy stop at a first limit of the translation range 668 (FIG. 6C in 660). At displacement 712 the net non-zero force 710 manifests on the opposing buckled membranes as indicated by an arrow 713 which provides a restorative force tending to return the opposing buckled membranes to the operating zone 702.

A second zone where the net force between the opposing buckled membranes is non-zero is indicated at 708, which is to the right of the operating zone 702. In the zone 708, the first buckled membrane 602 exerts a force on the second buckled membrane 632 which is larger than the opposing force exerted by the second buckled membrane 632 (e.g., 716 on the curve 606), thereby causing the opposing buckled membranes to move to the left for displacement positions in the zone 708, such as 714. At displacement 714, the net non-zero force exerted on the opposing buckled membranes is the difference between the curve 606 and the curve 636, which is indicated at 720. The force/displacement characteristics 606 and 636 for the buckled membranes 602 and 632 diverge in the zone 708 resulting in a second potential energy stop at a second limit of the translation range 668 (FIG. 6C in 660). At displacement 714 the net non-zero force 720 manifests on the opposing buckled membranes as indicated by an arrow 722 which provides a restorative force tending to return the opposing buckled membranes to the operating zone 702. Thus, a potential energy well is created with two opposing buckled membranes with force-displacement characteristics that have been aligned.

The dynamic response to motion, described directly above, the case where a zero-stiffness zone is created in a RSM can be referred to as a potential energy well. At one end of the translation range, along the buckling directions or axes 668, a first potential energy stop exists within the zone at 704. A second potential energy stop exists at the other end of the translation range within the zone 708. In the zero-stiffness zone 702, applied force results in kinetic energy or motion and flexing of the buckled membranes along 668. The motion of the buckled membranes along 668 (in the operating zone 702) results in a decrease in potential energy of one membrane with a corresponding simultaneous increase in potential energy of the other membrane while the contact area of the membranes translates along the buckling directions or axes 668. Outside of the operating zone 702, the potential energy of one buckled membrane is larger than the potential energy of the other buckle membrane. This condition results in a potential energy stop as previously described.

Figure 7B:
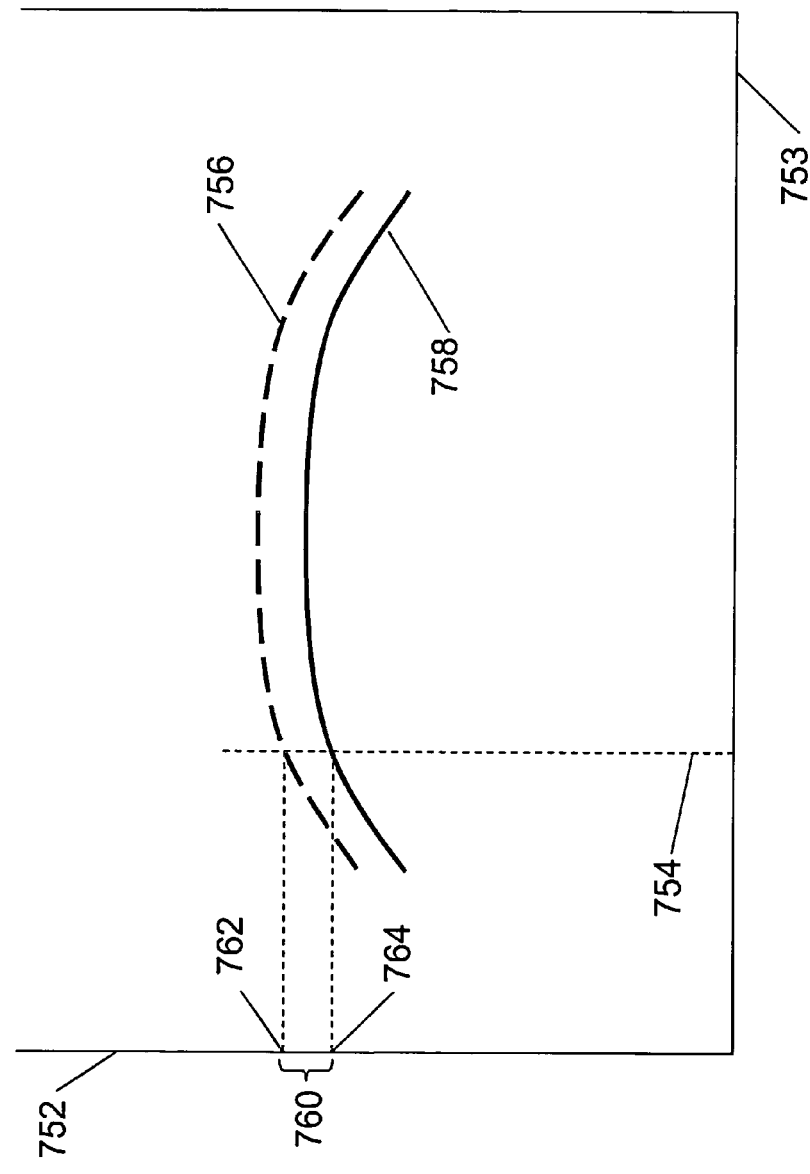
FIG. 7B illustrates another operating zone of a reduced stiffness elastic micro-mechanical structure, according to embodiments of the invention.

The alignment illustrated in FIG. 7A illustrates a method to achieve a zero-stiffness elastic micro-mechanical structure (RSM). Variations from zero are obtained in different ways, according to different embodiments. In one method, the membranes do not have identical force-displacement characteristics. This is accomplished by making one membrane stiffer than the other. Membrane stiffness is related to membrane thickness, as well as to membrane composition, such as membrane area, material properties, etc. Therefore, in order to create membranes with different force-displacement characteristics, the membranes are intentionally made to be non-identical to each other. One example of non-identical force-displacement characteristics is illustrated in FIG. 7B.

FIG. 7B illustrates, generally at 750, another operating zone of a reduced stiffness microstructure, according to embodiments of the invention. With reference to FIG. 7B, a single operating zone is illustrated for a RSM. A force-displacement curve 756 results from a first buckled membrane. A second buckled membrane has a force-displacement curve represented by 758. Force is plotted on an axis 752 and displacement of the contact area is plotted on an axis 753. Both buckled membranes are in contact with each other and a state of preload exists between the two buckled membranes, which causes the membranes' force-displacement characteristics 756 and 758 to become aligned. However, in the present case, there is always a non-zero force existing between the buckled membranes. The magnitude of the force is represented by the difference between force-displacement characteristics 756 and 758. For example, at a displacement indicated at 754 the non-zero force is indicated at 760. Note that the magnitude of 760 is smaller than either 762 or 764. Thus, a reduced stiffness microstructure results from the two opposing buckled membranes with non-identical mechanical properties.

In one or more embodiments, when the magnitude of 760 is constant across the range of displacement a constant force micro-spring results. Most linear springs are described by the relationship F=kx, where F is the force, k is the spring constant, and x is the displacement. Such a spring develops a force that is proportional to the displacement, which means that as the displacement increases the force increases and vice versa. The spring represented in FIG. 7B is described by the relationship F=c. Where F is the force and c is a constant related to the buckled stiffness of the pair of buckled membranes.

Figure 8:
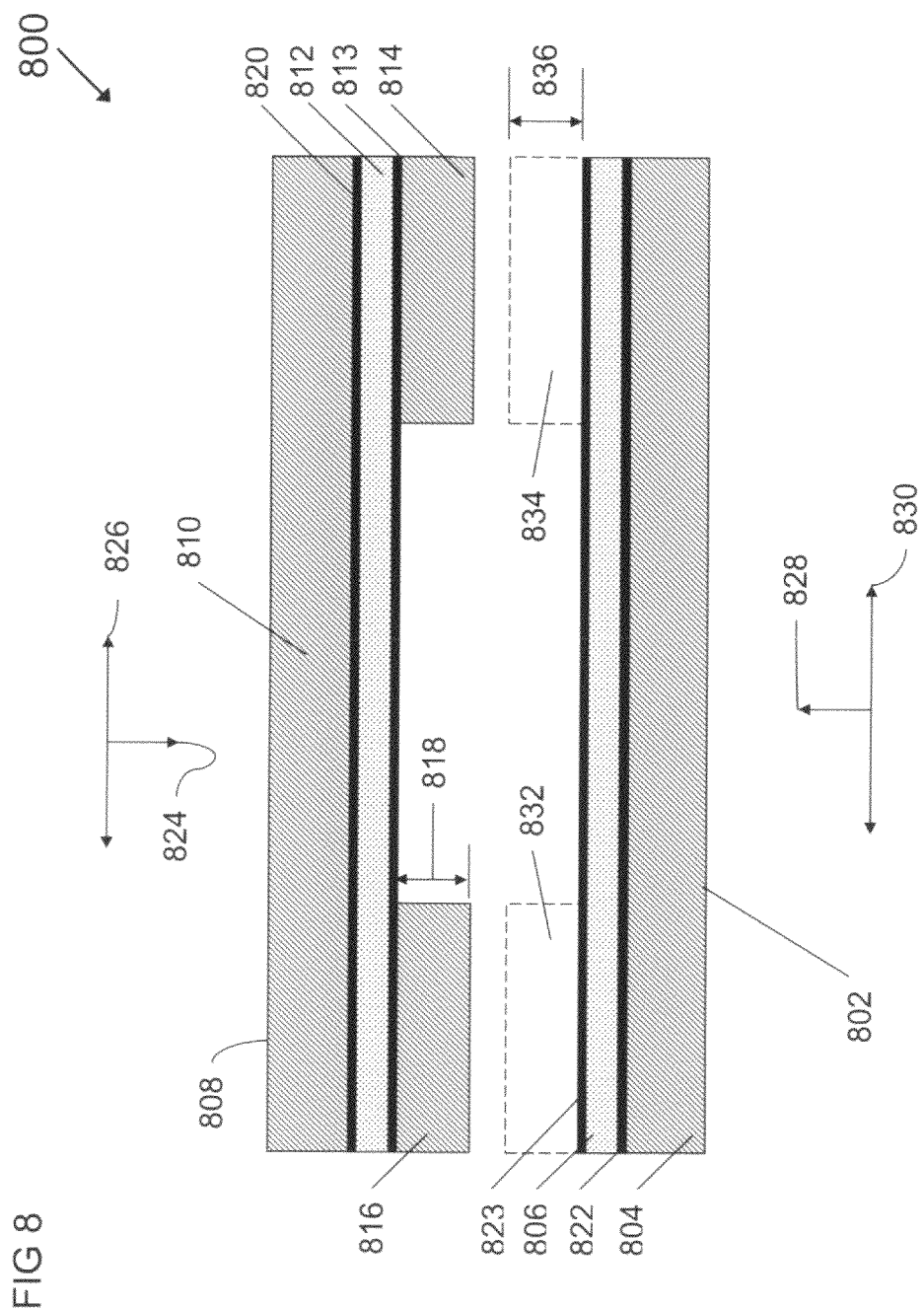
FIG. 8 illustrates locating two substrates, according to embodiments of the invention.

FIG. 8 illustrates, generally at 800, locating two substrates, according to embodiments of the invention. With reference to FIG. 8, in one embodiment, the opposing buckled membranes previously discussed are constructed on separate substrates and then the substrates are located via micromanipulation before joining the substrates together. Buckled membranes can be released from their respective substrates either before joining the substrates together or after the substrates are joined together via the methods previously described or by methods as of yet unknown. Embodiments of the invention are not limited by the way in which a buckled membrane is released from the substrate.

In one embodiment, a first multilayered microstructure 802 has a substrate indicated at 804 and a multi-layered buckling layer indicated by layers 822, 806, and 823. In one embodiment, 822 is a layer of silicon dioxide followed by a conductive layer, 806 is a layer of transduction material, and 804 is mono-silicon. The transduction layer 806 is followed by a second conductive layer 823. A second multilayered microstructure 808 has a substrate indicated at 810 and a multilayered buckling layer 820, 812, and 813. In one embodiment, 810 is a mono-silicon layer, 820 is a layer of silicon dioxide followed by an optional conductive layer and an optional layer of transduction material 812. The optional transduction layer 812 is followed by an optional second conductive layer 813. In one embodiment, spacers 814 and 816 are made from poly-silicon and are deposited on 813. A thickness 818 of the spacers is selected to provide the proper initial displacement of the buckled membranes following release of the membranes from their substrates. In the examples given in conjunction with FIGS. 6A, 6B, 6C, and FIG. 7A, the desired initial displacement of the opposing buckled membranes is indicated as 616 and 646 (616 is equal to 646 in the example of FIGS. 6A and 6B). Therefore, the thickness 818 of the spacer 814 and 816 is two times the displacement 616. Alternatively, the thickness of the spacers 816/814 can be selected to provide a different force-displacement characteristic for the opposing coupled buckled membranes according to the teaching presented herein.

To provide the desired distance between buckled membranes, the spacers 816 and 814 can be chemically mechanically polished to planarize the deposited surface. Alternatively, optional spacers 832 and 834 can be deposited onto the layer 806. In such a case, the thickness 818 of the spacer 816 and 814 combined with the thickness 836, of the spacers 832 and 834, to equal two times the displacement 616 (which is also equivalent to the displacement 646 or 662). For example, the thickness 818=836=616. Alternatively, when two spacers are used, the desired separation between the top surfaces of the opposing buckling layers can be apportioned between the two spacers by any fractional distribution.

The substrate 808 and the substrate 802 are located relative to one another by micromanipulation, indicated by arrows 826 and 830 and then the substrates are brought into contact with one another as indicated with arrows 824 and 828. The substrates are joined together by various means such as direct bonding, Plasma Activated bonding, Eutectic bonding, etc. Those of skill in the art will recognize other bonding methods that are suitable for this use. The bonding methods listed herein are given by way of example and do not limit embodiments of the invention.

Figure 9:
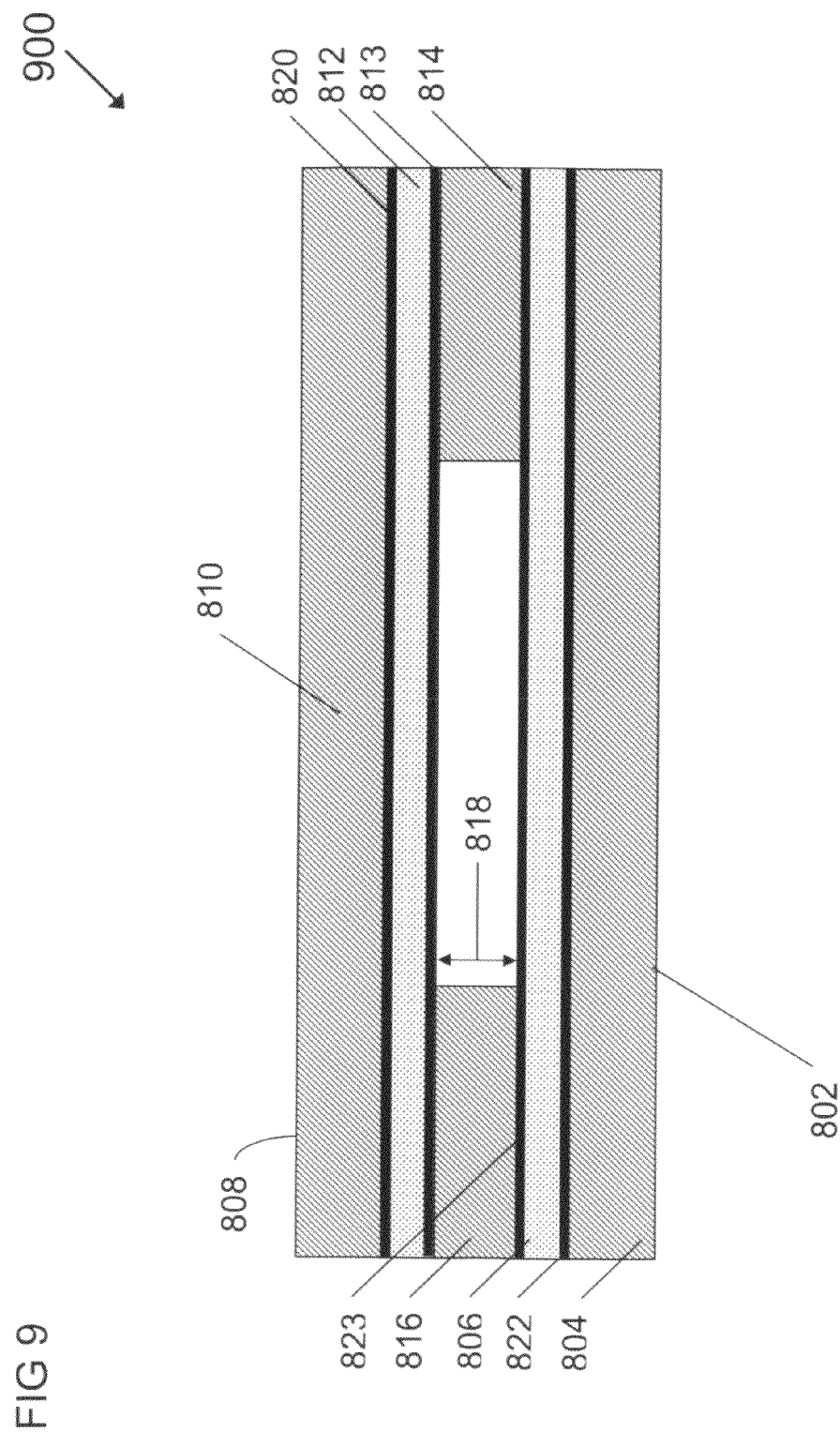
FIG. 9 illustrates bonding two substrates together, according to embodiments of the invention.

FIG. 9 illustrates, generally at 900, bonding two substrates together, according to embodiments of the invention. With reference to FIG. 9, the two substrates described in FIG. 8 are shown bonded together in 900. Note that in FIG. 9, the membranes have not yet been released from the substrates. Following bonding of the substrates, buckled membranes are released from the substrate 808 and 802. In one embodiment, the outer surface of 808 and 802 are patterned and etched to remove substrate 804 and 810 from the region between the spacers. The resulting microstructure is shown in FIG. 10A.

FIG. 10A illustrates the state of the buckled membranes after the membranes have been release from the substrates. Alternatively, in some embodiments, the membranes are released before the substrates are joined together. In such a case the membranes are released before the substrates are joined together and care is taken to align buckled membranes from one substrate with buckled membranes from the other substrate. Membranes are released following any of the methods known to those of skill in the art. The example given above is for the purpose of illustration and does not limit embodiments of the invention in any way.

FIG. 10A illustrates, generally at 1000, a pair of coupled buckled membranes, according to embodiments of the invention. With reference to FIG. 10A, a multi-layered microstructure 1002 has a substrate 1004 and a first multi-layered buckling layer, which includes a sub-layer 1022, a sub-layer 1006, and a sub-layer 1021. A first buckled membrane 1028 has been released by removal of the substrate 1024a over an area 1023.

A multi-layered microstructure 1008 has a substrate 1010 and a second multi-layered buckling layer, which includes a sub-layer 1012, a sub-layer 1019, and a sub-layer 1020. A second buckled membrane 1026 has been released by removal of the substrate 1024b over an area 1023. Removal of substrate 1024a and 1024b cause the first buckled membrane 1028 to contact the second buckled membrane 1026 over a contact area 1030.

A thickness 1034 of spacers 1014 and 1016 has been designed to provide the desired force-displacement characteristic for the reduced stiffness microstructure (RSM). Spacers 1014 and 1016 can be sized to provide an open area (void) between the buckled membranes that is not the same size as the area indicated at 1023. Such variation is indicated by dashed lines 1031 and 1032.

In one or more embodiments, the RSM of FIG. 10A has been designed according to the descriptions presented in support of the previous figures to produce a zero-stiffness RSM or a reduced stiffness RSM. In one or more embodiments, the RSM of FIG. 10A is incorporated into a T-MEMS thereby providing buckled membranes that have a transduction layer or region with appropriate electrical contacts, from which electrical energy is harvested. In various embodiments, a transductive layer(s) or region(s) can be present in one or both of the membranes. As described above in conjunction with the preceding figures, vibration from a variety of sources will flex the buckled membranes within the T-MEMS of FIG. 10A. A sprung mass 1036 will enhance the flexing of the buckled membranes. The buckled membranes flex within a potential energy well created by the RSM structure. The RSM structure overcomes the initial stiffness of the spring/transduction material making it possible to cause the transduction material to flex for much lower levels of applied vibration or by using a smaller mass for the same level of applied vibration.

As a point of comparison with the single buckled membrane of FIG. 2C, 2000 μN of force is needed to move the single buckled membrane from its rest position to approximately 9 μm displacement indicated at 246. In one embodiment, if the difference in stiffness between the two buckled membranes used in FIG. 10A is kept to 5% and the buckled membranes have the same nominal stiffness/displacement characteristic as that shown in FIG. 2C, then the stiffness of the dual buckled membrane RSM of FIG. 10A is only 5% as great as the stiffness of the single buckled membrane shown in FIG. 2C. This means that it would only take 100 μN of force to produce an equivalent acceleration of the dual buckled membrane RSM. Thus, a sprung mass only 1/20 as large (0.01 gm) as the mass used in the example of FIG. 2C (0.2 gm) above can be used to produce the same acceleration while straining twice as much transduction material (this result is obtained when two similar membranes are being flexed simultaneously). Note that more than twice as much transduction material can be flexed with a RSM structure as taught herein. A RSM structure can be designed to compensate and effectively zero out the mechanical stiffness of the membranes. Thereby permitting a large amount transductive material to undergo flexing and subsequent contribution to energy harvesting.

The buckled membranes used in the RSM of FIG. 10A can be made with transduction layers (regions) that have been poled in either $d_{31}$ or $d_{33}$ orientation. Note also that a pair of buckled membranes used in a RSM can be oppositely poled (for given poling direction) to cause the contributions from each membrane to add in series. For example, if two $d_{33}$ poled transduction microstructures are mated together to form a RSM a first microstructure is poled such that the first conductor 512a (FIG. 5A) is at "+" polarity and the mating microstructure is then poled so that the first conductor 512a (FIG. 5A) would be at "−" polarity.

Figure 10B:
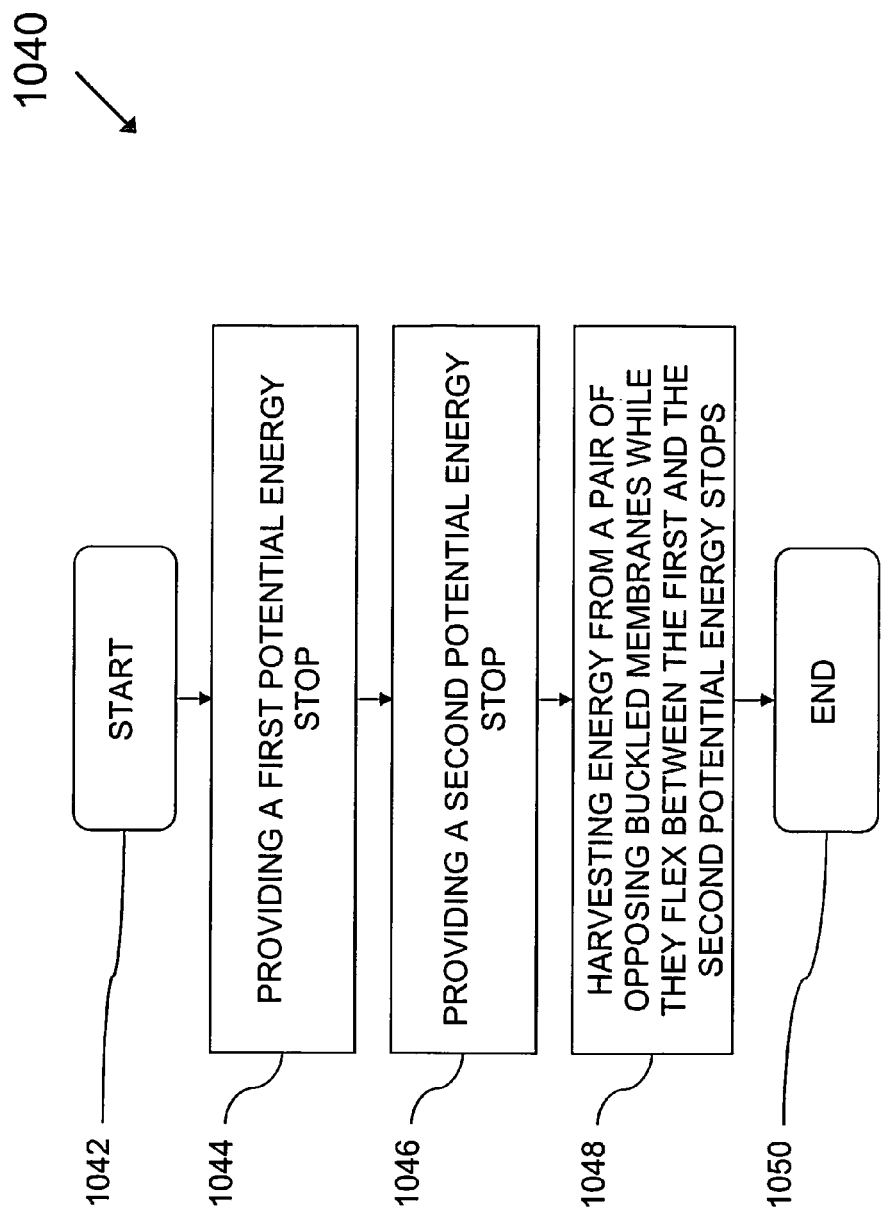
FIG. 10B illustrates a method for harvesting energy from buckled membranes according to one embodiment of the invention.

FIG. 10B illustrates, generally at 1040, a method for harvesting energy from buckled membranes according to one embodiment of the invention. With reference to FIG. 10B, a method starts at a block 1042. At a block 1044 a first potential energy stop is provided. At a block 1046 a second potential energy stop is provided. Energy is harvested at a block 1048 as a pair of buckled membranes flexes between the first potential energy stop and the second potential energy stop. The method ends at a block 1050.

FIG. 10C illustrates, generally at 1060, charging a battery with energy harvested from buckled membranes according to one embodiment of the invention. With reference to FIG. 10C, a T-MEMS structure is shown at 1000. The T-MEMS structure 1000 is connected an interface circuit 1064 by electrical connection 1062. Electrical connections 1062 are connected to a first conductor and a second conductor associated with the transduction material of the T-MEMS 1000 as described above in conjunction with the preceding figures. The interface circuit 1064 is electrically connected at 1066 to a rechargeable power source 1068. The rechargeable power source 1068 can be a battery, a capacitor, or another structure configured to store electrical energy. In various embodiments, the rechargeable power source 1068 can be a rechargeable battery made with various chemistry such as Lithium Ion, Lithium Polymer, Lithium Iron Phosphate, etc. or with battery chemistry that has not yet been invented. Embodiments of the invention are not limited by the type of battery chemistry employed for the rechargeable power source 1068.

The interface circuit 1064 has electrical parameters, such as load resistance, etc. that are selected to optimize the amount of electrical power that is transferred from T-MEMS 1000 to the rechargeable power source 1068. The interface circuit 1064 can be configured to control the charging of the rechargeable electrical power source 1068. Rechargeable batteries typically have minimum and maximum voltage thresholds that the charging must occur within, thus the interface circuit 1064 can be configured to perform the charge controller function as well.

In various embodiments, a plurality of T-MEMS devices are used in place of the T-MEMS 1000 shown in FIG. 10C. A plurality of T-MEMS devices can be configured both in a single plane and in multiple planes. In one or more embodiments, T-MEMS devices are configured in mutually orthogonal planes, in other embodiments, T-MEMS devices are configured in planes that make an angle less than ninety degrees with one another. By configuring T-MEMS devices in different planes the energy harvesting device can respond to vibrations independent from the orientation of the energy harvesting device to the vibration excitation field.

Figure 10D:
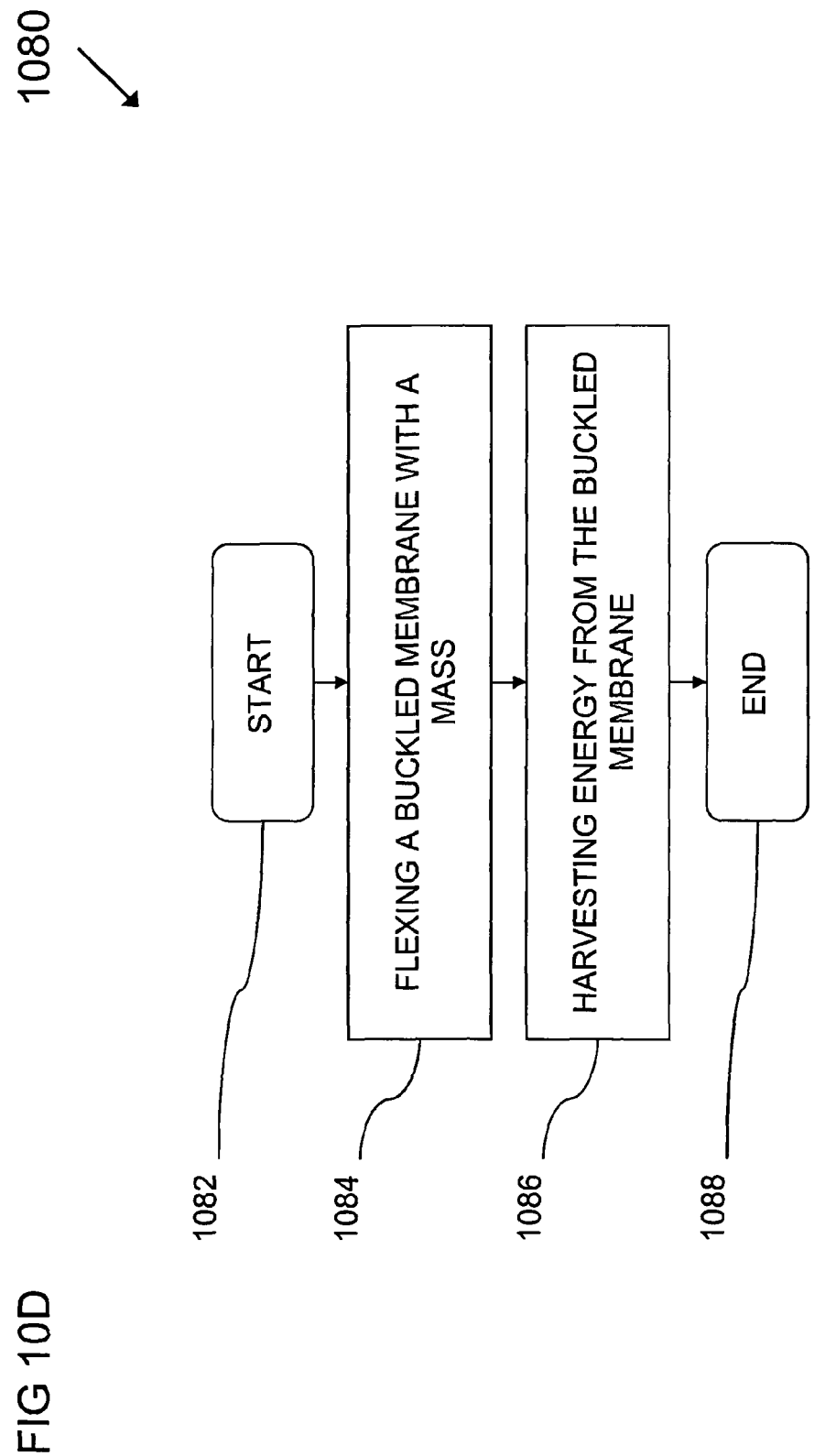
FIG. 10D illustrates a method for harvesting energy from a buckled membrane according to one embodiment of the invention

FIG. 10D illustrates, generally at 1080, a method for harvesting energy from a buckled membrane according to one embodiment of the invention. With reference to FIG. 10D, a method starts at a block 1082. At a block 1084 a buckled membrane is flexed with an attached mass. At a block 1086 energy is harvested from the buckled membrane. The method stops at a block 1088. One or more T-MEMS are used in the block 1084. The T-MEMS used in the block 1084 can be configured with single buckled membranes, dual buckled membranes configured as RSM or a plurality of single buckled membranes or a plurality of dual buckled membranes configured as RSM devices. In various embodiments, the energy harvesting at 1086 can be implemented with an interface circuit as shown in FIG. 10C.

Figure 11:
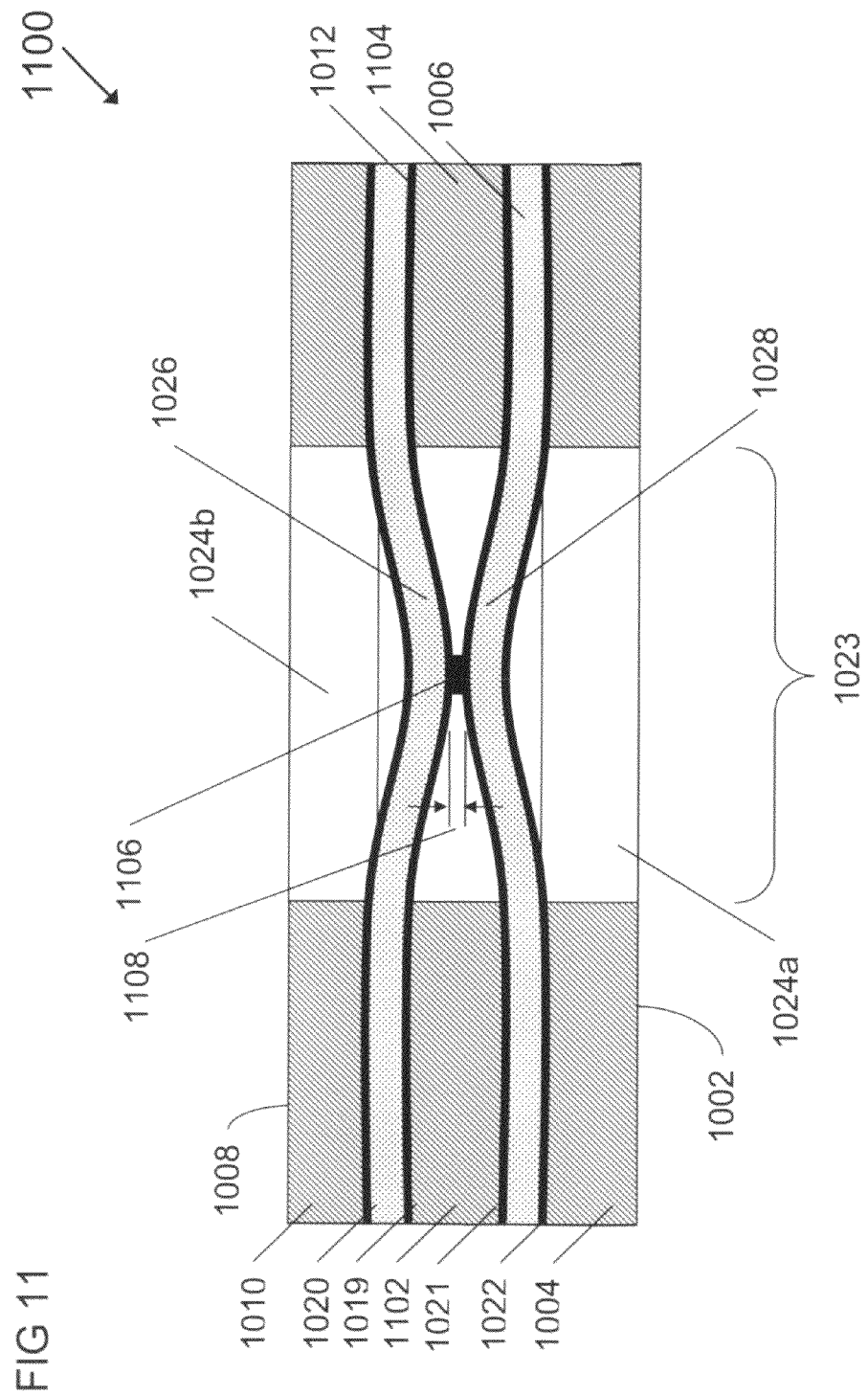
FIG. 11 illustrates a mass captured between a pair of coupled buckled membranes, according to embodiments of the invention.

FIG. 11 illustrates, generally at 1100, a mass (or spacer) located between a pair of coupled buckled membranes, according to embodiments of the invention. With reference to FIG. 11, a mass 1106 is deposited on one of the buckling layers (1028 or 1026) before the substrates are aligned and bonded together, such as in the state of assembly shown in FIG. 8. The thickness of the spacers 1102 and 1104 is sized to accommodate the added thickness of the mass 1106, consistent with the desired elastic response of the RSM. For example, if a mass 1106 were added to the RSM of FIG. 10A, an added thickness 1108 is added to the thickness 1034 of the spacers 1014 and 1016 in order to preserve the elastic response of the RSM.

Figure 12A:
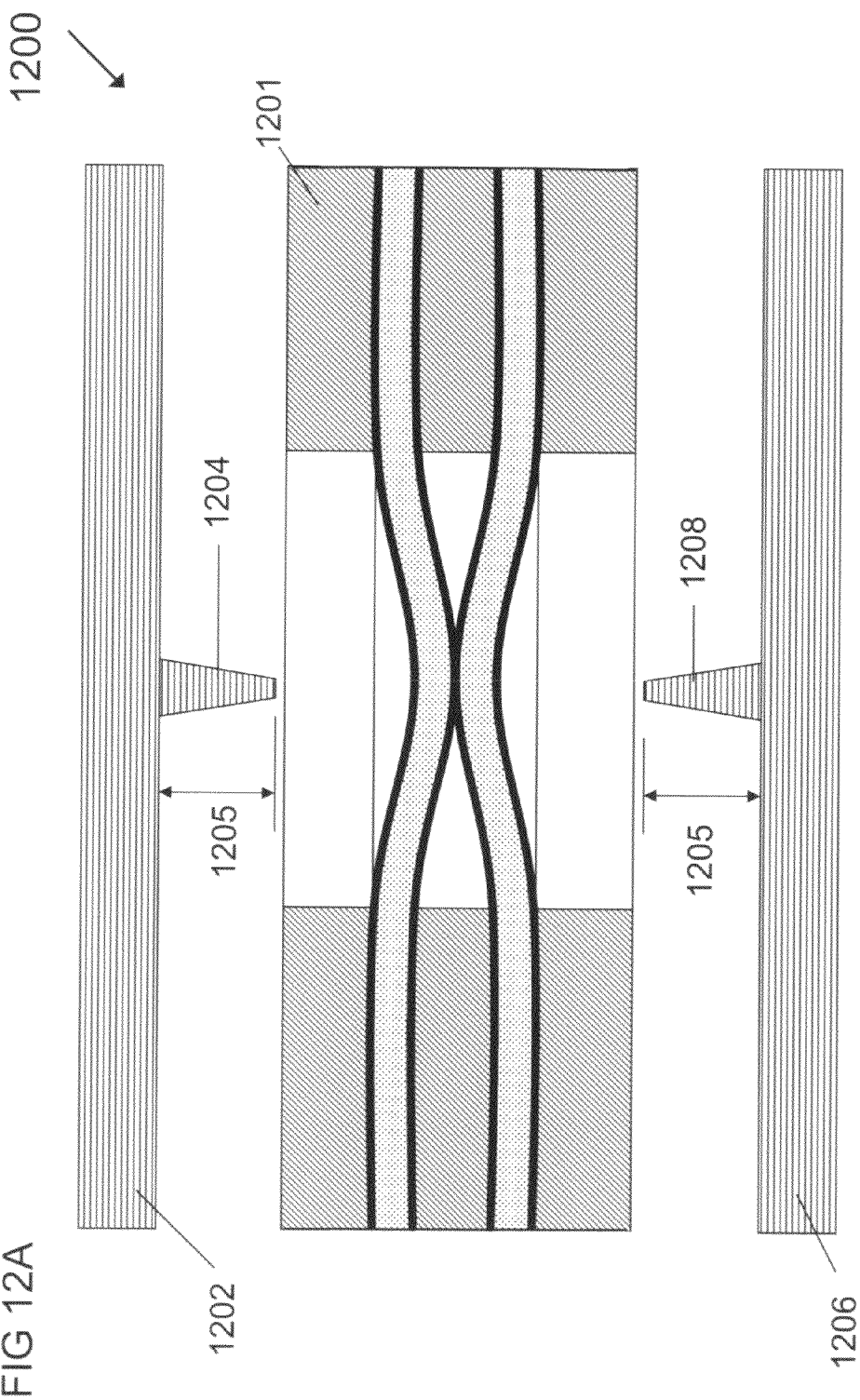
FIG. 12A illustrates stops used with a pair of coupled buckled membranes in an exploded view, according to embodiments of the invention.
Figure 12B:
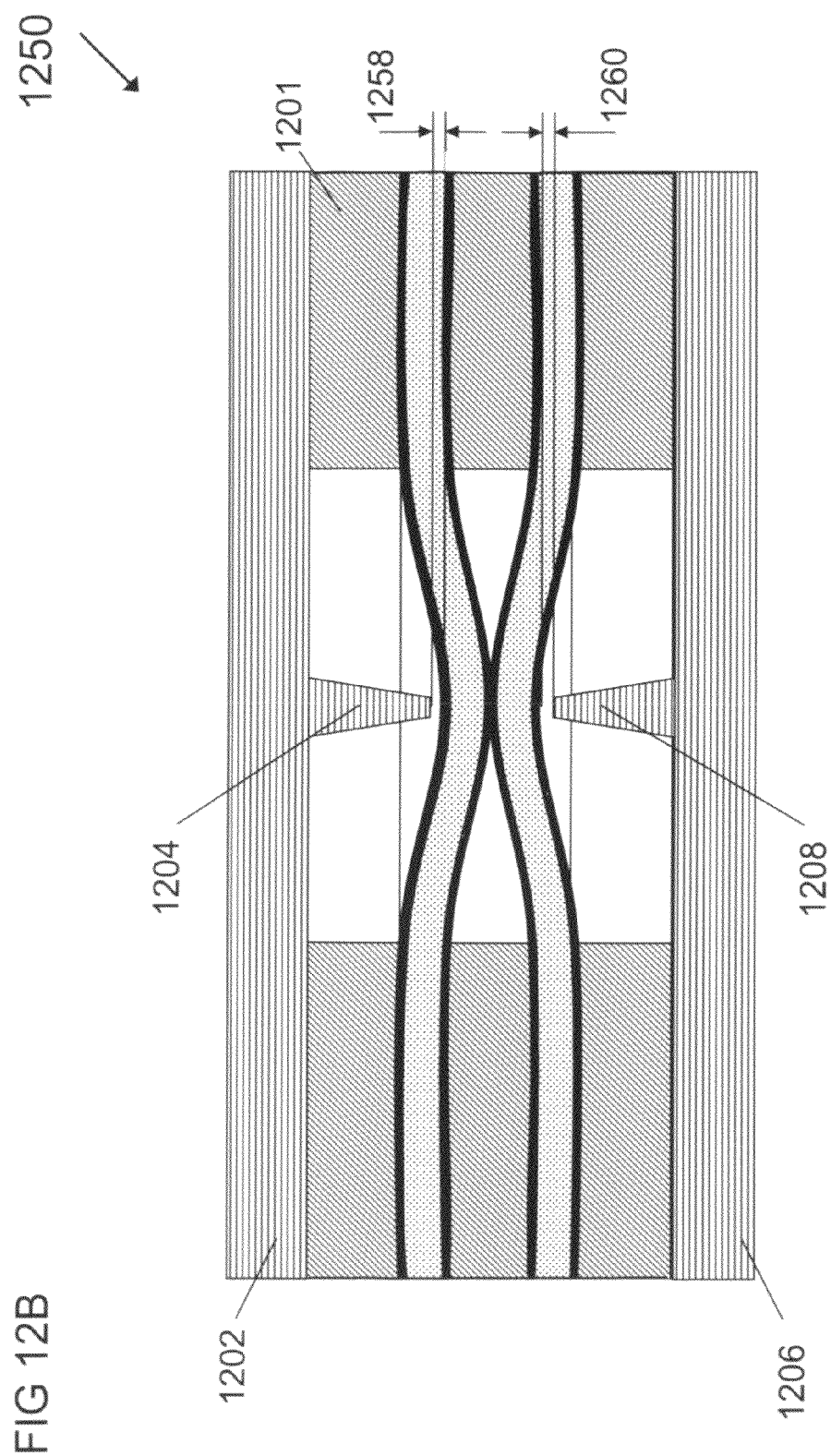
FIG. 12B illustrates stops used with a pair of coupled buckled membranes, according to embodiments of the invention.

The potential energy well described above in conjunction with a RSM that has a zero-stiffness zone provides potential energy boundaries which serve to limit the displacement of a pair of opposing coupled buckled membranes. If excitation energy is sufficiently high, the pair of coupled buckled membranes can travel outside of the potential energy well boundaries and "pop through" to one side or the other. Popping through can be prevented with mechanical stops. FIG. 12A and FIG. 12B illustrate mechanical stops used with a pair of coupled buckled membranes, according to embodiments of the invention.

With reference to FIG. 12A, a RSM is shown at 1201. In one embodiment, 1201 is the RSM 1000 from FIG. 10A. An upper layer 1202 has been micro machined to produce a stop 1204 which has a height or thickness 1205. A lower layer 1206 has been micro machined to produce a stop 1208, which has a height 1205.

In FIG. 12B at 1250 the upper layer 1202 and the lower layer 1206 have been bonded to the RSM 1201. The upper layer 1202 and the lower layer 1206 are positioned through micromanipulation to place the stops at a desired location. Desired locations can be any position behind the buckled membrane. For example, the stop 1204 or stops 1204/1208 can be centered on the buckled membrane's area, off to one side, etc. The stop can be arrayed as a single stop (as shown in FIG. 12A and FIG. 12B) or the stop 1204 can be a plurality of stops.

The stops 1204 and 1208 limit the travel of the coupled buckled membranes to the distance shown at 1258 and 1260. A measurement of the force-displacement characteristic of a buckled membrane will provide the information needed to determine the distance represented by 1258 and 1260. Referring to FIG. 7A, one design point can be to set 1258 equal to one half of the width of the operating zone 702. Another design point can be wider, which can include a portion of zone 704 and 708, keeping in mind the desire to prevent pop through. Alternatively, the stops can be located to allow pop through.

A sprung mass can be added to the buckled membranes of FIG. 12A and FIG. 12B to enhance flexing of the buckled membranes and therefore the production of energy for harvesting when configured as a T-MEMS.

Alternatively, in one or more embodiments, the T-MEMS shown in the figures above can be configured with an activation circuit. In some embodiments the membranes are electrically independent from each other can be configured for individual control. In such a case, the activation circuit causes one membrane to become strained which will thereby cause the first cycle of vibration to occur. Once placed in motion, due to the zero stiffness or near zero stiffness of the RSM structure, several cycles of vibration will occur; energy is harvested during these vibration cycles. The activation circuit is configured to provide subsequent activation of one or the other of the membranes in order to overcome internal friction if necessary.

FIG. 13A illustrates energy harvesting from a pair of coupled buckled membranes. With reference to FIG. 13A, 1300 illustrates load deflection curves and displaced shape for a pair of buckled membranes. A first buckled membrane 1318a is illustrated in contact with a second buckled membrane 1320a, both of which are in contact at a point "C," labeled as 1324.

A series of force displacement plots for these buckled membranes is shown at 1302, 1304, 1306, where the magnitude of the force required to displace the first buckled membrane 1318a in the negative direction (to the left) is indicated by the vertical axis at 1306. The force required to displace the second buckled membrane 1320a in the positive direction (to the right) is indicated by the vertical axis at 1302, displacement along the buckling axes is indicated along a horizontal axis at 1304.

In one embodiment, the second buckled membrane 1320a contains a transductive layer with first and second electrodes. The first buckled membrane 1318a does not contain a transductive layer; however in other embodiments the first buckled membrane 1318a does contain a transductive layer. The force displacement curve 1308 corresponds to the second buckled membrane 1320a when the transductive layer is in an "open" state, i.e., not connected to an energy harvesting circuit or other load that would allow the electrical charge to dissipate. The force displacement curve 1312 corresponds to the first buckled membrane 1318a. Note that by design of the microstructure, the peak value of force on curve 1308 is greater than the peak value of the force on curve 1312. As is known to those of skill in the art, when a transduction layer is connected to a circuit such that electrical charge can flow from the transduction layer, the stiffness of the transduction layer is reduced. This reduction in stiffness results in a reduction of the force needed to produce a given displacement of the second buckled membrane 1320a. Thus, in the figures of 1330, a force displacement curve 1332 corresponds to the "shorted" condition for the transduction layer of the second buckled membrane 1320a. The magnitude of the force on curve 1332 is lower than the magnitude of the force on curve 1308 (1300). The design condition illustrated in FIG. 13A between the first and the second buckled membranes is 1308 (open)>1312>1332 (shorted) within an operating range of the microstructure, such as the operating range 1362 shown in 1360.

In one embodiment, the buckled membranes 1318a and 1320a are used together with a control circuit to harvest energy. Description of an energy harvesting/control circuit is given below in conjunction with FIG. 14. Both buckled membranes are in a rest position as indicated at position "C" labeled as 1324 in 1300. The transductive layer of the second buckled membrane 1320a is in a state of compression while at rest. An electrical potential is applied to the transductive layer of the second buckled membrane 1320a by a control circuit, which causes the state of compression within the second buckled membrane 1320a to diminish, thereby resulting in a displacement of the membranes to the right coming to rest at a position "A" indicated at 1326 and "A" at 1316 at 1300. Note, that in the embodiment described herein, one of skill in the art will recognize that the electrical potential applied by the control circuit is causing the second buckled membrane 1320a to contract. The displaced shapes of the buckled membranes are indicated by the dashed lines 1318b and 1320b.

The electrical potential is removed from the second buckled membrane causing the buckled membranes to flex back to the position indicated by "C" at 1314 and 1324 within 1330.

The charge harvesting circuit is engaged which permits electrical energy to be harvested from the transduction layer of the second buckled membrane 1320a/1320b. The stiffness of the second buckled membrane 1320a/1320b drops when the harvesting circuit is engaged, thus the force displacement profile of the second buckled membrane 1320a/1320b drops to 1332 essentially moving the state of force between the two buckled membranes from point "C" indicated at 1314 in 1330 to point "D" indicated at 1334 in 1330. This condition presents an unbalanced force relationship since force exerted by the first buckled membrane 1318a/1318b (rightward acting force) is greater than the force exerted by the second buckled membrane 1320a/1320b (leftward acting force), thus motion to the right results. Charge is harvested during the resulting motion of the buckled membranes from "D" to "E" in 1330.

With reference to 1360, in one embodiment, an operating zone for the buckled membranes is indicated by 1362. The contact point between the two buckled membranes moves along the buckling axes within the operating zone. Those of skill in the art will recognize that the physical properties of the buckled membranes and the steps described that harvest energy can be changed and/or adapted from those shown and described with the diagrams herein. However, such changes and or adaptations are within the scope of the teaching presented herein which uses the variable stiffness of the buckled membrane to facilitate energy harvesting therefrom.

Figure 13B:
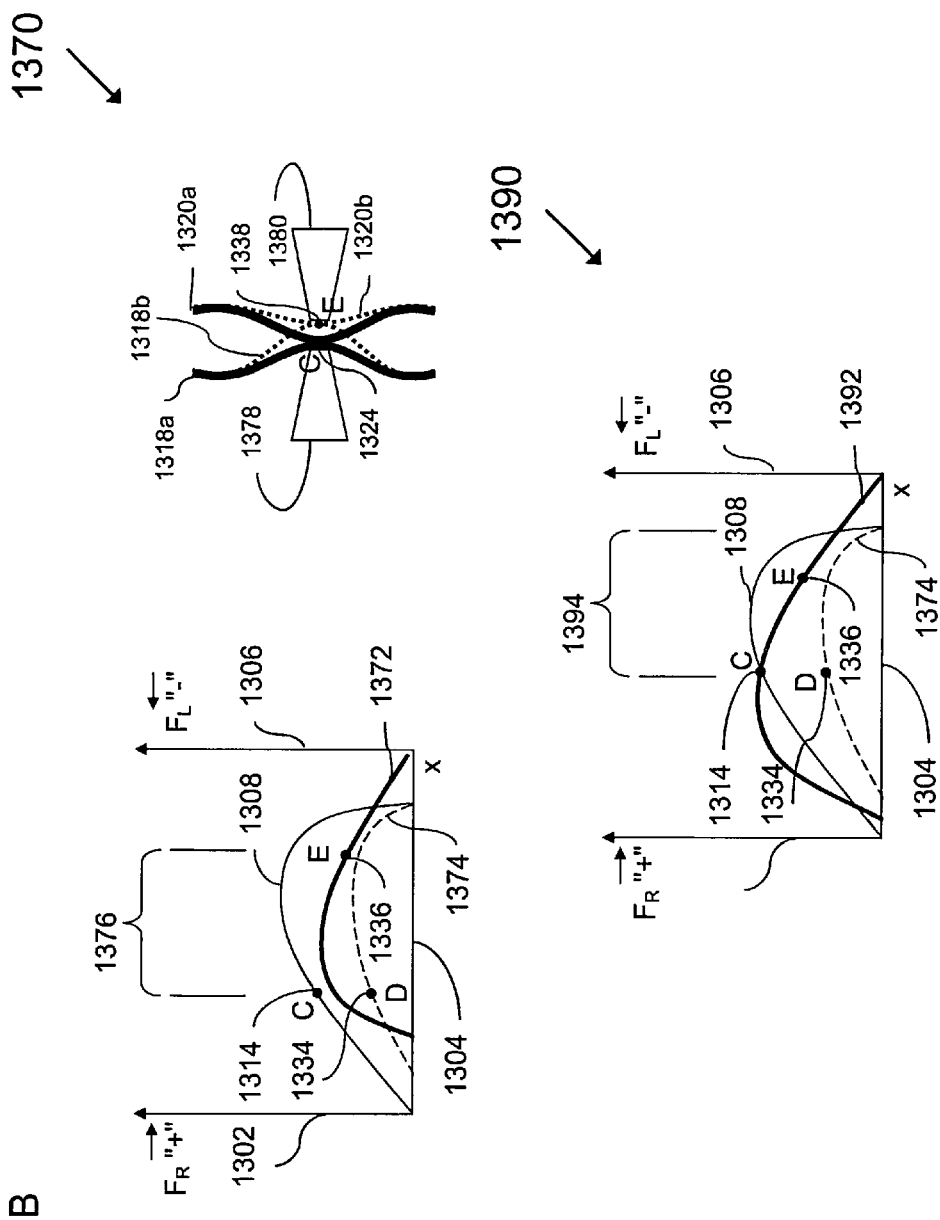
FIG. 13B illustrates energy harvesting from a pair of coupled buckled membranes, according to additional embodiments of the invention.

FIG. 13B illustrates energy harvesting from a pair of coupled buckled membranes, according to additional embodiments of the invention. With reference to FIG. 13B, 1370 illustrates load deflection curves and displaced shape for a pair of buckled membranes. In the embodiments represented in FIG. 13B the load deflection curve 1308 (associated with the second membrane 1320a/1320b) and a load deflection curve 1374 (associated with the first membrane 1318a/1318b) do not intersect at point C (1314).

Translation of the contact area of the pair of buckled membranes is constrained to an operating range 1376 by a stop 1378 and a stop 1380. Stops, such as 1378/1380 can also be used with the buckled membranes described above in FIG. 13A. Similarly, buckled membranes having different load deflection curves, such as for example 1372, 1374 can be used to harvest energy.

Another embodiment of load deflection curves for a pair of buckled membranes is illustrated by 1390. In 1390, a first buckled membrane such as 1318a/1318b has a load deflection curve represented by 1392. Load deflection curve 1392 exceeds load deflection curve 1308 over a portion of the x axis 1304 displacement range. In one embodiment, an operating range of the resulting coupled buckled membrane structure is indicated at 1394.

The places of intersection between the load deflection curves 1392 and 1308, such as point C (1314) in 1390, can serve as "stops" for the translation of the contact area of the coupled buckled membranes. Such locations of crossing e.g., point C (1314) 1390 are characterized by forces of opposite sign. To the left of point C (1314) 1390 the first buckled membrane 1318a/1318b exerts the greater force acting to the right. To the right of point C (1314) 1390 the second buckled membrane exerts the greater force acting to the left. The translational motion of the coupled buckled membranes can be halted by such an arrangement of load deflection curves, thereby eliminating the need for a stop such as the stop shown in 1370.

Thus, a variety of different load deflection curves associated with buckled membranes can be used within the teachings of the embodiments of the invention to harvest energy. The load deflection curves provided herein are merely illustrations of examples and do not limit the embodiments of the invention.

Figure 14:
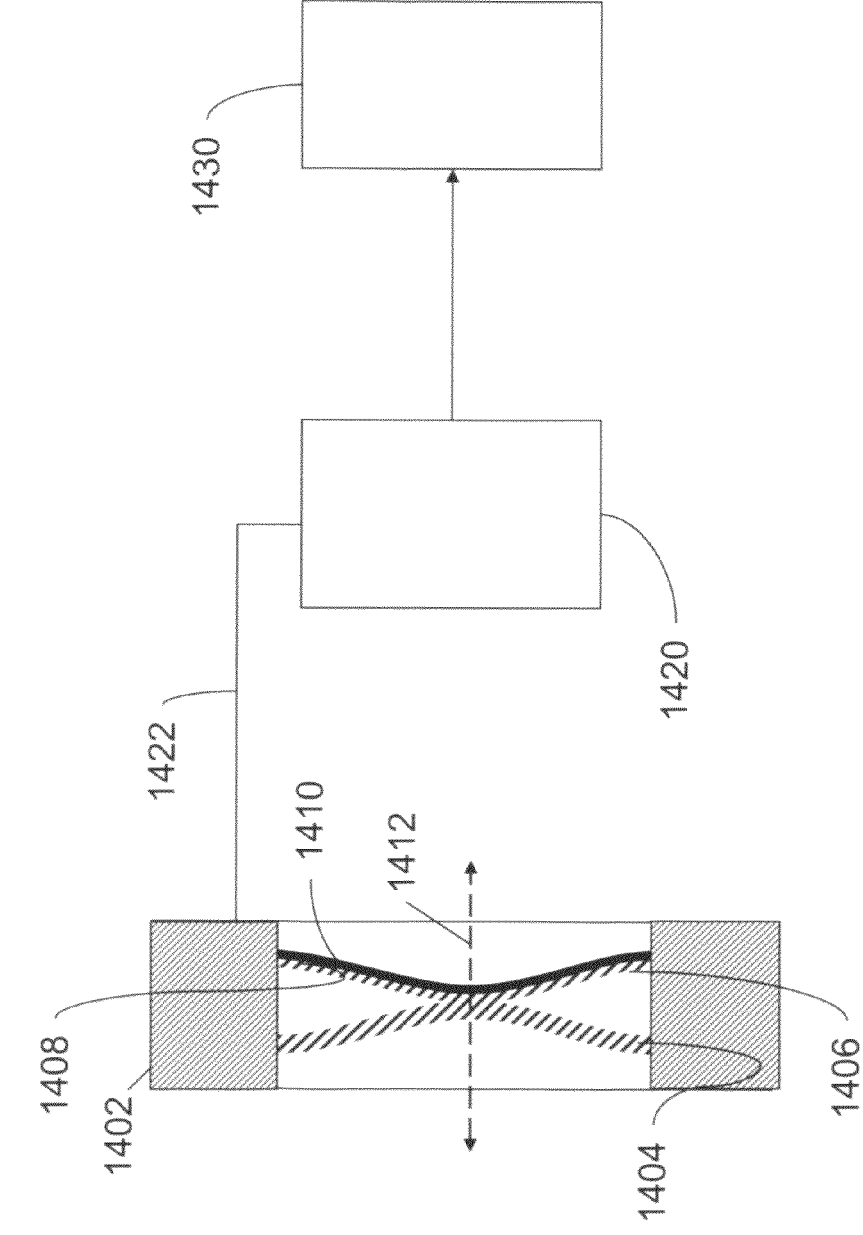
FIG. 14 illustrates a system for harvesting energy, which includes an activation/control circuit.

FIG. 14 illustrates, generally at 1400, a system for harvesting energy, which includes an activation/control circuit. With reference to FIG. 14, a microstructure that contains a pair of buckled membranes is indicated at 1402. A first buckled membrane 1404 and a second buckled membrane 1406 are in contact with each other and the mutual contact area flexes along buckling axes 1412. In one embodiment, the second buckled membrane 1406 includes a transductive layer with inner and out electrodes and is indicated at 1410. Other layers of the second buckled membrane are indicated at 1408.

A harvesting/control circuit 1420 is electrically connected to conductors associated with the transduction layer 1410. In various embodiments, the harvesting/control circuit 1420 is used to both energize the transduction layer and to collect electrical energy from the transduction layer of a buckled membrane such as the second buckled membrane 1406. Energy collected with the harvesting circuit is indicated at 1430. In some embodiments, the harvesting/control circuit 1420 is configured to harvest energy. In other embodiments, the harvesting/control circuit 1420 is configured to both control various aspects of the buckled membrane and to harvest energy.

FIG. 15 illustrates, generally at 1500, a method for harvesting energy with buckled membranes. With reference to FIG. 15, a process starts at a block 1502. At a block 1504 a transduction layer within a buckled membrane is charged while buckled membrane flexes. At a block 1506 energy is harvested from the buckled membrane. At a block 1508 the process ends.

The T-MEMS device is also configured with an appropriate circuit in order to maximize energy transfer to a storage device such as a rechargeable battery, one example of this was illustrates above in FIG. 10C. In other embodiments, the appropriate circuits can be included on the substrate used for the T-MEMS.

Thus, in various embodiments, T-MEMS devices provide structures that harvest energy that would otherwise be wasted. T-MEMS devices can be used to power a wide range of devices. A non-limiting list of such devices includes, but is not limited to, implantable devices, e.g., pace makers, hearing aids, etc.; handheld devices, e.g., telephones, smart phones, tablets, laptop computers, global positioning system (GPS); and large devices that heat and cool buildings and power automobiles, trucks, busses, building, etc.

RSM devices incorporating coupled buckled membranes can be made from a single substrate in order to avoid micromanipulation of separate substrates. A pair of opposing buckled membranes needs a cavity into which the membranes buckle into and then contact each other following release. Such cavities can be created by etching into a multilayered microstructure, such as one made from a series of layers of silicon on insulator (SOI). Following creation of a cavity, membranes can be released by etching each respective surface or by ion bombardment on the respective surfaces.

For purposes of discussing and understanding the embodiments of the invention, it is to be understood that various terms are used by those knowledgeable in the art to describe techniques and approaches. Furthermore, in the description, for purposes of explanation, numerous specific details are set forth in order to provide a thorough understanding of the present invention. It will be evident, however, to one of ordinary skill in the art that the present invention may be practiced without these specific details. In some instances, well-known structures and devices are shown in block diagram form, rather than in detail, in order to avoid obscuring the present invention. These embodiments are described in sufficient detail to enable those of ordinary skill in the art to practice the invention, and it is to be understood that other embodiments may be utilized and that logical, mechanical, electrical, and other changes may be made without departing from the scope of the present invention.

As used in this description, "one embodiment" or "an embodiment" or similar phrases means that the feature(s) being described are included in at least one embodiment of the invention. References to "one embodiment" in this description do not necessarily refer to the same embodiment; however, neither are such embodiments mutually exclusive. Nor does "one embodiment" imply that there is but a single embodiment of the invention. For example, a feature, structure, act, etc. described in "one embodiment" may also be included in other embodiments. Thus, the invention may include a variety of combinations and/or integrations of the embodiments described herein.

While the invention has been described in terms of several embodiments, those of skill in the art will recognize that the invention is not limited to the embodiments described, but can be practiced with modification and alteration within the spirit and scope of the appended claims. The description is thus to be regarded as illustrative instead of limiting.

What is claimed is:

1. An energy harvesting microstructure, comprising:
a substrate,
a first buckled membrane, the first buckled membrane has a buckling axis and is connected to the substrate, the first buckled membrane further comprising:
a transduction material,
a first conductor, the first conductor is applied to the transduction material; and
a second conductor, the second conductor is applied to the transduction material, wherein electrical charge is harvested from the transduction material when the first buckled membrane is translated along the buckling axis.

2. The microstructure of claim 1, further comprising:
a mass, the mass is mechanically coupled to move with the transduction material.

3. The microstructure of claim 1, wherein the transduction material is selected from the group consisting of PVDF, Polyimide, PZT, AlN, ZnO and a user defined material.

4. The microstructure of claim 1, wherein the transduction material is poled within a plane of the first buckled membrane.

5. The microstructure of claim 4, wherein the first conductor and the second conductor extend along a thickness of the transduction material.

6. The microstructure of claim 4, wherein the second conductor is in contact with a second transduction material.

7. The microstructure of claim 4, wherein the first conductor is located within the transduction material.

8. The microstructure of claim 1, wherein the transduction material is poled perpendicular to a plane of the first buckled membrane.

9. The microstructure of claim 8, wherein the first conductor and the second conductor extend along a length of the transduction material.

10. The microstructure of claim 9, wherein the transduction material is in the shape of a layer.

11. A microstructure for harvesting energy, comprising:
a first substrate;
a first buckled membrane, the first buckled membrane is connected to the first substrate, the first buckled membrane has a first transduction material;
a second substrate; and
a second buckled membrane, the second buckled membrane is connected to the second substrate; the first buckled membrane and the second buckled membrane are in contact over a contact area electrical charge is available for harvesting in the first transduction material when the contact area of the buckled membranes translates along one of their mutually opposite buckling directions.

12. The microstructure of claim 11, wherein the second buckled membrane has a second transduction material, the contact area is sized to create substantially a zero stiffness when the buckled membranes are flexed along one of their mutually opposite buckling directions, and electrical charge is available for harvesting in at least one of the first transduction material and the second transduction material.

13. The microstructure of claim 12, further comprising;
a mass, the mass is mechanically coupled to move with the contact area.

14. The microstructure of claim 11, wherein the first transduction material is poled using a first conductor and a second conductor, the first transduction material is poled within a plane of the first buckled membrane.

15. The microstructure of claim 12, wherein the second transduction material is poled using a first conductor and a second conductor, the second transduction material is poled within a plane of the second buckled membrane.

16. The microstructure of claim 14, wherein the first conductor is located within the first transduction material.

17. The microstructure of claim 15, wherein the first conductor is located within the second transduction material.

18. The microstructure of claim 11, the first transduction material is poled perpendicular to a plane of the first buckled membrane.

19. The microstructure of claim 12, wherein the second transduction material is poled perpendicular to a plane of the second buckled membrane.

20. The microstructure of claim 18, wherein the first conductor and the second conductor extend along a length of the transduction material.

21. The microstructure of claim 20, wherein the transduction material is in the shape of a layer.

22. The microstructure of claim 12, wherein energy is harvested from the first transduction material while energy is not harvested from the second transduction material.

23. The microstructure of claim 12, wherein energy is harvested from the first transduction material and the second transduction material.

24. The microstructure of claim 23, wherein the first transduction material and the second transduction material together form a single electrical circuit.

25. The microstructure of claim 23, wherein the first buckled Membrane further comprises an additional transduction material.

26. The microstructure of claim 25, wherein the first transduction material occupies a larger volume than the additional transduction material occupies.

27. The microstructure of claim 11, wherein the first transduction material is selected from the group consisting of PVDF, Polyimide, PZT AlN, ZnO and a user defined material.

28. The microstructure of claim 12, wherein the second transduction material is selected from the group consisting of PVDF, Polyimide, PZT, AlN, ZnO and a user defined material.

29. A method to harvest energy with a microstructure, comprising:
providing a first potential energy stop; and
providing a second potential energy stop, wherein the first potential energy stop and the second potential energy stop are separated by a distance, such that a pair of opposing buckled membranes can flex between the first potential energy stop and the second potential energy stop as a contact area of the opposing buckled membranes translates along a buckling axis, the opposing buckled membranes are formed with a first buckled membrane and a second buckled membrane; and
harvesting energy from at least one layer of the opposing buckled membranes when the contact area of the opposing buckled membranes translate along the buckling axis.

30. The method of claim 29, wherein the harvesting is from a transduction material of one of the opposing buckled membranes while energy is not harvested from a transduction material of the other of the opposing buckled membranes.

31. The method of claim 29, wherein the harvesting is from a transduction material in the first buckled membrane and a transduction material in the second buckled membrane.

32. The method of claim 31, wherein the opposing buckled membranes together form a single electrical circuit.

33. The method of claim 29, further comprising;
exerting an excitation force on the contact area, wherein a mass is constrained to move with the contact area and acceleration of the mass imparts the excitation force.

34. The method of claim 29, further comprising:
charging a rechargeable power source with the energy from the harvesting.

35. The method of claim 34, further comprising:
providing an electrical interface between the rechargeable power source and the transduction material.

36. A method for harvesting energy with a microstructure, comprising:
flexing a buckled membrane with a mass, wherein the buckled membrane is attached to the microstructure, the buckled membrane has a transduction material, and the mass is coupled to the transduction material; and
harvesting energy from the transduction material during the flexing.

37. The method of claim 36, further comprising;
summing energy from a plurality of buckled membranes, wherein the plurality of buckled membranes are attached to the microstructure and each buckled membrane of the plurality of buckled membranes contains at least one transduction material.

38. The method of claim 36, wherein the buckled membrane contains more than one transduction material.

39. The method of claim 36, further comprising:
charging a rechargeable power source with the energy from the harvesting.

40. A method for harvesting energy from a microstructure, comprising:
generating an electrical charge in a transduction layer, the transduction layer is part of a first buckled membrane, the first buckled membrane has a buckling axis, wherein the generating occurs while the transduction layer flexes; and
harvesting the electrical charge from the transduction layer when the first buckled membrane is translated along the buckling axis.

41. The method of claim 40, further comprising:
providing a restoring force from a second buckled membrane, wherein the restoring force acts on the first buckled membrane over a contact area between the first buckled membrane and the second buckled membrane.

42. The method of claim 40, further comprising:
controlling a stiffness of the transduction layer during the harvesting.

43. The method of claim 42, wherein a harvesting/control circuit is used during the controlling.

44. The method of claim 42, wherein a harvesting/control circuit is used during the harvesting and the controlling.

45. The method of claim 40, wherein a harvesting/control circuit is used during the harvesting.

46. The method of claim 45, wherein the harvesting/control circuit can present at least two different load conditions to the transduction layer.

47. The method of claim 45, wherein a load condition is selected from the group consisting of open, short, in between open and short.

* * * * *